United States Patent
Sato

[11] Patent Number: 6,144,322
[45] Date of Patent: Nov. 7, 2000

[54] VARIABLE LENGTH CODE PROCESSOR WITH ENCODING AND/OR DECODING

[75] Inventor: Hisakazu Sato, Tokyo, Japan

[73] Assignee: Mitsubishi Denki Kabushiki Kaisha, Tokyo, Japan

[21] Appl. No.: 09/241,286

[22] Filed: Feb. 1, 1999

[30] Foreign Application Priority Data

Aug. 10, 1998 [JP] Japan .................................. 10-225962

[51] Int. Cl.⁷ .................................................. H03M 7/40
[52] U.S. Cl. ......................... 341/67; 348/426; 358/261.1
[58] Field of Search .............................. 341/67, 65, 106, 341/95; 348/403, 409, 410, 411, 412, 390, 426, 384; 382/232, 236, 238; 386/109, 111, 112; 358/261.1

[56] References Cited

U.S. PATENT DOCUMENTS

| | | | |
|---|---|---|---|
| 5,400,075 | 3/1995 | Savatier | 348/384 |
| 5,481,364 | 1/1996 | Ito | 358/261.1 |
| 5,502,493 | 3/1996 | Meyer | 348/426 |
| 5,604,498 | 2/1997 | Park | 341/67 |
| 5,604,499 | 2/1997 | Miyagoshi et al. | 341/67 |
| 5,623,262 | 4/1997 | Normille et al. | 341/67 |
| 5,675,331 | 10/1997 | Watanabe et al. | 341/67 |
| 5,764,357 | 6/1998 | Dorkser | 358/261.1 |
| 5,767,799 | 6/1998 | Maertens et al. | 341/67 |

FOREIGN PATENT DOCUMENTS 9-307456 11/1997 Japan .

Primary Examiner—Michael Tokar
Assistant Examiner—Jean B. Jeanglaude
Attorney, Agent, or Firm—Oblon, Spivak, McClelland, Maier & Neustadt, P.C.

[57] ABSTRACT

A variable length code processor is obtained which can perform encoding or decoding process in a plurality of variable length encoding standards. A sequence control section (5) has two control registers (VL_MODE and VL_CNT). A CPU (2) sets the desired value to the control register (VL_MODE) to select a processing content to be performed by a VLC processor (4). A local memory (7) is realized by a 4K-byte RAM to store retrieval tables used in decoding or encoding process. The sequence control section (5) controls a second DCT buffer section (11), an address generating section (12), a DCT generating section (14), VLC generating section (14), a shifter section (15), a VLC buffer section (16), and a VLC pack section (17), so that the process indicated by the control register (VL_MODE) is executable.

9 Claims, 42 Drawing Sheets

F I G. 7
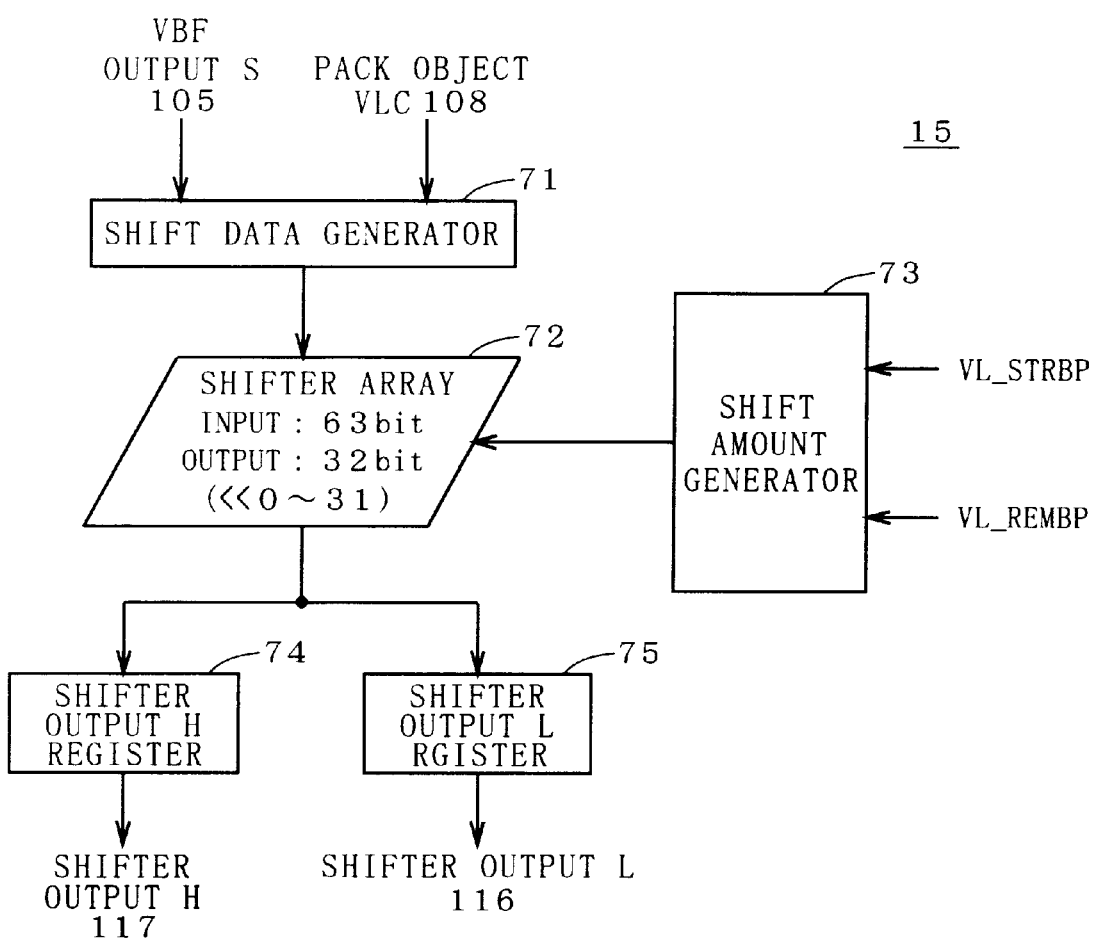

FIG. 21

| NO. | TABLE NAME | OFFSET | KEYWORD |
|---|---|---|---|
| 1 | B14-1-1 | 0x000 | bit[0:5] |
| 2 | B14-1-2 | 0x040 | bit[0:5] |
| 3 | B14-2-1 | 0x080 | bit[3:7] |
| 4 | B14-2-2 | 0x0a0 | bit[5:8] |
| 5 | B14-2-3 | 0x0c0 | bit[6:11] |
| 6 | B14-3-1 | 0x100 | bit[8:12] |
| 7 | B14-3-2 | 0x120 | bit[9:13] |
| 8 | B14-3-3 | 0x140 | bit[10:14] |
| 9 | B14-3-4 | 0x160 | bit[11:15] |
| 10 | B14-3-5 | 0x180 | bit[12:16] |
| 11 | B15-1-1 | 0x1c0 | bit[0:5] |
| 12 | B15-2-1 | 0x200 | bit[4:8] |
| 13 | B15-2-2 | 0x220 | bit[5:8] |
| 14 | B15-2-3 | 0x240 | bit[3:7] |
| 15 | B15-2-4 | 0x280 | bit[6:11] |
| 16 | B15-3-1 | 0x2c0 | bit[8:12] |
| 17 | B15-3-2 | 0x2e0 | bit[9:13] |
| 18 | B15-3-3 | 0x300 | bit[10:14] |
| 19 | B15-3-4 | 0x320 | bit[11:15] |
| 20 | B15-3-5 | 0x340 | bit[12:16] |

FIG. 22

| No. | Variable length code | run | level | length | 1st | 2nd | 3rd |
|---|---|---|---|---|---|---|---|
| 1 | 1s | 0 | 1 | 2 | B14-1-1 | - | - |
| 2 | 011s | 1 | 1 | 4 | B14-1-1 | - | - |
| 3 | 0101_s | 2 | 1 | 5 | B14-1-1 | - | - |
| 4 | 0100_s | 0 | 2 | 5 | B14-1-1 | - | - |
| 5 | 0011_1s | 3 | 1 | 6 | B14-1-1 | - | - |
| 6 | 0011_0s | 4 | 1 | 6 | B14-1-1 | - | - |
| 7 | 0010_1s | 0 | 3 | 6 | B14-1-1 | - | - |
| 8 | 0010_0111_s | 10 | 1 | 9 | B14-1-1 | B14-2-2 | - |
| 9 | 0010_0110_s | 0 | 5 | 9 | B14-1-1 | B14-2-2 | - |
| 10 | 0010_0101_s | 1 | 3 | 9 | B14-1-1 | B14-2-2 | - |
| 11 | 0010_0100_s | 3 | 2 | 9 | B14-1-1 | B14-2-2 | - |
| 12 | 0010_0011_s | 11 | 1 | 9 | B14-1-1 | B14-2-2 | - |
| 13 | 0010_0010_s | 12 | 1 | 9 | B14-1-1 | B14-2-2 | - |
| 14 | 0010_0001_s | 0 | 6 | 9 | B14-1-1 | B14-2-2 | - |
| 15 | 0010_0000_s | 13 | 1 | 9 | B14-1-1 | B14-2-2 | - |
| 16 | 0001_11s | 5 | 1 | 7 | B14-1-1 | B14-2-1 | - |
| 17 | 0001_10s | 1 | 2 | 7 | B14-1-1 | B14-2-1 | - |
| 18 | 0001_01s | 6 | 1 | 7 | B14-1-1 | B14-2-1 | - |
| 19 | 0001_00s | 7 | 1 | 7 | B14-1-1 | B14-2-1 | - |
| 20 | 0000_111s | 8 | 1 | 8 | B14-1-1 | B14-2-1 | - |
| 21 | 0000_110s | 0 | 4 | 8 | B14-1-1 | B14-2-1 | - |
| 22 | 0000_101s | 9 | 1 | 8 | B14-1-1 | B14-2-1 | - |
| 23 | 0000_100s | 2 | 2 | 8 | B14-1-1 | B14-2-1 | - |
| 24 | 0000_01 | ESC | - | 24 | B14-1-1 | - | - |
| 25 | 0000_0011_11s | 4 | 2 | 11 | B14-1-1 | B14-2-3 | - |
| 26 | 0000_0011_10s | 14 | 1 | 11 | B14-1-1 | B14-2-3 | - |
| 27 | 0000_0011_01s | 15 | 1 | 11 | B14-1-1 | B14-2-3 | - |
| 28 | 0000_0011_00s | 1 | 4 | 11 | B14-1-1 | B14-2-3 | - |
| 29 | 0000_0010_11s | 2 | 3 | 11 | B14-1-1 | B14-2-3 | - |
| 30 | 0000_0010_10s | 0 | 7 | 11 | B14-1-1 | B14-2-3 | - |
| 31 | 0000_0010_01s | 5 | 2 | 11 | B14-1-1 | B14-2-3 | - |
| 32 | 0000_0010_00s | 16 | 1 | 11 | B14-1-1 | B14-2-3 | - |
| 33 | 0000_0001_1111_s | 17 | 1 | 13 | B14-1-1 | B14-2-3 | B14-3-1 |
| 34 | 0000_0001_1110_s | 6 | 2 | 13 | B14-1-1 | B14-2-3 | B14-3-1 |
| 35 | 0000_0001_1101_s | 0 | 8 | 13 | B14-1-1 | B14-2-3 | B14-3-1 |
| 36 | 0000_0001_1100_s | 3 | 3 | 13 | B14-1-1 | B14-2-3 | B14-3-1 |
| 37 | 0000_0001_1011_s | 1 | 5 | 13 | B14-1-1 | B14-2-3 | B14-3-1 |
| 38 | 0000_0001_1010_s | 18 | 1 | 13 | B14-1-1 | B14-2-3 | B14-3-1 |
| 39 | 0000_0001_1001_s | 19 | 1 | 13 | B14-1-1 | B14-2-3 | B14-3-1 |
| 40 | 0000_0001_1000_s | 0 | 9 | 13 | B14-1-1 | B14-2-3 | B14-3-1 |
| 41 | 0000_0001_0111_s | 20 | 1 | 13 | B14-1-1 | B14-2-3 | B14-3-1 |
| 42 | 0000_0001_0110_s | 21 | 1 | 13 | B14-1-1 | B14-2-3 | B14-3-1 |
| 43 | 0000_0001_0101_s | 7 | 2 | 13 | B14-1-1 | B14-2-3 | B14-3-1 |
| 44 | 0000_0001_0100_s | 2 | 4 | 13 | B14-1-1 | B14-2-3 | B14-3-1 |
| 45 | 0000_0001_0011_s | 0 | 10 | 13 | B14-1-1 | B14-2-3 | B14-3-1 |
| 46 | 0000_0001_0010_s | 4 | 3 | 13 | B14-1-1 | B14-2-3 | B14-3-1 |
| 47 | 0000_0001_0001_s | 8 | 2 | 13 | B14-1-1 | B14-2-3 | B14-3-1 |
| 48 | 0000_0001_0000_s | 0 | 11 | 13 | B14-1-1 | B14-2-3 | B14-3-1 |
| 49 | 0000_0000_1111_1s | 22 | 1 | 14 | B14-1-1 | B14-2-3 | B14-3-2 |
| 50 | 0000_0000_1111_0s | 23 | 1 | 14 | B14-1-1 | B14-2-3 | B14-3-2 |
| 51 | 0000_0000_1110_1s | 24 | 1 | 14 | B14-1-1 | B14-2-3 | B14-3-2 |
| 52 | 0000_0000_1110_0s | 25 | 1 | 14 | B14-1-1 | B14-2-3 | B14-3-2 |
| 53 | 0000_0000_1101_1s | 26 | 1 | 14 | B14-1-1 | B14-2-3 | B14-3-2 |
| 54 | 0000_0000_1101_0s | 0 | 12 | 14 | B14-1-1 | B14-2-3 | B14-3-2 |
| 55 | 0000_0000_1100_1s | 0 | 13 | 14 | B14-1-1 | B14-2-3 | B14-3-2 |
| 56 | 0000_0000_1100_0s | 0 | 14 | 14 | B14-1-1 | B14-2-3 | B14-3-2 |
| 57 | 0000_0000_1011_1s | 0 | 15 | 14 | B14-1-1 | B14-2-3 | B14-3-2 |
| 58 | 0000_0000_1011_0s | 1 | 6 | 14 | B14-1-1 | B14-2-3 | B14-3-2 |
| 59 | 0000_0000_1010_1s | 1 | 7 | 14 | B14-1-1 | B14-2-3 | B14-3-2 |
| 60 | 0000_0000_1010_0s | 2 | 5 | 14 | B14-1-1 | B14-2-3 | B14-3-2 |
| 61 | 0000_0000_1001_1s | 3 | 4 | 14 | B14-1-1 | B14-2-3 | B14-3-2 |
| 62 | 0000_0000_1001_0s | 5 | 3 | 14 | B14-1-1 | B14-2-3 | B14-3-2 |
| 63 | 0000_0000_1000_1s | 9 | 2 | 14 | B14-1-1 | B14-2-3 | B14-3-2 |

FIG. 23

| No. | Variable length code | run | level | length | 1st | 2nd | 3rd |
|---|---|---|---|---|---|---|---|
| 64 | 0000 0000 1000 0s | 10 | 2 | 14 | B14-1-1 | B14-2-3 | B14-3-2 |
| 65 | 0000 0000 0111 11s | 0 | 16 | 15 | B14-1-1 | B14-2-3 | B14-3-3 |
| 66 | 0000 0000 0111 10s | 0 | 17 | 15 | B14-1-1 | B14-2-3 | B14-3-3 |
| 67 | 0000 0000 0111 01s | 0 | 18 | 15 | B14-1-1 | B14-2-3 | B14-3-3 |
| 68 | 0000 0000 0111 00s | 0 | 19 | 15 | B14-1-1 | B14-2-3 | B14-3-3 |
| 69 | 0000 0000 0110 11s | 0 | 20 | 15 | B14-1-1 | B14-2-3 | B14-3-3 |
| 70 | 0000 0000 0110 10s | 0 | 21 | 15 | B14-1-1 | B14-2-3 | B14-3-3 |
| 71 | 0000 0000 0110 01s | 0 | 22 | 15 | B14-1-1 | B14-2-3 | B14-3-3 |
| 72 | 0000 0000 0110 00s | 0 | 23 | 15 | B14-1-1 | B14-2-3 | B14-3-3 |
| 73 | 0000 0000 0101 11s | 0 | 24 | 15 | B14-1-1 | B14-2-3 | B14-3-3 |
| 74 | 0000 0000 0101 10s | 0 | 25 | 15 | B14-1-1 | B14-2-3 | B14-3-3 |
| 75 | 0000 0000 0101 01s | 0 | 26 | 15 | B14-1-1 | B14-2-3 | B14-3-3 |
| 76 | 0000 0000 0101 00s | 0 | 27 | 15 | B14-1-1 | B14-2-3 | B14-3-3 |
| 77 | 0000 0000 0100 11s | 0 | 28 | 15 | B14-1-1 | B14-2-3 | B14-3-3 |
| 78 | 0000 0000 0100 10s | 0 | 29 | 15 | B14-1-1 | B14-2-3 | B14-3-3 |
| 79 | 0000 0000 0100 01s | 0 | 30 | 15 | B14-1-1 | B14-2-3 | B14-3-3 |
| 80 | 0000 0000 0100 00s | 0 | 31 | 15 | B14-1-1 | B14-2-3 | B14-3-3 |
| 81 | 0000 0000 0011 111s | 1 | 8 | 16 | B14-1-1 | B14-2-3 | B14-3-4 |
| 82 | 0000 0000 0011 110s | 1 | 9 | 16 | B14-1-1 | B14-2-3 | B14-3-4 |
| 83 | 0000 0000 0011 101s | 1 | 10 | 16 | B14-1-1 | B14-2-3 | B14-3-4 |
| 84 | 0000 0000 0011 100s | 1 | 11 | 16 | B14-1-1 | B14-2-3 | B14-3-4 |
| 85 | 0000 0000 0011 011s | 1 | 12 | 16 | B14-1-1 | B14-2-3 | B14-3-4 |
| 86 | 0000 0000 0011 010s | 1 | 13 | 16 | B14-1-1 | B14-2-3 | B14-3-4 |
| 87 | 0000 0000 0011 001s | 1 | 14 | 16 | B14-1-1 | B14-2-3 | B14-3-4 |
| 88 | 0000 0000 0011 000s | 0 | 32 | 16 | B14-1-1 | B14-2-3 | B14-3-4 |
| 89 | 0000 0000 0010 111s | 0 | 33 | 16 | B14-1-1 | B14-2-3 | B14-3-4 |
| 90 | 0000 0000 0010 110s | 0 | 34 | 16 | B14-1-1 | B14-2-3 | B14-3-4 |
| 91 | 0000 0000 0010 101s | 0 | 35 | 16 | B14-1-1 | B14-2-3 | B14-3-4 |
| 92 | 0000 0000 0010 100s | 0 | 36 | 16 | B14-1-1 | B14-2-3 | B14-3-4 |
| 93 | 0000 0000 0010 011s | 0 | 37 | 16 | B14-1-1 | B14-2-3 | B14-3-4 |
| 94 | 0000 0000 0010 010s | 0 | 38 | 16 | B14-1-1 | B14-2-3 | B14-3-4 |
| 95 | 0000 0000 0010 001s | 0 | 39 | 16 | B14-1-1 | B14-2-3 | B14-3-4 |
| 96 | 0000 0000 0010 000s | 0 | 40 | 16 | B14-1-1 | B14-2-3 | B14-3-4 |
| 97 | 0000 0000 0001 1111 s | 27 | 1 | 17 | B14-1-1 | B14-2-3 | B14-3-5 |
| 98 | 0000 0000 0001 1110 s | 28 | 1 | 17 | B14-1-1 | B14-2-3 | B14-3-5 |
| 99 | 0000 0000 0001 1101 s | 29 | 1 | 17 | B14-1-1 | B14-2-3 | B14-3-5 |
| 100 | 0000 0000 0001 1100 s | 30 | 1 | 17 | B14-1-1 | B14-2-3 | B14-3-5 |
| 101 | 0000 0000 0001 1011 s | 31 | 1 | 17 | B14-1-1 | B14-2-3 | B14-3-5 |
| 102 | 0000 0000 0001 1010 s | 11 | 2 | 17 | B14-1-1 | B14-2-3 | B14-3-5 |
| 103 | 0000 0000 0001 1001 s | 12 | 2 | 17 | B14-1-1 | B14-2-3 | B14-3-5 |
| 104 | 0000 0000 0001 1000 s | 13 | 2 | 17 | B14-1-1 | B14-2-3 | B14-3-5 |
| 105 | 0000 0000 0001 0111 s | 14 | 2 | 17 | B14-1-1 | B14-2-3 | B14-3-5 |
| 106 | 0000 0000 0001 0110 s | 15 | 2 | 17 | B14-1-1 | B14-2-3 | B14-3-5 |
| 107 | 0000 0000 0001 0101 s | 16 | 2 | 17 | B14-1-1 | B14-2-3 | B14-3-5 |
| 108 | 0000 0000 0001 0100 s | 6 | 3 | 17 | B14-1-1 | B14-2-3 | B14-3-5 |
| 109 | 0000 0000 0001 0011 s | 1 | 15 | 17 | B14-1-1 | B14-2-3 | B14-3-5 |
| 110 | 0000 0000 0001 0010 s | 1 | 16 | 17 | B14-1-1 | B14-2-3 | B14-3-5 |
| 111 | 0000 0000 0001 0001 s | 1 | 17 | 17 | B14-1-1 | B14-2-3 | B14-3-5 |
| 112 | 0000 0000 0001 0000 s | 1 | 18 | 17 | B14-1-1 | B14-2-3 | B14-3-5 |

FIG. 24

| No. | Variable length code | run | level | length | 1st | 2nd | 3rd |
|---|---|---|---|---|---|---|---|
| 1 | 11s | 0 | 1 | 3 | B14-1-2 | - | - |
| 2 | 10 | EOB | - | 2 | B14-1-2 | - | - |
| 3 | 011s | 1 | 1 | 4 | B14-1-2 | - | - |
| 4 | 0101_s | 2 | 1 | 5 | B14-1-2 | - | - |
| 5 | 0100_s | 0 | 2 | 5 | B14-1-2 | - | - |
| 6 | 0011_1s | 3 | 1 | 6 | B14-1-2 | - | - |
| 7 | 0011_0s | 4 | 1 | 6 | B14-1-2 | - | - |
| 8 | 0010_1s | 0 | 3 | 6 | B14-1-2 | - | - |
| 9 | 0010_0111_s | 10 | 1 | 9 | B14-1-2 | B14-2-2 | - |
| 10 | 0010_0110_s | 0 | 5 | 9 | B14-1-2 | B14-2-2 | - |
| 11 | 0010_0101_s | 1 | 3 | 9 | B14-1-2 | B14-2-2 | - |
| 12 | 0010_0100_s | 3 | 2 | 9 | B14-1-2 | B14-2-2 | - |
| 13 | 0010_0011_s | 11 | 1 | 9 | B14-1-2 | B14-2-2 | - |
| 14 | 0010_0010_s | 12 | 1 | 9 | B14-1-2 | B14-2-2 | - |
| 15 | 0010_0001_s | 0 | 6 | 9 | B14-1-2 | B14-2-2 | - |
| 16 | 0010_0000_s | 13 | 1 | 9 | B14-1-2 | B14-2-2 | - |
| 17 | 0001_11s | 5 | 1 | 7 | B14-1-2 | B14-2-1 | - |
| 18 | 0001_10s | 1 | 2 | 7 | B14-1-2 | B14-2-1 | - |
| 19 | 0001_01s | 6 | 1 | 7 | B14-1-2 | B14-2-1 | - |
| 20 | 0001_00s | 7 | 1 | 7 | B14-1-2 | B14-2-1 | - |
| 21 | 0000_111s | 8 | 1 | 8 | B14-1-2 | B14-2-1 | - |
| 22 | 0000_110s | 0 | 4 | 8 | B14-1-2 | B14-2-1 | - |
| 23 | 0000_101s | 9 | 1 | 8 | B14-1-2 | B14-2-1 | - |
| 24 | 0000_100s | 2 | 2 | 8 | B14-1-2 | B14-2-1 | - |
| 25 | 0000_01 | ESC | - | 24 | B14-1-2 | - | - |
| 26 | 0000_0011_11s | 4 | 2 | 11 | B14-1-2 | B14-2-3 | - |
| 27 | 0000_0011_10s | 14 | 1 | 11 | B14-1-2 | B14-2-3 | - |
| 28 | 0000_0011_01s | 15 | 1 | 11 | B14-1-2 | B14-2-3 | - |
| 29 | 0000_0011_00s | 1 | 4 | 11 | B14-1-2 | B14-2-3 | - |
| 30 | 0000_0010_11s | 2 | 3 | 11 | B14-1-2 | B14-2-3 | - |
| 31 | 0000_0010_10s | 0 | 7 | 11 | B14-1-2 | B14-2-3 | - |
| 32 | 0000_0010_01s | 5 | 2 | 11 | B14-1-2 | B14-2-3 | - |
| 33 | 0000_0010_00s | 16 | 1 | 11 | B14-1-2 | B14-2-3 | - |
| 34 | 0000_0001_1111_s | 17 | 1 | 13 | B14-1-2 | B14-2-3 | B14-3-1 |
| 35 | 0000_0001_1110_s | 6 | 2 | 13 | B14-1-2 | B14-2-3 | B14-3-1 |
| 36 | 0000_0001_1101_s | 0 | 8 | 13 | B14-1-2 | B14-2-3 | B14-3-1 |
| 37 | 0000_0001_1100_s | 3 | 3 | 13 | B14-1-2 | B14-2-3 | B14-3-1 |
| 38 | 0000_0001_1011_s | 1 | 5 | 13 | B14-1-2 | B14-2-3 | B14-3-1 |
| 39 | 0000_0001_1010_s | 18 | 1 | 13 | B14-1-2 | B14-2-3 | B14-3-1 |
| 40 | 0000_0001_1001_s | 19 | 1 | 13 | B14-1-2 | B14-2-3 | B14-3-1 |
| 41 | 0000_0001_1000_s | 0 | 9 | 13 | B14-1-2 | B14-2-3 | B14-3-1 |
| 42 | 0000_0001_0111_s | 20 | 1 | 13 | B14-1-2 | B14-2-3 | B14-3-1 |
| 43 | 0000_0001_0110_s | 21 | 1 | 13 | B14-1-2 | B14-2-3 | B14-3-1 |
| 44 | 0000_0001_0101_s | 7 | 2 | 13 | B14-1-2 | B14-2-3 | B14-3-1 |
| 45 | 0000_0001_0100_s | 2 | 4 | 13 | B14-1-2 | B14-2-3 | B14-3-1 |
| 46 | 0000_0001_0011_s | 0 | 10 | 13 | B14-1-2 | B14-2-3 | B14-3-1 |
| 47 | 0000_0001_0010_s | 4 | 3 | 13 | B14-1-2 | B14-2-3 | B14-3-1 |
| 48 | 0000_0001_0001_s | 8 | 2 | 13 | B14-1-2 | B14-2-3 | B14-3-1 |
| 49 | 0000_0001_0000_s | 0 | 11 | 13 | B14-1-2 | B14-2-3 | B14-3-1 |
| 50 | 0000_0000_1111_1s | 22 | 1 | 14 | B14-1-2 | B14-2-3 | B14-3-2 |
| 51 | 0000_0000_1111_0s | 23 | 1 | 14 | B14-1-2 | B14-2-3 | B14-3-2 |
| 52 | 0000_0000_1110_1s | 24 | 1 | 14 | B14-1-2 | B14-2-3 | B14-3-2 |
| 53 | 0000_0000_1110_0s | 25 | 1 | 14 | B14-1-2 | B14-2-3 | B14-3-2 |
| 54 | 0000_0000_1101_1s | 26 | 1 | 14 | B14-1-2 | B14-2-3 | B14-3-2 |
| 55 | 0000_0000_1101_0s | 0 | 12 | 14 | B14-1-2 | B14-2-3 | B14-3-2 |
| 56 | 0000_0000_1100_1s | 0 | 13 | 14 | B14-1-2 | B14-2-3 | B14-3-2 |
| 57 | 0000_0000_1100_0s | 0 | 14 | 14 | B14-1-2 | B14-2-3 | B14-3-2 |
| 58 | 0000_0000_1011_1s | 0 | 15 | 14 | B14-1-2 | B14-2-3 | B14-3-2 |
| 59 | 0000_0000_1011_0s | 1 | 6 | 14 | B14-1-2 | B14-2-3 | B14-3-2 |
| 60 | 0000_0000_1010_1s | 1 | 7 | 14 | B14-1-2 | B14-2-3 | B14-3-2 |
| 61 | 0000_0000_1010_0s | 2 | 5 | 14 | B14-1-2 | B14-2-3 | B14-3-2 |
| 62 | 0000_0000_1001_1s | 3 | 4 | 14 | B14-1-2 | B14-2-3 | B14-3-2 |
| 63 | 0000_0000_1001_0s | 5 | 3 | 14 | B14-1-2 | B14-2-3 | B14-3-2 |

FIG. 25

| No. | Variable length code | run | level | length | 1st | 2nd | 3rd |
|---|---|---|---|---|---|---|---|
| 64 | 0000 0000 1000 1s | 9 | 2 | 14 | B14-1-2 | B14-2-3 | B14-3-2 |
| 65 | 0000 0000 1000 0s | 10 | 2 | 14 | B14-1-2 | B14-2-3 | B14-3-2 |
| 66 | 0000 0000 0111 11s | 0 | 16 | 15 | B14-1-2 | B14-2-3 | B14-3-3 |
| 67 | 0000 0000 0111 10s | 0 | 17 | 15 | B14-1-2 | B14-2-3 | B14-3-3 |
| 68 | 0000 0000 0111 01s | 0 | 18 | 15 | B14-1-2 | B14-2-3 | B14-3-3 |
| 69 | 0000 0000 0111 00s | 0 | 19 | 15 | B14-1-2 | B14-2-3 | B14-3-3 |
| 70 | 0000 0000 0110 11s | 0 | 20 | 15 | B14-1-2 | B14-2-3 | B14-3-3 |
| 71 | 0000 0000 0110 10s | 0 | 21 | 15 | B14-1-2 | B14-2-3 | B14-3-3 |
| 72 | 0000 0000 0110 01s | 0 | 22 | 15 | B14-1-2 | B14-2-3 | B14-3-3 |
| 73 | 0000 0000 0110 00s | 0 | 23 | 15 | B14-1-2 | B14-2-3 | B14-3-3 |
| 74 | 0000 0000 0101 11s | 0 | 24 | 15 | B14-1-2 | B14-2-3 | B14-3-3 |
| 75 | 0000 0000 0101 10s | 0 | 25 | 15 | B14-1-2 | B14-2-3 | B14-3-3 |
| 76 | 0000 0000 0101 01s | 0 | 26 | 15 | B14-1-2 | B14-2-3 | B14-3-3 |
| 77 | 0000 0000 0101 00s | 0 | 27 | 15 | B14-1-2 | B14-2-3 | B14-3-3 |
| 78 | 0000 0000 0100 11s | 0 | 28 | 15 | B14-1-2 | B14-2-3 | B14-3-3 |
| 79 | 0000 0000 0100 10s | 0 | 29 | 15 | B14-1-2 | B14-2-3 | B14-3-3 |
| 80 | 0000 0000 0100 01s | 0 | 30 | 15 | B14-1-2 | B14-2-3 | B14-3-3 |
| 81 | 0000 0000 0100 00s | 0 | 31 | 15 | B14-1-2 | B14-2-3 | B14-3-3 |
| 82 | 0000 0000 0011 111s | 1 | 8 | 16 | B14-1-2 | B14-2-3 | B14-3-4 |
| 83 | 0000 0000 0011 110s | 1 | 9 | 16 | B14-1-2 | B14-2-3 | B14-3-4 |
| 84 | 0000 0000 0011 101s | 1 | 10 | 16 | B14-1-2 | B14-2-3 | B14-3-4 |
| 85 | 0000 0000 0011 100s | 1 | 11 | 16 | B14-1-2 | B14-2-3 | B14-3-4 |
| 86 | 0000 0000 0011 011s | 1 | 12 | 16 | B14-1-2 | B14-2-3 | B14-3-4 |
| 87 | 0000 0000 0011 010s | 1 | 13 | 16 | B14-1-2 | B14-2-3 | B14-3-4 |
| 88 | 0000 0000 0011 001s | 1 | 14 | 16 | B14-1-2 | B14-2-3 | B14-3-4 |
| 89 | 0000 0000 0011 000s | 0 | 32 | 16 | B14-1-2 | B14-2-3 | B14-3-4 |
| 90 | 0000 0000 0010 111s | 0 | 33 | 16 | B14-1-2 | B14-2-3 | B14-3-4 |
| 91 | 0000 0000 0010 110s | 0 | 34 | 16 | B14-1-2 | B14-2-3 | B14-3-4 |
| 92 | 0000 0000 0010 101s | 0 | 35 | 16 | B14-1-2 | B14-2-3 | B14-3-4 |
| 93 | 0000 0000 0010 100s | 0 | 36 | 16 | B14-1-2 | B14-2-3 | B14-3-4 |
| 94 | 0000 0000 0010 011s | 0 | 37 | 16 | B14-1-2 | B14-2-3 | B14-3-4 |
| 95 | 0000 0000 0010 010s | 0 | 38 | 16 | B14-1-2 | B14-2-3 | B14-3-4 |
| 96 | 0000 0000 0010 001s | 0 | 39 | 16 | B14-1-2 | B14-2-3 | B14-3-4 |
| 97 | 0000 0000 0010 000s | 0 | 40 | 16 | B14-1-2 | B14-2-3 | B14-3-4 |
| 98 | 0000 0000 0001 1111 s | 27 | 1 | 17 | B14-1-2 | B14-2-3 | B14-3-5 |
| 99 | 0000 0000 0001 1110 s | 28 | 1 | 17 | B14-1-2 | B14-2-3 | B14-3-5 |
| 100 | 0000 0000 0001 1101 s | 29 | 1 | 17 | B14-1-2 | B14-2-3 | B14-3-5 |
| 101 | 0000 0000 0001 1100 s | 30 | 1 | 17 | B14-1-2 | B14-2-3 | B14-3-5 |
| 102 | 0000 0000 0001 1011 s | 31 | 1 | 17 | B14-1-2 | B14-2-3 | B14-3-5 |
| 103 | 0000 0000 0001 1010 s | 11 | 2 | 17 | B14-1-2 | B14-2-3 | B14-3-5 |
| 104 | 0000 0000 0001 1001 s | 12 | 2 | 17 | B14-1-2 | B14-2-3 | B14-3-5 |
| 105 | 0000 0000 0001 1000 s | 13 | 2 | 17 | B14-1-2 | B14-2-3 | B14-3-5 |
| 106 | 0000 0000 0001 0111 s | 14 | 2 | 17 | B14-1-2 | B14-2-3 | B14-3-5 |
| 107 | 0000 0000 0001 0110 s | 15 | 2 | 17 | B14-1-2 | B14-2-3 | B14-3-5 |
| 108 | 0000 0000 0001 0101 s | 16 | 2 | 17 | B14-1-2 | B14-2-3 | B14-3-5 |
| 109 | 0000 0000 0001 0100 s | 6 | 3 | 17 | B14-1-2 | B14-2-3 | B14-3-5 |
| 110 | 0000 0000 0001 0011 s | 1 | 15 | 17 | B14-1-2 | B14-2-3 | B14-3-5 |
| 111 | 0000 0000 0001 0010 s | 1 | 16 | 17 | B14-1-2 | B14-2-3 | B14-3-5 |
| 112 | 0000 0000 0001 0001 s | 1 | 17 | 17 | B14-1-2 | B14-2-3 | B14-3-5 |
| 113 | 0000 0000 0001 0000 s | 1 | 18 | 17 | B14-1-2 | B14-2-3 | B14-3-5 |

FIG. 26

| No. | Variable length code | run | level | length | 1st | 2nd | 3rd |
|---|---|---|---|---|---|---|---|
| 1 | 1111 1111 s | 0 | 15 | 9 | B15-1-1 | B15-2-1 | - |
| 2 | 1111 1110 s | 0 | 14 | 9 | B15-1-1 | B15-2-1 | - |
| 3 | 1111 1101 s | 4 | 2 | 9 | B15-1-1 | B15-2-1 | - |
| 4 | 1111 1100 s | 2 | 3 | 9 | B15-1-1 | B15-2-1 | - |
| 5 | 1111 1011 s | 0 | 13 | 9 | B15-1-1 | B15-2-1 | - |
| 6 | 1111 1010 s | 0 | 12 | 9 | B15-1-1 | B15-2-1 | - |
| 7 | 1111 100s | 0 | 9 | 8 | B15-1-1 | B15-2-1 | - |
| 8 | 1111 011s | 0 | 8 | 8 | B15-1-1 | B15-2-1 | - |
| 9 | 1111 010s | 10 | 1 | 8 | B15-1-1 | B15-2-1 | - |
| 10 | 1111 001s | 1 | 3 | 8 | B15-1-1 | B15-2-1 | - |
| 11 | 1111 000s | 9 | 1 | 8 | B15-1-1 | B15-2-1 | - |
| 12 | 1110 1s | 0 | 5 | 6 | B15-1-1 | - | - |
| 13 | 1110 0s | 0 | 4 | 6 | B15-1-1 | - | - |
| 14 | 110s | 0 | 2 | 4 | B15-1-1 | - | - |
| 15 | 10s | 0 | 1 | 3 | B15-1-1 | - | - |
| 16 | 0111 s | 0 | 3 | 5 | B15-1-1 | - | - |
| 17 | 0110 | EOB | - | 4 | B15-1-1 | - | - |
| 18 | 010s | 1 | 1 | 4 | B15-1-1 | - | - |
| 19 | 0011 1s | 3 | 1 | 6 | B15-1-1 | - | - |
| 20 | 0011 0s | 1 | 2 | 6 | B15-1-1 | - | - |
| 21 | 0010 1s | 2 | 1 | 6 | B15-1-1 | - | - |
| 22 | 0010 0111 s | 1 | 4 | 9 | B15-1-1 | B15-2-2 | - |
| 23 | 0010 0110 s | 3 | 2 | 9 | B15-1-1 | B15-2-2 | - |
| 24 | 0010 0101 s | 12 | 1 | 9 | B15-1-1 | B15-2-2 | - |
| 25 | 0010 0100 s | 13 | 1 | 9 | B15-1-1 | B15-2-2 | - |
| 26 | 0010 0011 s | 0 | 10 | 9 | B15-1-1 | B15-2-2 | - |
| 27 | 0010 0010 s | 0 | 11 | 9 | B15-1-1 | B15-2-2 | - |
| 28 | 0010 0001 s | 11 | 1 | 9 | B15-1-1 | B15-2-2 | - |
| 29 | 0010 0000 s | 1 | 5 | 9 | B15-1-1 | B15-2-2 | - |
| 30 | 0001 11s | 5 | 1 | 7 | B15-1-1 | B15-2-3 | - |
| 31 | 0001 10s | 4 | 1 | 7 | B15-1-1 | B15-2-3 | - |
| 32 | 0001 01s | 0 | 6 | 7 | B15-1-1 | B15-2-3 | - |
| 33 | 0001 00s | 0 | 7 | 7 | B15-1-1 | B15-2-3 | - |
| 34 | 0000 111s | 2 | 2 | 8 | B15-1-1 | B15-2-3 | - |
| 35 | 0000 110s | 6 | 1 | 8 | B15-1-1 | B15-2-3 | - |
| 36 | 0000 101s | 8 | 1 | 8 | B15-1-1 | B15-2-3 | - |
| 37 | 0000 100s | 7 | 1 | 8 | B15-1-1 | B15-2-3 | - |
| 38 | 0000 01 | ESC | - | 24 | B15-1-1 | - | - |
| 39 | 0000 0011 1s | 15 | 1 | 10 | B15-1-1 | B15-2-4 | - |
| 40 | 0000 0011 01s | 16 | 1 | 11 | B15-1-1 | B15-2-4 | - |
| 41 | 0000 0011 00s | 2 | 4 | 11 | B15-1-1 | B15-2-4 | - |
| 42 | 0000 0010 1s | 14 | 1 | 10 | B15-1-1 | B15-2-4 | - |
| 43 | 0000 0010 0s | 5 | 2 | 10 | B15-1-1 | B15-2-4 | - |
| 44 | 0000 0001 1111 s | 17 | 1 | 13 | B15-1-1 | B15-2-4 | B15-3-1 |
| 45 | 0000 0001 1110 s | 6 | 2 | 13 | B15-1-1 | B15-2-4 | B15-3-1 |
| 46 | 0000 0001 1100 s | 3 | 3 | 13 | B15-1-1 | B15-2-4 | B15-3-1 |
| 47 | 0000 0001 1010 s | 18 | 1 | 13 | B15-1-1 | B15-2-4 | B15-3-1 |
| 48 | 0000 0001 1001 s | 19 | 1 | 13 | B15-1-1 | B15-2-4 | B15-3-1 |
| 49 | 0000 0001 0111 s | 20 | 1 | 13 | B15-1-1 | B15-2-4 | B15-3-1 |
| 50 | 0000 0001 0110 s | 21 | 1 | 13 | B15-1-1 | B15-2-4 | B15-3-1 |
| 51 | 0000 0001 0101 s | 7 | 2 | 13 | B15-1-1 | B15-2-4 | B15-3-1 |
| 52 | 0000 0001 0010 s | 4 | 3 | 13 | B15-1-1 | B15-2-4 | B15-3-1 |
| 53 | 0000 0001 0001 s | 8 | 2 | 13 | B15-1-1 | B15-2-4 | B15-3-1 |
| 54 | 0000 0000 1111 1s | 22 | 1 | 14 | B15-1-1 | B15-2-4 | B15-3-2 |
| 55 | 0000 0000 1111 0s | 23 | 1 | 14 | B15-1-1 | B15-2-4 | B15-3-2 |
| 56 | 0000 0000 1110 1s | 24 | 1 | 14 | B15-1-1 | B15-2-4 | B15-3-2 |
| 57 | 0000 0000 1110 0s | 25 | 1 | 14 | B15-1-1 | B15-2-4 | B15-3-2 |
| 58 | 0000 0000 1101 1s | 26 | 1 | 14 | B15-1-1 | B15-2-4 | B15-3-2 |
| 59 | 0000 0000 1011 0s | 1 | 6 | 14 | B15-1-1 | B15-2-4 | B15-3-2 |
| 60 | 0000 0000 1010 1s | 1 | 7 | 14 | B15-1-1 | B15-2-4 | B15-3-2 |
| 61 | 0000 0000 1010 0s | 2 | 5 | 14 | B15-1-1 | B15-2-4 | B15-3-2 |
| 62 | 0000 0000 1001 1s | 3 | 4 | 14 | B15-1-1 | B15-2-4 | B15-3-2 |
| 63 | 0000 0000 1001 0s | 5 | 3 | 14 | B15-1-1 | B15-2-4 | B15-3-2 |

FIG. 27

| No. | Variable length code | run | level | length | 1st | 2nd | 3rd |
|---|---|---|---|---|---|---|---|
| 64 | 0000 0000 1000 1s | 9 | 2 | 14 | B15-1-1 | B15-2-4 | B15-3-2 |
| 65 | 0000 0000 1000 0s | 10 | 2 | 14 | B15-1-1 | B15-2-4 | B15-3-2 |
| 66 | 0000 0000 0111 11s | 0 | 16 | 15 | B15-1-1 | B15-2-4 | B15-3-3 |
| 67 | 0000 0000 0111 10s | 0 | 17 | 15 | B15-1-1 | B15-2-4 | B15-3-3 |
| 68 | 0000 0000 0111 01s | 0 | 18 | 15 | B15-1-1 | B15-2-4 | B15-3-3 |
| 69 | 0000 0000 0111 00s | 0 | 19 | 15 | B15-1-1 | B15-2-4 | B15-3-3 |
| 70 | 0000 0000 0110 11s | 0 | 20 | 15 | B15-1-1 | B15-2-4 | B15-3-3 |
| 71 | 0000 0000 0110 10s | 0 | 21 | 15 | B15-1-1 | B15-2-4 | B15-3-3 |
| 72 | 0000 0000 0110 01s | 0 | 22 | 15 | B15-1-1 | B15-2-4 | B15-3-3 |
| 73 | 0000 0000 0110 00s | 0 | 23 | 15 | B15-1-1 | B15-2-4 | B15-3-3 |
| 74 | 0000 0000 0101 11s | 0 | 24 | 15 | B15-1-1 | B15-2-4 | B15-3-3 |
| 75 | 0000 0000 0101 10s | 0 | 25 | 15 | B15-1-1 | B15-2-4 | B15-3-3 |
| 76 | 0000 0000 0101 01s | 0 | 26 | 15 | B15-1-1 | B15-2-4 | B15-3-3 |
| 77 | 0000 0000 0101 00s | 0 | 27 | 15 | B15-1-1 | B15-2-4 | B15-3-3 |
| 78 | 0000 0000 0100 11s | 0 | 28 | 15 | B15-1-1 | B15-2-4 | B15-3-3 |
| 79 | 0000 0000 0100 10s | 0 | 29 | 15 | B15-1-1 | B15-2-4 | B15-3-3 |
| 80 | 0000 0000 0100 01s | 0 | 30 | 15 | B15-1-1 | B15-2-4 | B15-3-3 |
| 81 | 0000 0000 0100 00s | 0 | 31 | 15 | B15-1-1 | B15-2-4 | B15-3-3 |
| 82 | 0000 0000 0011 111s | 1 | 8 | 16 | B15-1-1 | B15-2-4 | B15-3-4 |
| 83 | 0000 0000 0011 110s | 1 | 9 | 16 | B15-1-1 | B15-2-4 | B15-3-4 |
| 84 | 0000 0000 0011 101s | 1 | 10 | 16 | B15-1-1 | B15-2-4 | B15-3-4 |
| 85 | 0000 0000 0011 100s | 1 | 11 | 16 | B15-1-1 | B15-2-4 | B15-3-4 |
| 86 | 0000 0000 0011 011s | 1 | 12 | 16 | B15-1-1 | B15-2-4 | B15-3-4 |
| 87 | 0000 0000 0011 010s | 1 | 13 | 16 | B15-1-1 | B15-2-4 | B15-3-4 |
| 88 | 0000 0000 0011 001s | 1 | 14 | 16 | B15-1-1 | B15-2-4 | B15-3-4 |
| 89 | 0000 0000 0011 000s | 0 | 32 | 16 | B15-1-1 | B15-2-4 | B15-3-4 |
| 90 | 0000 0000 0010 111s | 0 | 33 | 16 | B15-1-1 | B15-2-4 | B15-3-4 |
| 91 | 0000 0000 0010 110s | 0 | 34 | 16 | B15-1-1 | B15-2-4 | B15-3-4 |
| 92 | 0000 0000 0010 101s | 0 | 35 | 16 | B15-1-1 | B15-2-4 | B15-3-4 |
| 93 | 0000 0000 0010 100s | 0 | 36 | 16 | B15-1-1 | B15-2-4 | B15-3-4 |
| 94 | 0000 0000 0010 011s | 0 | 37 | 16 | B15-1-1 | B15-2-4 | B15-3-4 |
| 95 | 0000 0000 0010 010s | 0 | 38 | 16 | B15-1-1 | B15-2-4 | B15-3-4 |
| 96 | 0000 0000 0010 001s | 0 | 39 | 16 | B15-1-1 | B15-2-4 | B15-3-4 |
| 97 | 0000 0000 0010 000s | 0 | 40 | 16 | B15-1-1 | B15-2-4 | B15-3-4 |
| 98 | 0000 0000 0001 1111 s | 27 | 1 | 17 | B15-1-1 | B15-2-4 | B15-3-5 |
| 99 | 0000 0000 0001 1110 s | 28 | 1 | 17 | B15-1-1 | B15-2-4 | B15-3-5 |
| 100 | 0000 0000 0001 1101 s | 29 | 1 | 17 | B15-1-1 | B15-2-4 | B15-3-5 |
| 101 | 0000 0000 0001 1100 s | 30 | 1 | 17 | B15-1-1 | B15-2-4 | B15-3-5 |
| 102 | 0000 0000 0001 1011 s | 31 | 1 | 17 | B15-1-1 | B15-2-4 | B15-3-5 |
| 103 | 0000 0000 0001 1010 s | 11 | 2 | 17 | B15-1-1 | B15-2-4 | B15-3-5 |
| 104 | 0000 0000 0001 1001 s | 12 | 2 | 17 | B15-1-1 | B15-2-4 | B15-3-5 |
| 105 | 0000 0000 0001 1000 s | 13 | 2 | 17 | B15-1-1 | B15-2-4 | B15-3-5 |
| 106 | 0000 0000 0001 0111 s | 14 | 2 | 17 | B15-1-1 | B15-2-4 | B15-3-5 |
| 107 | 0000 0000 0001 0110 s | 15 | 2 | 17 | B15-1-1 | B15-2-4 | B15-3-5 |
| 108 | 0000 0000 0001 0101 s | 16 | 2 | 17 | B15-1-1 | B15-2-4 | B15-3-5 |
| 109 | 0000 0000 0001 0100 s | 6 | 3 | 17 | B15-1-1 | B15-2-4 | B15-3-5 |
| 110 | 0000 0000 0001 0011 s | 1 | 15 | 17 | B15-1-1 | B15-2-4 | B15-3-5 |
| 111 | 0000 0000 0001 0010 s | 1 | 16 | 17 | B15-1-1 | B15-2-4 | B15-3-5 |
| 112 | 0000 0000 0001 0001 s | 1 | 17 | 17 | B15-1-1 | B15-2-4 | B15-3-5 |
| 113 | 0000 0000 0001 0000 s | 1 | 18 | 17 | B15-1-1 | B15-2-4 | B15-3-5 |

FIG. 28

| NO. | DISPLACEMENT ADDRESS (BINARY NUMERAL) | WHEN RETRIEVAL IS TERMINATED | | | | WHEN RETRIEVAL IS CONTINUED (NEXT RETRIEVAL TABLE NAME) |
|---|---|---|---|---|---|---|
| | | ID | RUN | LEVEL | LENGTH | |
| 1 | 111111 ~ 110000 | 00 | 0 | -1 | 2 | - |
| 2 | 101111 ~ 100000 | 00 | 0 | +1 | 2 | - |
| 3 | 011111 ~ 011100 | 00 | 1 | -1 | 4 | - |
| 4 | 011011 ~ 011000 | 00 | 1 | +1 | 4 | - |
| 5 | 010111 ~ 010110 | 00 | 0 | -2 | 5 | - |
| 6 | 010101 ~ 010100 | 00 | 0 | +2 | 5 | - |
| 7 | 001111 | 00 | 3 | -1 | 6 | - |
| 8 | 001110 | 00 | 3 | +1 | 6 | - |
| 9 | 001100 | 00 | 4 | -1 | 6 | - |
| 10 | 001101 | 00 | 4 | +1 | 6 | - |
| 11 | 001011 | 00 | 0 | -3 | 6 | - |
| 12 | 001010 | 00 | 0 | +3 | 6 | - |
| 13 | 001001 | - | - | - | - | B14-2-2 |
| 14 | 001000 | - | - | - | - | B14-2-2 |
| 15 | 000111 ~ 000010 | - | - | - | - | B14-2-1 |
| 16 | 000001 | 10 | - | - | 24 | - |
| 17 | 000000 | - | - | - | - | B14-2-3 |

*FIG. 29*

| NO. | DISPLACE-MENT (BINARY NUMERAL) | WHEN RETRIEVAL IS TERMINATED | | | | WHEN RETRIEVAL IS CONTINUED (NEXT RETRIEVAL TABLE NAME ) |
|---|---|---|---|---|---|---|
| | | ID | RUN | LEVEL | LENGTH | |
| 1 | 1111 | 00 | 10 | -1 | 9 | - |
| 2 | 1110 | 00 | 10 | +1 | 9 | - |
| 3 | 1101 | 00 | 0 | -5 | 9 | - |
| 4 | 1100 | 00 | 0 | +5 | 9 | - |
| 5 | 1011 | 00 | 1 | -3 | 9 | - |
| 6 | 1010 | 00 | 1 | +3 | 9 | - |
| 7 | 1001 | 00 | 3 | -2 | 9 | - |
| 8 | 1000 | 00 | 3 | +2 | 9 | - |
| 9 | 0111 | 00 | 11 | -1 | 9 | - |
| 10 | 0110 | 00 | 11 | +1 | 9 | - |
| 11 | 0101 | 00 | 12 | -1 | 9 | - |
| 12 | 0100 | 00 | 12 | +1 | 9 | - |
| 13 | 0011 | 00 | 0 | -6 | 9 | - |
| 14 | 0010 | 00 | 0 | +6 | 9 | - |
| 15 | 0001 | 00 | 13 | -1 | 9 | - |
| 16 | 0001 | 00 | 13 | +1 | 9 | - |

FIG. 30

| NO. | TABLE NAME | OFFSET | KEYWORD |
|---|---|---|---|
| 1 | V00-1-1 | 0x000 | bit[0:5] |
| 2 | V00-2-1 | 0x040 | bit[3:7] |
| 3 | V00-2-2 | 0x060 | bit[4:8] |
| 4 | V00-2-3 | 0x080 | bit[5:9] |
| 5 | V00-2-4 | 0x100 | bit[5:11] |
| 6 | V00-3-1 | 0x180 | bit[8:12] |
| 7 | V00-3-2 | 0x1a0 | bit[8:12] |
| 8 | V00-3-3 | 0x1c0 | bit[8:12] |
| 9 | V00-3-4 | 0x1e0 | bit[11:15] |
| 10 | V00-3-5 | 0x200 | bit[11:15] |
| 11 | V00-3-6 | 0x220 | bit[11:15] |
| 12 | V00-3-7 | 0x240 | bit[11:15] |
| 13 | V00-3-8 | 0x260 | bit[11:15] |
| 14 | V00-3-9 | 0x280 | bit[11:15] |
| 15 | V00-3-10 | 0x2a0 | bit[11:15] |
| 16 | V00-3-11 | 0x2c0 | bit[11:15] |
| 17 | V00-3-12 | 0x2e0 | bit[11:15] |
| 18 | V00-3-13 | 0x300 | bit[11:15] |
| 19 | V00-3-14 | 0x320 | bit[11:15] |
| 20 | V00-3-15 | 0x340 | bit[11:15] |
| 21 | V00-3-16 | 0x360 | bit[11:15] |
| 22 | V00-3-17 | 0x380 | bit[11:15] |
| 23 | V00-3-18 | 0x3a0 | bit[11:15] |

FIG. 31

| No. | VLC | run | level | length | 1st | 2nd | 3rd |
|---|---|---|---|---|---|---|---|
| 1 | 00s | 0 | 1 | 3 | V00-1-1 | - | - |
| 2 | 010s | 0 | 2 | 4 | V00-1-1 | - | - |
| 3 | 0110 | EOB | - | 4 | V00-1-1 | - | - |
| 4 | 0111_s | 1 | 1 | 5 | V00-1-1 | - | - |
| 5 | 1000_s | 0 | 3 | 5 | V00-1-1 | - | - |
| 6 | 1001_s | 0 | 4 | 5 | V00-1-1 | - | - |
| 7 | 1010_0s | 2 | 1 | 6 | V00-1-1 | - | - |
| 8 | 1010_1s | 1 | 2 | 6 | V00-1-1 | - | - |
| 9 | 1011_0s | 0 | 5 | 6 | V00-1-1 | - | - |
| 10 | 1011_1s | 0 | 6 | 6 | V00-1-1 | - | - |
| 11 | 1100_00s | 3 | 1 | 7 | V00-1-1 | V00-2-1 | - |
| 12 | 1100_01s | 4 | 1 | 7 | V00-1-1 | V00-2-1 | - |
| 13 | 1100_10s | 0 | 7 | 7 | V00-1-1 | V00-2-1 | - |
| 14 | 1100_11s | 0 | 8 | 7 | V00-1-1 | V00-2-1 | - |
| 15 | 1101_000s | 5 | 1 | 8 | V00-1-1 | V00-2-1 | - |
| 16 | 1101_001s | 6 | 1 | 8 | V00-1-1 | V00-2-1 | - |
| 17 | 1101_010s | 2 | 2 | 8 | V00-1-1 | V00-2-1 | - |
| 18 | 1101_011s | 1 | 3 | 8 | V00-1-1 | V00-2-1 | - |
| 19 | 1101_100s | 1 | 4 | 8 | V00-1-1 | V00-2-1 | - |
| 20 | 1101_101s | 0 | 9 | 8 | V00-1-1 | V00-2-1 | - |
| 21 | 1101_110s | 0 | 10 | 8 | V00-1-1 | V00-2-1 | - |
| 22 | 1101_111s | 0 | 11 | 8 | V00-1-1 | V00-2-1 | - |
| 23 | 1110_0000_s | 7 | 1 | 9 | V00-1-1 | V00-2-2 | - |
| 24 | 1110_0001_s | 8 | 1 | 9 | V00-1-1 | V00-2-2 | - |
| 25 | 1110_0010_s | 9 | 1 | 9 | V00-1-1 | V00-2-2 | - |
| 26 | 1110_0011_s | 10 | 1 | 9 | V00-1-1 | V00-2-2 | - |
| 27 | 1110_0100_s | 3 | 2 | 9 | V00-1-1 | V00-2-2 | - |
| 28 | 1110_0101_s | 4 | 2 | 9 | V00-1-1 | V00-2-2 | - |
| 29 | 1110_0110_s | 2 | 3 | 9 | V00-1-1 | V00-2-2 | - |
| 30 | 1110_0111_s | 1 | 5 | 9 | V00-1-1 | V00-2-2 | - |
| 31 | 1110_1000_s | 1 | 6 | 9 | V00-1-1 | V00-2-2 | - |
| 32 | 1110_1001_s | 1 | 7 | 9 | V00-1-1 | V00-2-2 | - |
| 33 | 1110_1010_s | 0 | 12 | 9 | V00-1-1 | V00-2-2 | - |
| 34 | 1110_1011_s | 0 | 13 | 9 | V00-1-1 | V00-2-2 | - |
| 35 | 1110_1100_s | 0 | 14 | 9 | V00-1-1 | V00-2-2 | - |
| 36 | 1110_1101_s | 0 | 15 | 9 | V00-1-1 | V00-2-2 | - |
| 37 | 1110_1110_s | 0 | 16 | 9 | V00-1-1 | V00-2-2 | - |
| 38 | 1110_1111_s | 0 | 17 | 9 | V00-1-1 | V00-2-2 | - |
| 39 | 1111_0000_0s | 11 | 1 | 10 | V00-1-1 | V00-2-3 | - |
| 40 | 1111_0000_1s | 12 | 1 | 10 | V00-1-1 | V00-2-3 | - |
| 41 | 1111_0001_0s | 13 | 1 | 10 | V00-1-1 | V00-2-3 | - |
| 42 | 1111_0001_1s | 14 | 1 | 10 | V00-1-1 | V00-2-3 | - |
| 43 | 1111_0010_0s | 5 | 2 | 10 | V00-1-1 | V00-2-3 | - |
| 44 | 1111_0010_1s | 6 | 2 | 10 | V00-1-1 | V00-2-3 | - |
| 45 | 1111_0011_0s | 3 | 3 | 10 | V00-1-1 | V00-2-3 | - |
| 46 | 1111_0011_1s | 4 | 3 | 10 | V00-1-1 | V00-2-3 | - |
| 47 | 1111_0100_0s | 2 | 4 | 10 | V00-1-1 | V00-2-3 | - |
| 48 | 1111_0100_1s | 2 | 5 | 10 | V00-1-1 | V00-2-3 | - |
| 49 | 1111_0101_0s | 1 | 8 | 10 | V00-1-1 | V00-2-3 | - |
| 50 | 1111_0101_1s | 0 | 18 | 10 | V00-1-1 | V00-2-3 | - |
| 51 | 1111_0110_0s | 0 | 19 | 10 | V00-1-1 | V00-2-3 | - |
| 52 | 1111_0110_1s | 0 | 20 | 10 | V00-1-1 | V00-2-3 | - |
| 53 | 1111_0111_0s | 0 | 21 | 10 | V00-1-1 | V00-2-3 | - |
| 54 | 1111_0111_1s | 0 | 22 | 10 | V00-1-1 | V00-2-3 | - |
| 55 | 1111_1000_00s | 5 | 3 | 11 | V00-1-1 | V00-2-4 | - |
| 56 | 1111_1000_01s | 3 | 4 | 11 | V00-1-1 | V00-2-4 | - |
| 57 | 1111_1000_10s | 3 | 5 | 11 | V00-1-1 | V00-2-4 | - |
| 58 | 1111_1000_11s | 2 | 6 | 11 | V00-1-1 | V00-2-4 | - |
| 59 | 1111_1001_00s | 1 | 9 | 11 | V00-1-1 | V00-2-4 | - |
| 60 | 1111_1001_01s | 1 | 10 | 11 | V00-1-1 | V00-2-4 | - |
| 61 | 1111_1001_10s | 1 | 11 | 11 | V00-1-1 | V00-2-4 | - |
| 62 | 1111_1001_110 | 0 | 0 | 11 | V00-1-1 | V00-2-4 | - |
| 63 | 1111_1001_111 | 1 | 0 | 11 | V00-1-1 | V00-2-4 | - |

FIG. 32

| No. | VLC | run | level | length | 1st | 2nd | 3rd |
|---|---|---|---|---|---|---|---|
| 64 | 1111 1010 000s | 6 | 3 | 12 | V00-1-1 | V00-2-4 | - |
| 65 | 1111 1010 001s | 4 | 4 | 12 | V00-1-1 | V00-2-4 | - |
| 66 | 1111 1010 010s | 3 | 6 | 12 | V00-1-1 | V00-2-4 | - |
| 67 | 1111 1010 011s | 1 | 12 | 12 | V00-1-1 | V00-2-4 | - |
| 68 | 1111 1010 100s | 1 | 13 | 12 | V00-1-1 | V00-2-4 | - |
| 69 | 1111 1010 101s | 1 | 14 | 12 | V00-1-1 | V00-2-4 | - |
| 70 | 1111 1010 1100 | 2 | 0 | 12 | V00-1-1 | V00-2-4 | - |
| 71 | 1111 1010 1101 | 3 | 0 | 12 | V00-1-1 | V00-2-4 | - |
| 72 | 1111 1010 1110 | 4 | 0 | 12 | V00-1-1 | V00-2-4 | - |
| 73 | 1111 1010 1111 | 5 | 0 | 12 | V00-1-1 | V00-2-4 | - |
| 74 | 1111 1011 0000 s | 7 | 2 | 13 | V00-1-1 | V00-2-4 | V00-3-1 |
| 75 | 1111 1011 0001 s | 8 | 2 | 13 | V00-1-1 | V00-2-4 | V00-3-1 |
| 76 | 1111 1011 0010 s | 9 | 2 | 13 | V00-1-1 | V00-2-4 | V00-3-1 |
| 77 | 1111 1011 0011 s | 10 | 2 | 13 | V00-1-1 | V00-2-4 | V00-3-1 |
| 78 | 1111 1011 0100 s | 7 | 3 | 13 | V00-1-1 | V00-2-4 | V00-3-1 |
| 79 | 1111 1011 0101 s | 8 | 3 | 13 | V00-1-1 | V00-2-4 | V00-3-1 |
| 80 | 1111 1011 0110 s | 4 | 5 | 13 | V00-1-1 | V00-2-4 | V00-3-1 |
| 81 | 1111 1011 0111 s | 3 | 7 | 13 | V00-1-1 | V00-2-4 | V00-3-1 |
| 82 | 1111 1011 1000 s | 2 | 7 | 13 | V00-1-1 | V00-2-4 | V00-3-1 |
| 83 | 1111 1011 1001 s | 2 | 8 | 13 | V00-1-1 | V00-2-4 | V00-3-1 |
| 84 | 1111 1011 1010 s | 2 | 9 | 13 | V00-1-1 | V00-2-4 | V00-3-1 |
| 85 | 1111 1011 1011 s | 2 | 10 | 13 | V00-1-1 | V00-2-4 | V00-3-1 |
| 86 | 1111 1011 1100 s | 2 | 11 | 13 | V00-1-1 | V00-2-4 | V00-3-1 |
| 87 | 1111 1011 1101 s | 1 | 15 | 13 | V00-1-1 | V00-2-4 | V00-3-1 |
| 88 | 1111 1011 1110 s | 1 | 16 | 13 | V00-1-1 | V00-2-4 | V00-3-1 |
| 89 | 1111 1011 1111 s | 1 | 17 | 13 | V00-1-1 | V00-2-4 | V00-3-1 |
| 90 | 1111 1100 0011 0 | 6 | 0 | 13 | V00-1-1 | V00-2-4 | V00-3-2 |
| 91 | 1111 1100 0011 1 | 7 | 0 | 13 | V00-1-1 | V00-2-4 | V00-3-2 |
| 92 | 1111 1100 0100 0 | 8 | 0 | 13 | V00-1-1 | V00-2-4 | V00-3-2 |
| 93 | 1111 1100 0100 1 | 9 | 0 | 13 | V00-1-1 | V00-2-4 | V00-3-2 |
| 94 | 1111 1100 0101 0 | 10 | 0 | 13 | V00-1-1 | V00-2-4 | V00-3-2 |
| 95 | 1111 1100 0101 1 | 11 | 0 | 13 | V00-1-1 | V00-2-4 | V00-3-2 |
| 96 | 1111 1100 0110 0 | 12 | 0 | 13 | V00-1-1 | V00-2-4 | V00-3-2 |
| 97 | 1111 1100 0110 1 | 13 | 0 | 13 | V00-1-1 | V00-2-4 | V00-3-2 |
| 98 | 1111 1100 0111 0 | 14 | 0 | 13 | V00-1-1 | V00-2-4 | V00-3-2 |
| 99 | 1111 1100 0111 1 | 15 | 0 | 13 | V00-1-1 | V00-2-4 | V00-3-2 |
| 100 | 1111 1100 1000 0 | 16 | 0 | 13 | V00-1-1 | V00-2-4 | V00-3-2 |
| 101 | 1111 1100 1000 1 | 17 | 0 | 13 | V00-1-1 | V00-2-4 | V00-3-2 |
| 102 | 1111 1100 1001 0 | 18 | 0 | 13 | V00-1-1 | V00-2-4 | V00-3-2 |
| 103 | 1111 1100 1001 1 | 19 | 0 | 13 | V00-1-1 | V00-2-4 | V00-3-2 |
| 104 | 1111 1100 1010 0 | 20 | 0 | 13 | V00-1-1 | V00-2-4 | V00-3-2 |
| 105 | 1111 1100 1010 1 | 21 | 0 | 13 | V00-1-1 | V00-2-4 | V00-3-2 |
| 106 | 1111 1100 1011 0 | 22 | 0 | 13 | V00-1-1 | V00-2-4 | V00-3-2 |
| 107 | 1111 1100 1011 1 | 23 | 0 | 13 | V00-1-1 | V00-2-4 | V00-3-2 |
| 108 | 1111 1100 1100 0 | 24 | 0 | 13 | V00-1-1 | V00-2-4 | V00-3-2 |
| 109 | 1111 1100 1100 1 | 25 | 0 | 13 | V00-1-1 | V00-2-4 | V00-3-2 |
| 110 | 1111 1100 1101 0 | 26 | 0 | 13 | V00-1-1 | V00-2-4 | V00-3-2 |
| 111 | 1111 1100 1101 1 | 27 | 0 | 13 | V00-1-1 | V00-2-4 | V00-3-2 |
| 112 | 1111 1100 1110 0 | 28 | 0 | 13 | V00-1-1 | V00-2-4 | V00-3-2 |
| 113 | 1111 1100 1110 1 | 29 | 0 | 13 | V00-1-1 | V00-2-4 | V00-3-2 |
| 114 | 1111 1100 1111 0 | 30 | 0 | 13 | V00-1-1 | V00-2-4 | V00-3-2 |
| 115 | 1111 1100 1111 1 | 31 | 0 | 13 | V00-1-1 | V00-2-4 | V00-3-2 |
| 116 | 1111 1101 0000 0 | 32 | 0 | 13 | V00-1-1 | V00-2-4 | V00-3-3 |
| 117 | 1111 1101 0000 1 | 33 | 0 | 13 | V00-1-1 | V00-2-4 | V00-3-3 |
| 118 | 1111 1101 0001 0 | 34 | 0 | 13 | V00-1-1 | V00-2-4 | V00-3-3 |
| 119 | 1111 1101 0001 1 | 35 | 0 | 13 | V00-1-1 | V00-2-4 | V00-3-3 |
| 120 | 1111 1101 0010 0 | 36 | 0 | 13 | V00-1-1 | V00-2-4 | V00-3-3 |
| 121 | 1111 1101 0010 1 | 37 | 0 | 13 | V00-1-1 | V00-2-4 | V00-3-3 |
| 122 | 1111 1101 0011 0 | 38 | 0 | 13 | V00-1-1 | V00-2-4 | V00-3-3 |
| 123 | 1111 1101 0011 1 | 39 | 0 | 13 | V00-1-1 | V00-2-4 | V00-3-3 |
| 124 | 1111 1101 0100 0 | 40 | 0 | 13 | V00-1-1 | V00-2-4 | V00-3-3 |
| 125 | 1111 1101 0100 1 | 41 | 0 | 13 | V00-1-1 | V00-2-4 | V00-3-3 |
| 126 | 1111 1101 0101 0 | 42 | 0 | 13 | V00-1-1 | V00-2-4 | V00-3-3 |

FIG. 33

| No. | VLC | run | level | length | 1st | 2nd | 3rd |
|---|---|---|---|---|---|---|---|
| 127 | 1111 1101 0101 1 | 43 | 0 | 13 | V00-1-1 | V00-2-4 | V00-3-3 |
| 128 | 1111 1101 0110 0 | 44 | 0 | 13 | V00-1-1 | V00-2-4 | V00-3-3 |
| 129 | 1111 1101 0110 1 | 45 | 0 | 13 | V00-1-1 | V00-2-4 | V00-3-3 |
| 130 | 1111 1101 0111 0 | 46 | 0 | 13 | V00-1-1 | V00-2-4 | V00-3-3 |
| 131 | 1111 1101 0111 1 | 47 | 0 | 13 | V00-1-1 | V00-2-4 | V00-3-3 |
| 132 | 1111 1101 1000 0 | 48 | 0 | 13 | V00-1-1 | V00-2-4 | V00-3-3 |
| 133 | 1111 1101 1000 1 | 49 | 0 | 13 | V00-1-1 | V00-2-4 | V00-3-3 |
| 134 | 1111 1101 1001 0 | 50 | 0 | 13 | V00-1-1 | V00-2-4 | V00-3-3 |
| 135 | 1111 1101 1001 1 | 51 | 0 | 13 | V00-1-1 | V00-2-4 | V00-3-3 |
| 136 | 1111 1101 1010 0 | 52 | 0 | 13 | V00-1-1 | V00-2-4 | V00-3-3 |
| 137 | 1111 1101 1010 1 | 53 | 0 | 13 | V00-1-1 | V00-2-4 | V00-3-3 |
| 138 | 1111 1101 1011 0 | 54 | 0 | 13 | V00-1-1 | V00-2-4 | V00-3-3 |
| 139 | 1111 1101 1011 1 | 55 | 0 | 13 | V00-1-1 | V00-2-4 | V00-3-3 |
| 140 | 1111 1101 1100 0 | 56 | 0 | 13 | V00-1-1 | V00-2-4 | V00-3-3 |
| 141 | 1111 1101 1100 1 | 57 | 0 | 13 | V00-1-1 | V00-2-4 | V00-3-3 |
| 142 | 1111 1101 1101 0 | 58 | 0 | 13 | V00-1-1 | V00-2-4 | V00-3-3 |
| 143 | 1111 1101 1101 1 | 59 | 0 | 13 | V00-1-1 | V00-2-4 | V00-3-3 |
| 144 | 1111 1101 1110 0 | 60 | 0 | 13 | V00-1-1 | V00-2-4 | V00-3-3 |
| 145 | 1111 1101 1110 1 | 61 | 0 | 13 | V00-1-1 | V00-2-4 | V00-3-3 |
| 146 | 1111 1110 0010 111s | 0 | 23 | 16 | V00-1-1 | V00-2-4 | V00-3-4 |
| 147 | 1111 1110 0011 000s | 0 | 24 | 16 | V00-1-1 | V00-2-4 | V00-3-4 |
| 148 | 1111 1110 0011 001s | 0 | 25 | 16 | V00-1-1 | V00-2-4 | V00-3-4 |
| 149 | 1111 1110 0011 010s | 0 | 26 | 16 | V00-1-1 | V00-2-4 | V00-3-4 |
| 150 | 1111 1110 0011 011s | 0 | 27 | 16 | V00-1-1 | V00-2-4 | V00-3-4 |
| 151 | 1111 1110 0011 100s | 0 | 28 | 16 | V00-1-1 | V00-2-4 | V00-3-4 |
| 152 | 1111 1110 0011 101s | 0 | 29 | 16 | V00-1-1 | V00-2-4 | V00-3-4 |
| 153 | 1111 1110 0011 110s | 0 | 30 | 16 | V00-1-1 | V00-2-4 | V00-3-4 |
| 154 | 1111 1110 0011 111s | 0 | 31 | 16 | V00-1-1 | V00-2-4 | V00-3-4 |
| 155 | 1111 1110 0100 000s | 0 | 32 | 16 | V00-1-1 | V00-2-4 | V00-3-5 |
| 156 | 1111 1110 0100 001s | 0 | 33 | 16 | V00-1-1 | V00-2-4 | V00-3-5 |
| 157 | 1111 1110 0100 010s | 0 | 34 | 16 | V00-1-1 | V00-2-4 | V00-3-5 |
| 158 | 1111 1110 0100 011s | 0 | 35 | 16 | V00-1-1 | V00-2-4 | V00-3-5 |
| 159 | 1111 1110 0100 100s | 0 | 36 | 16 | V00-1-1 | V00-2-4 | V00-3-5 |
| 160 | 1111 1110 0100 101s | 0 | 37 | 16 | V00-1-1 | V00-2-4 | V00-3-5 |
| 161 | 1111 1110 0100 110s | 0 | 38 | 16 | V00-1-1 | V00-2-4 | V00-3-5 |
| 162 | 1111 1110 0100 111s | 0 | 39 | 16 | V00-1-1 | V00-2-4 | V00-3-5 |
| 163 | 1111 1110 0101 000s | 0 | 40 | 16 | V00-1-1 | V00-2-4 | V00-3-5 |
| 164 | 1111 1110 0101 001s | 0 | 41 | 16 | V00-1-1 | V00-2-4 | V00-3-5 |
| 165 | 1111 1110 0101 010s | 0 | 42 | 16 | V00-1-1 | V00-2-4 | V00-3-5 |
| 166 | 1111 1110 0101 011s | 0 | 43 | 16 | V00-1-1 | V00-2-4 | V00-3-5 |
| 167 | 1111 1110 0101 100s | 0 | 44 | 16 | V00-1-1 | V00-2-4 | V00-3-5 |
| 168 | 1111 1110 0101 101s | 0 | 45 | 16 | V00-1-1 | V00-2-4 | V00-3-5 |
| 169 | 1111 1110 0101 110s | 0 | 46 | 16 | V00-1-1 | V00-2-4 | V00-3-5 |
| 170 | 1111 1110 0101 111s | 0 | 47 | 16 | V00-1-1 | V00-2-4 | V00-3-5 |
| 171 | 1111 1110 0110 000s | 0 | 48 | 16 | V00-1-1 | V00-2-4 | V00-3-6 |
| 172 | 1111 1110 0110 001s | 0 | 49 | 16 | V00-1-1 | V00-2-4 | V00-3-6 |
| 173 | 1111 1110 0110 010s | 0 | 50 | 16 | V00-1-1 | V00-2-4 | V00-3-6 |
| 174 | 1111 1110 0110 011s | 0 | 51 | 16 | V00-1-1 | V00-2-4 | V00-3-6 |
| 175 | 1111 1110 0110 100s | 0 | 52 | 16 | V00-1-1 | V00-2-4 | V00-3-6 |
| 176 | 1111 1110 0110 101s | 0 | 53 | 16 | V00-1-1 | V00-2-4 | V00-3-6 |
| 177 | 1111 1110 0110 110s | 0 | 54 | 16 | V00-1-1 | V00-2-4 | V00-3-6 |
| 178 | 1111 1110 0110 111s | 0 | 55 | 16 | V00-1-1 | V00-2-4 | V00-3-6 |
| 179 | 1111 1110 0111 000s | 0 | 56 | 16 | V00-1-1 | V00-2-4 | V00-3-6 |
| 180 | 1111 1110 0111 001s | 0 | 57 | 16 | V00-1-1 | V00-2-4 | V00-3-6 |
| 181 | 1111 1110 0111 010s | 0 | 58 | 16 | V00-1-1 | V00-2-4 | V00-3-6 |
| 182 | 1111 1110 0111 011s | 0 | 59 | 16 | V00-1-1 | V00-2-4 | V00-3-6 |
| 183 | 1111 1110 0111 100s | 0 | 60 | 16 | V00-1-1 | V00-2-4 | V00-3-6 |
| 184 | 1111 1110 0111 101s | 0 | 61 | 16 | V00-1-1 | V00-2-4 | V00-3-6 |
| 185 | 1111 1110 0111 110s | 0 | 62 | 16 | V00-1-1 | V00-2-4 | V00-3-6 |
| 186 | 1111 1110 0111 111s | 0 | 63 | 16 | V00-1-1 | V00-2-4 | V00-3-6 |
| 187 | 1111 1110 1000 000s | 0 | 64 | 16 | V00-1-1 | V00-2-4 | V00-3-7 |
| 188 | 1111 1110 1000 001s | 0 | 65 | 16 | V00-1-1 | V00-2-4 | V00-3-7 |
| 189 | 1111 1110 1000 010s | 0 | 66 | 16 | V00-1-1 | V00-2-4 | V00-3-7 |

FIG. 34

| No. | VLC | run | level | length | 1st | 2nd | 3rd |
|---|---|---|---|---|---|---|---|
| 190 | 1111 1110 1000 011s | 0 | 67 | 16 | V00-1-1 | V00-2-4 | V00-3-7 |
| 191 | 1111 1110 1000 100s | 0 | 68 | 16 | V00-1-1 | V00-2-4 | V00-3-7 |
| 192 | 1111 1110 1000 101s | 0 | 69 | 16 | V00-1-1 | V00-2-4 | V00-3-7 |
| 193 | 1111 1110 1000 110s | 0 | 70 | 16 | V00-1-1 | V00-2-4 | V00-3-7 |
| 194 | 1111 1110 1000 111s | 0 | 71 | 16 | V00-1-1 | V00-2-4 | V00-3-7 |
| 195 | 1111 1110 1001 000s | 0 | 72 | 16 | V00-1-1 | V00-2-4 | V00-3-7 |
| 196 | 1111 1110 1001 001s | 0 | 73 | 16 | V00-1-1 | V00-2-4 | V00-3-7 |
| 197 | 1111 1110 1001 010s | 0 | 74 | 16 | V00-1-1 | V00-2-4 | V00-3-7 |
| 198 | 1111 1110 1001 011s | 0 | 75 | 16 | V00-1-1 | V00-2-4 | V00-3-7 |
| 199 | 1111 1110 1001 100s | 0 | 76 | 16 | V00-1-1 | V00-2-4 | V00-3-7 |
| 200 | 1111 1110 1001 101s | 0 | 77 | 16 | V00-1-1 | V00-2-4 | V00-3-7 |
| 201 | 1111 1110 1001 110s | 0 | 78 | 16 | V00-1-1 | V00-2-4 | V00-3-7 |
| 202 | 1111 1110 1001 111s | 0 | 79 | 16 | V00-1-1 | V00-2-4 | V00-3-7 |
| 203 | 1111 1110 1010 000s | 0 | 80 | 16 | V00-1-1 | V00-2-4 | V00-3-8 |
| 204 | 1111 1110 1010 001s | 0 | 81 | 16 | V00-1-1 | V00-2-4 | V00-3-8 |
| 205 | 1111 1110 1010 010s | 0 | 82 | 16 | V00-1-1 | V00-2-4 | V00-3-8 |
| 206 | 1111 1110 1010 011s | 0 | 83 | 16 | V00-1-1 | V00-2-4 | V00-3-8 |
| 207 | 1111 1110 1010 100s | 0 | 84 | 16 | V00-1-1 | V00-2-4 | V00-3-8 |
| 208 | 1111 1110 1010 101s | 0 | 85 | 16 | V00-1-1 | V00-2-4 | V00-3-8 |
| 209 | 1111 1110 1010 110s | 0 | 86 | 16 | V00-1-1 | V00-2-4 | V00-3-8 |
| 210 | 1111 1110 1010 111s | 0 | 87 | 16 | V00-1-1 | V00-2-4 | V00-3-8 |
| 211 | 1111 1110 1011 000s | 0 | 88 | 16 | V00-1-1 | V00-2-4 | V00-3-8 |
| 212 | 1111 1110 1011 001s | 0 | 89 | 16 | V00-1-1 | V00-2-4 | V00-3-8 |
| 213 | 1111 1110 1011 010s | 0 | 90 | 16 | V00-1-1 | V00-2-4 | V00-3-8 |
| 214 | 1111 1110 1011 011s | 0 | 91 | 16 | V00-1-1 | V00-2-4 | V00-3-8 |
| 215 | 1111 1110 1011 100s | 0 | 92 | 16 | V00-1-1 | V00-2-4 | V00-3-8 |
| 216 | 1111 1110 1011 101s | 0 | 93 | 16 | V00-1-1 | V00-2-4 | V00-3-8 |
| 217 | 1111 1110 1011 110s | 0 | 94 | 16 | V00-1-1 | V00-2-4 | V00-3-8 |
| 218 | 1111 1110 1011 111s | 0 | 95 | 16 | V00-1-1 | V00-2-4 | V00-3-8 |
| 219 | 1111 1110 1100 000s | 0 | 96 | 16 | V00-1-1 | V00-2-4 | V00-3-9 |
| 220 | 1111 1110 1100 001s | 0 | 97 | 16 | V00-1-1 | V00-2-4 | V00-3-9 |
| 221 | 1111 1110 1100 010s | 0 | 98 | 16 | V00-1-1 | V00-2-4 | V00-3-9 |
| 222 | 1111 1110 1100 011s | 0 | 99 | 16 | V00-1-1 | V00-2-4 | V00-3-9 |
| 223 | 1111 1110 1100 100s | 0 | 100 | 16 | V00-1-1 | V00-2-4 | V00-3-9 |
| 224 | 1111 1110 1100 101s | 0 | 101 | 16 | V00-1-1 | V00-2-4 | V00-3-9 |
| 225 | 1111 1110 1100 110s | 0 | 102 | 16 | V00-1-1 | V00-2-4 | V00-3-9 |
| 226 | 1111 1110 1100 111s | 0 | 103 | 16 | V00-1-1 | V00-2-4 | V00-3-9 |
| 227 | 1111 1110 1101 000s | 0 | 104 | 16 | V00-1-1 | V00-2-4 | V00-3-9 |
| 228 | 1111 1110 1101 001s | 0 | 105 | 16 | V00-1-1 | V00-2-4 | V00-3-9 |
| 229 | 1111 1110 1101 010s | 0 | 106 | 16 | V00-1-1 | V00-2-4 | V00-3-9 |
| 230 | 1111 1110 1101 011s | 0 | 107 | 16 | V00-1-1 | V00-2-4 | V00-3-9 |
| 231 | 1111 1110 1101 100s | 0 | 108 | 16 | V00-1-1 | V00-2-4 | V00-3-9 |
| 232 | 1111 1110 1101 101s | 0 | 109 | 16 | V00-1-1 | V00-2-4 | V00-3-9 |
| 233 | 1111 1110 1101 110s | 0 | 110 | 16 | V00-1-1 | V00-2-4 | V00-3-9 |
| 234 | 1111 1110 1101 111s | 0 | 111 | 16 | V00-1-1 | V00-2-4 | V00-3-9 |
| 235 | 1111 1110 1110 000s | 0 | 112 | 16 | V00-1-1 | V00-2-4 | V00-3-10 |
| 236 | 1111 1110 1110 001s | 0 | 113 | 16 | V00-1-1 | V00-2-4 | V00-3-10 |
| 237 | 1111 1110 1110 010s | 0 | 114 | 16 | V00-1-1 | V00-2-4 | V00-3-10 |
| 238 | 1111 1110 1110 011s | 0 | 115 | 16 | V00-1-1 | V00-2-4 | V00-3-10 |
| 239 | 1111 1110 1110 100s | 0 | 116 | 16 | V00-1-1 | V00-2-4 | V00-3-10 |
| 240 | 1111 1110 1110 101s | 0 | 117 | 16 | V00-1-1 | V00-2-4 | V00-3-10 |
| 241 | 1111 1110 1110 110s | 0 | 118 | 16 | V00-1-1 | V00-2-4 | V00-3-10 |
| 242 | 1111 1110 1110 111s | 0 | 119 | 16 | V00-1-1 | V00-2-4 | V00-3-10 |
| 243 | 1111 1110 1111 000s | 0 | 120 | 16 | V00-1-1 | V00-2-4 | V00-3-10 |
| 244 | 1111 1110 1111 001s | 0 | 121 | 16 | V00-1-1 | V00-2-4 | V00-3-10 |
| 245 | 1111 1110 1111 010s | 0 | 122 | 16 | V00-1-1 | V00-2-4 | V00-3-10 |
| 246 | 1111 1110 1111 011s | 0 | 123 | 16 | V00-1-1 | V00-2-4 | V00-3-10 |
| 247 | 1111 1110 1111 100s | 0 | 124 | 16 | V00-1-1 | V00-2-4 | V00-3-10 |
| 248 | 1111 1110 1111 101s | 0 | 125 | 16 | V00-1-1 | V00-2-4 | V00-3-10 |
| 249 | 1111 1110 1111 110s | 0 | 126 | 16 | V00-1-1 | V00-2-4 | V00-3-10 |
| 250 | 1111 1110 1111 111s | 0 | 127 | 16 | V00-1-1 | V00-2-4 | V00-3-10 |
| 251 | 1111 1111 0000 000s | 0 | 128 | 16 | V00-1-1 | V00-2-4 | V00-3-11 |
| 252 | 1111 1111 0000 001s | 0 | 129 | 16 | V00-1-1 | V00-2-4 | V00-3-11 |

FIG. 35

| No. | VLC | run | level | length | 1st | 2nd | 3rd |
|---|---|---|---|---|---|---|---|
| 253 | 1111_1111_0000_010s | 0 | 130 | 16 | V00-1-1 | V00-2-4 | V00-3-11 |
| 254 | 1111_1111_0000_011s | 0 | 131 | 16 | V00-1-1 | V00-2-4 | V00-3-11 |
| 255 | 1111_1111_0000_100s | 0 | 132 | 16 | V00-1-1 | V00-2-4 | V00-3-11 |
| 256 | 1111_1111_0000_101s | 0 | 133 | 16 | V00-1-1 | V00-2-4 | V00-3-11 |
| 257 | 1111_1111_0000_110s | 0 | 134 | 16 | V00-1-1 | V00-2-4 | V00-3-11 |
| 258 | 1111_1111_0000_111s | 0 | 135 | 16 | V00-1-1 | V00-2-4 | V00-3-11 |
| 259 | 1111_1111_0001_000s | 0 | 136 | 16 | V00-1-1 | V00-2-4 | V00-3-11 |
| 260 | 1111_1111_0001_001s | 0 | 137 | 16 | V00-1-1 | V00-2-4 | V00-3-11 |
| 261 | 1111_1111_0001_010s | 0 | 138 | 16 | V00-1-1 | V00-2-4 | V00-3-11 |
| 262 | 1111_1111_0001_011s | 0 | 139 | 16 | V00-1-1 | V00-2-4 | V00-3-11 |
| 263 | 1111_1111_0001_100s | 0 | 140 | 16 | V00-1-1 | V00-2-4 | V00-3-11 |
| 264 | 1111_1111_0001_101s | 0 | 141 | 16 | V00-1-1 | V00-2-4 | V00-3-11 |
| 265 | 1111_1111_0001_110s | 0 | 142 | 16 | V00-1-1 | V00-2-4 | V00-3-11 |
| 266 | 1111_1111_0001_111s | 0 | 143 | 16 | V00-1-1 | V00-2-4 | V00-3-11 |
| 267 | 1111_1111_0010_000s | 0 | 144 | 16 | V00-1-1 | V00-2-4 | V00-3-12 |
| 268 | 1111_1111_0010_001s | 0 | 145 | 16 | V00-1-1 | V00-2-4 | V00-3-12 |
| 269 | 1111_1111_0010_010s | 0 | 146 | 16 | V00-1-1 | V00-2-4 | V00-3-12 |
| 270 | 1111_1111_0010_011s | 0 | 147 | 16 | V00-1-1 | V00-2-4 | V00-3-12 |
| 271 | 1111_1111_0010_100s | 0 | 148 | 16 | V00-1-1 | V00-2-4 | V00-3-12 |
| 272 | 1111_1111_0010_101s | 0 | 149 | 16 | V00-1-1 | V00-2-4 | V00-3-12 |
| 273 | 1111_1111_0010_110s | 0 | 150 | 16 | V00-1-1 | V00-2-4 | V00-3-12 |
| 274 | 1111_1111_0010_111s | 0 | 151 | 16 | V00-1-1 | V00-2-4 | V00-3-12 |
| 275 | 1111_1111_0011_000s | 0 | 152 | 16 | V00-1-1 | V00-2-4 | V00-3-12 |
| 276 | 1111_1111_0011_001s | 0 | 153 | 16 | V00-1-1 | V00-2-4 | V00-3-12 |
| 277 | 1111_1111_0011_010s | 0 | 154 | 16 | V00-1-1 | V00-2-4 | V00-3-12 |
| 278 | 1111_1111_0011_011s | 0 | 155 | 16 | V00-1-1 | V00-2-4 | V00-3-12 |
| 279 | 1111_1111_0011_100s | 0 | 156 | 16 | V00-1-1 | V00-2-4 | V00-3-12 |
| 280 | 1111_1111_0011_101s | 0 | 157 | 16 | V00-1-1 | V00-2-4 | V00-3-12 |
| 281 | 1111_1111_0011_110s | 0 | 158 | 16 | V00-1-1 | V00-2-4 | V00-3-12 |
| 282 | 1111_1111_0011_111s | 0 | 159 | 16 | V00-1-1 | V00-2-4 | V00-3-12 |
| 283 | 1111_1111_0100_000s | 0 | 160 | 16 | V00-1-1 | V00-2-4 | V00-3-13 |
| 284 | 1111_1111_0100_001s | 0 | 161 | 16 | V00-1-1 | V00-2-4 | V00-3-13 |
| 285 | 1111_1111_0100_010s | 0 | 162 | 16 | V00-1-1 | V00-2-4 | V00-3-13 |
| 286 | 1111_1111_0100_011s | 0 | 163 | 16 | V00-1-1 | V00-2-4 | V00-3-13 |
| 287 | 1111_1111_0100_100s | 0 | 164 | 16 | V00-1-1 | V00-2-4 | V00-3-13 |
| 288 | 1111_1111_0100_101s | 0 | 165 | 16 | V00-1-1 | V00-2-4 | V00-3-13 |
| 289 | 1111_1111_0100_110s | 0 | 166 | 16 | V00-1-1 | V00-2-4 | V00-3-13 |
| 290 | 1111_1111_0100_111s | 0 | 167 | 16 | V00-1-1 | V00-2-4 | V00-3-13 |
| 291 | 1111_1111_0101_000s | 0 | 168 | 16 | V00-1-1 | V00-2-4 | V00-3-13 |
| 292 | 1111_1111_0101_001s | 0 | 169 | 16 | V00-1-1 | V00-2-4 | V00-3-13 |
| 293 | 1111_1111_0101_010s | 0 | 170 | 16 | V00-1-1 | V00-2-4 | V00-3-13 |
| 294 | 1111_1111_0101_011s | 0 | 171 | 16 | V00-1-1 | V00-2-4 | V00-3-13 |
| 295 | 1111_1111_0101_100s | 0 | 172 | 16 | V00-1-1 | V00-2-4 | V00-3-13 |
| 296 | 1111_1111_0101_101s | 0 | 173 | 16 | V00-1-1 | V00-2-4 | V00-3-13 |
| 297 | 1111_1111_0101_110s | 0 | 174 | 16 | V00-1-1 | V00-2-4 | V00-3-13 |
| 298 | 1111_1111_0101_111s | 0 | 175 | 16 | V00-1-1 | V00-2-4 | V00-3-13 |
| 299 | 1111_1111_0110_000s | 0 | 176 | 16 | V00-1-1 | V00-2-4 | V00-3-14 |
| 300 | 1111_1111_0110_001s | 0 | 177 | 16 | V00-1-1 | V00-2-4 | V00-3-14 |
| 301 | 1111_1111_0110_010s | 0 | 178 | 16 | V00-1-1 | V00-2-4 | V00-3-14 |
| 302 | 1111_1111_0110_011s | 0 | 179 | 16 | V00-1-1 | V00-2-4 | V00-3-14 |
| 303 | 1111_1111_0110_100s | 0 | 180 | 16 | V00-1-1 | V00-2-4 | V00-3-14 |
| 304 | 1111_1111_0110_101s | 0 | 181 | 16 | V00-1-1 | V00-2-4 | V00-3-14 |
| 305 | 1111_1111_0110_110s | 0 | 182 | 16 | V00-1-1 | V00-2-4 | V00-3-14 |
| 306 | 1111_1111_0110_111s | 0 | 183 | 16 | V00-1-1 | V00-2-4 | V00-3-14 |
| 307 | 1111_1111_0111_000s | 0 | 184 | 16 | V00-1-1 | V00-2-4 | V00-3-14 |
| 308 | 1111_1111_0111_001s | 0 | 185 | 16 | V00-1-1 | V00-2-4 | V00-3-14 |
| 309 | 1111_1111_0111_010s | 0 | 186 | 16 | V00-1-1 | V00-2-4 | V00-3-14 |
| 310 | 1111_1111_0111_011s | 0 | 187 | 16 | V00-1-1 | V00-2-4 | V00-3-14 |
| 311 | 1111_1111_0111_100s | 0 | 188 | 16 | V00-1-1 | V00-2-4 | V00-3-14 |
| 312 | 1111_1111_0111_101s | 0 | 189 | 16 | V00-1-1 | V00-2-4 | V00-3-14 |
| 313 | 1111_1111_0111_110s | 0 | 190 | 16 | V00-1-1 | V00-2-4 | V00-3-14 |
| 314 | 1111_1111_0111_111s | 0 | 191 | 16 | V00-1-1 | V00-2-4 | V00-3-14 |
| 315 | 1111_1111_1000_000s | 0 | 192 | 16 | V00-1-1 | V00-2-4 | V00-3-15 |

*FIG. 36*

| No. | VLC | run | level | length | 1st | 2nd | 3rd |
|---|---|---|---|---|---|---|---|
| 316 | 1111 1111 1000 001s | 0 | 193 | 16 | V00-1-1 | V00-2-4 | V00-3-15 |
| 317 | 1111 1111 1000 010s | 0 | 194 | 16 | V00-1-1 | V00-2-4 | V00-3-15 |
| 318 | 1111 1111 1000 011s | 0 | 195 | 16 | V00-1-1 | V00-2-4 | V00-3-15 |
| 319 | 1111 1111 1000 100s | 0 | 196 | 16 | V00-1-1 | V00-2-4 | V00-3-15 |
| 320 | 1111 1111 1000 101s | 0 | 197 | 16 | V00-1-1 | V00-2-4 | V00-3-15 |
| 321 | 1111 1111 1000 110s | 0 | 198 | 16 | V00-1-1 | V00-2-4 | V00-3-15 |
| 322 | 1111 1111 1000 111s | 0 | 199 | 16 | V00-1-1 | V00-2-4 | V00-3-15 |
| 323 | 1111 1111 1001 000s | 0 | 200 | 16 | V00-1-1 | V00-2-4 | V00-3-15 |
| 324 | 1111 1111 1001 001s | 0 | 201 | 16 | V00-1-1 | V00-2-4 | V00-3-15 |
| 325 | 1111 1111 1001 010s | 0 | 202 | 16 | V00-1-1 | V00-2-4 | V00-3-15 |
| 326 | 1111 1111 1001 011s | 0 | 203 | 16 | V00-1-1 | V00-2-4 | V00-3-15 |
| 327 | 1111 1111 1001 100s | 0 | 204 | 16 | V00-1-1 | V00-2-4 | V00-3-15 |
| 328 | 1111 1111 1001 101s | 0 | 205 | 16 | V00-1-1 | V00-2-4 | V00-3-15 |
| 329 | 1111 1111 1001 110s | 0 | 206 | 16 | V00-1-1 | V00-2-4 | V00-3-15 |
| 330 | 1111 1111 1001 111s | 0 | 207 | 16 | V00-1-1 | V00-2-4 | V00-3-15 |
| 331 | 1111 1111 1010 000s | 0 | 208 | 16 | V00-1-1 | V00-2-4 | V00-3-16 |
| 332 | 1111 1111 1010 001s | 0 | 209 | 16 | V00-1-1 | V00-2-4 | V00-3-16 |
| 333 | 1111 1111 1010 010s | 0 | 210 | 16 | V00-1-1 | V00-2-4 | V00-3-16 |
| 334 | 1111 1111 1010 011s | 0 | 211 | 16 | V00-1-1 | V00-2-4 | V00-3-16 |
| 335 | 1111 1111 1010 100s | 0 | 212 | 16 | V00-1-1 | V00-2-4 | V00-3-16 |
| 336 | 1111 1111 1010 101s | 0 | 213 | 16 | V00-1-1 | V00-2-4 | V00-3-16 |
| 337 | 1111 1111 1010 110s | 0 | 214 | 16 | V00-1-1 | V00-2-4 | V00-3-16 |
| 338 | 1111 1111 1010 111s | 0 | 215 | 16 | V00-1-1 | V00-2-4 | V00-3-16 |
| 339 | 1111 1111 1011 000s | 0 | 216 | 16 | V00-1-1 | V00-2-4 | V00-3-16 |
| 340 | 1111 1111 1011 001s | 0 | 217 | 16 | V00-1-1 | V00-2-4 | V00-3-16 |
| 341 | 1111 1111 1011 010s | 0 | 218 | 16 | V00-1-1 | V00-2-4 | V00-3-16 |
| 342 | 1111 1111 1011 011s | 0 | 219 | 16 | V00-1-1 | V00-2-4 | V00-3-16 |
| 343 | 1111 1111 1011 100s | 0 | 220 | 16 | V00-1-1 | V00-2-4 | V00-3-16 |
| 344 | 1111 1111 1011 101s | 0 | 221 | 16 | V00-1-1 | V00-2-4 | V00-3-16 |
| 345 | 1111 1111 1011 110s | 0 | 222 | 16 | V00-1-1 | V00-2-4 | V00-3-16 |
| 346 | 1111 1111 1011 111s | 0 | 223 | 16 | V00-1-1 | V00-2-4 | V00-3-16 |
| 347 | 1111 1111 1100 000s | 0 | 224 | 16 | V00-1-1 | V00-2-4 | V00-3-17 |
| 348 | 1111 1111 1100 001s | 0 | 225 | 16 | V00-1-1 | V00-2-4 | V00-3-17 |
| 349 | 1111 1111 1100 010s | 0 | 226 | 16 | V00-1-1 | V00-2-4 | V00-3-17 |
| 350 | 1111 1111 1100 011s | 0 | 227 | 16 | V00-1-1 | V00-2-4 | V00-3-17 |
| 351 | 1111 1111 1100 100s | 0 | 228 | 16 | V00-1-1 | V00-2-4 | V00-3-17 |
| 352 | 1111 1111 1100 101s | 0 | 229 | 16 | V00-1-1 | V00-2-4 | V00-3-17 |
| 353 | 1111 1111 1100 110s | 0 | 230 | 16 | V00-1-1 | V00-2-4 | V00-3-17 |
| 354 | 1111 1111 1100 111s | 0 | 231 | 16 | V00-1-1 | V00-2-4 | V00-3-17 |
| 355 | 1111 1111 1101 000s | 0 | 232 | 16 | V00-1-1 | V00-2-4 | V00-3-17 |
| 356 | 1111 1111 1101 001s | 0 | 233 | 16 | V00-1-1 | V00-2-4 | V00-3-17 |
| 357 | 1111 1111 1101 010s | 0 | 234 | 16 | V00-1-1 | V00-2-4 | V00-3-17 |
| 358 | 1111 1111 1101 011s | 0 | 235 | 16 | V00-1-1 | V00-2-4 | V00-3-17 |
| 359 | 1111 1111 1101 100s | 0 | 236 | 16 | V00-1-1 | V00-2-4 | V00-3-17 |
| 360 | 1111 1111 1101 101s | 0 | 237 | 16 | V00-1-1 | V00-2-4 | V00-3-17 |
| 361 | 1111 1111 1101 110s | 0 | 238 | 16 | V00-1-1 | V00-2-4 | V00-3-17 |
| 362 | 1111 1111 1101 111s | 0 | 239 | 16 | V00-1-1 | V00-2-4 | V00-3-17 |
| 363 | 1111 1111 1110 000s | 0 | 240 | 16 | V00-1-1 | V00-2-4 | V00-3-18 |
| 364 | 1111 1111 1110 001s | 0 | 241 | 16 | V00-1-1 | V00-2-4 | V00-3-18 |
| 365 | 1111 1111 1110 010s | 0 | 242 | 16 | V00-1-1 | V00-2-4 | V00-3-18 |
| 366 | 1111 1111 1110 011s | 0 | 243 | 16 | V00-1-1 | V00-2-4 | V00-3-18 |
| 367 | 1111 1111 1110 100s | 0 | 244 | 16 | V00-1-1 | V00-2-4 | V00-3-18 |
| 368 | 1111 1111 1110 101s | 0 | 245 | 16 | V00-1-1 | V00-2-4 | V00-3-18 |
| 369 | 1111 1111 1110 110s | 0 | 246 | 16 | V00-1-1 | V00-2-4 | V00-3-18 |
| 370 | 1111 1111 1110 111s | 0 | 247 | 16 | V00-1-1 | V00-2-4 | V00-3-18 |
| 371 | 1111 1111 1111 000s | 0 | 248 | 16 | V00-1-1 | V00-2-4 | V00-3-18 |
| 372 | 1111 1111 1111 001s | 0 | 249 | 16 | V00-1-1 | V00-2-4 | V00-3-18 |
| 373 | 1111 1111 1111 010s | 0 | 250 | 16 | V00-1-1 | V00-2-4 | V00-3-18 |
| 374 | 1111 1111 1111 011s | 0 | 251 | 16 | V00-1-1 | V00-2-4 | V00-3-18 |
| 375 | 1111 1111 1111 100s | 0 | 252 | 16 | V00-1-1 | V00-2-4 | V00-3-18 |
| 376 | 1111 1111 1111 101s | 0 | 253 | 16 | V00-1-1 | V00-2-4 | V00-3-18 |
| 377 | 1111 1111 1111 110s | 0 | 254 | 16 | V00-1-1 | V00-2-4 | V00-3-18 |
| 378 | 1111 1111 1111 111s | 0 | 255 | 16 | V00-1-1 | V00-2-4 | V00-3-18 |

FIG. 41

| NO. | TABLE NAME | OFFSET | KEYWORD |
|---|---|---|---|
| 1 | OFS_14D | 0x000 | LOW-ORDER 6 BITS OF ENCODED ABS |
| 2 | OFS_14A | 0x040 | LOW-ORDER 6 BITS OF ENCODED ABS |
| 3 | OFS_15 | 0x080 | LOW-ORDER 6 BITS OF ENCODED ABS |
| 4 | ESC_MPEG | 0x0c0 | LOW-ORDER 6 BITS OF ENCODED ABS |
| 5 | RUN_01B14D | 0x100 | LOW-ORDER 6 BITS OF ENCODED RUN |
| 6 | RUN_01B14A | 0x140 | LOW-ORDER 6 BITS OF ENCODED RUN |
| 7 | RUN_02B14 | 0x180 | LOW-ORDER 6 BITS OF ENCODED RUN |
| 8 | RUN_03B14 | 0x1c0 | LOW-ORDER 4 BITS OF ENCODED RUN |
| 9 | RUN_04B14 | 0x1d0 | LOW-ORDER 3 BITS OF ENCODED RUN |
| ... | ... | ... | ... |
| 43 | RUN_38B14 | 0x23a | LEAST SIGNIFICANT BIT OF ENCODED RUN |
| 44 | RUN_39B14 | 0x23c | LEAST SIGNIFICANT BIT OF ENCODED RUN |
| 45 | RUN_40B14 | 0x23e | LEAST SIGNIFICANT BIT OF ENCODED RUN |
| 46 | RUN_01B15 | 0x240 | LOW-ORDER 6 BITS OF ENCODED RUN |
| 47 | RUN_02B15 | 0x280 | LOW-ORDER 6 BITS OF ENCODED RUN |
| 48 | RUN_03B15 | 0x2c0 | LOW-ORDER 4 BITS OF ENCODED RUN |
| ... | ... | ... | ... |
| 83 | RUN_38B15 | 0x33a | LEAST SIGNIFICANT BIT OF ENCODED RUN |
| 84 | RUN_39B15 | 0x33c | LEAST SIGNIFICANT BIT OF ENCODED RUN |
| 85 | RUN_40B15 | 0x33e | LEAST SIGNIFICANT BIT OF ENCODED RUN |

FIG. 42

| KEYWORD | TABLE TO BE CANDIDATE FOR RUN RETRIEVAL |
|---|---|
| 0 | INVALID |
| 1 | RUN_01B14A |
| 2 | RUN_02B14 |
| 3 | RUN_03B14 |
| 4 | RUN_04B14 |
| ... | ... |
| 39 | RUN_39B14 |
| 40 | RUN_40B14 |
| 41 | INVALID |
| 42 | INVALID |
| ... | ... |
| 62 | INVALID |
| 63 | INVALID |

FIG. 43

| KEYWORD | RETRIEVAL DATA |
|---|---|
| 0 | 0x00000000 |
| 1 | 0xffffffff |
| 2 | 0xffff8000 |
| 3 | 0xfe000000 |
| 4 | 0xf0000000 |
| ... | ... |
| 39 | 0x80000000 |
| 40 | 0x80000000 |
| 41 | 0x00000000 |
| 42 | 0x00000000 |
| ... | ... |
| 62 | 0x00000000 |
| 63 | 0x00000000 |

FIG. 44

| KEYWORD | VARIABLE LENGTH CODE (BINARY NUMERAL) | LENGTH |
|---|---|---|
| 0 | 0010_10 | 6 |
| 1 | 0010_11 | 6 |
| 2 | 0010_0101_0 | 9 |
| 3 | 0010_0101_1 | 9 |
| 4 | 0000_0010_110 | 11 |
| 5 | 0000_0010_111 | 11 |
| 6 | 0000_0001_1100_0 | 13 |
| 7 | 0000_0001_1100_1 | 13 |
| 8 | 0000_0001_0010_0 | 13 |
| 9 | 0000_0001_0010_1 | 13 |
| 10 | 0000_0000_1001_00 | 14 |
| 11 | 0000_0000_1001_01 | 14 |
| 12 | 0000_0000_0001_0100_0 | 17 |
| 13 | 0000_0000_0001_0100_1 | 17 |
| 14 | INVALID | INVALID |
| 15 | INVALID | INVALID |

F I G. 4 5

| NO. | TABLE NAME | OFFSET | KEYWORD |
|---|---|---|---|
| 1 | OFS_DVC | 0x000 | LOW-ORDER 6 BITS OF ENCODED ABS |
| 2 | ESC_DVC | 0x0c0 | LOW-ORDER 6 BITS OF ENCODED ABS |
| 3 | RUN_00DVC | 0x100 | LOW-ORDER 7 BITS OF ENCODED ABS |
| 4 | RUN_01DVC | 0x180 | LOW-ORDER 5 BITS OF ENCODED ABS |
| 5 | RUN_02DVC | 0x1a0 | LOW-ORDER 5 BITS OF ENCODED ABS |
| 6 | RUN_03DVC | 0x1c0 | LOW-ORDER 5 BITS OF ENCODED ABS |
| 7 | RUN_04DVC | 0x1e0 | LOW-ORDER 4 BITS OF ENCODED ABS |
| ... | ... | ... | ... |
| 63 | RUN_60DVC | 0x29c | LEAST SIGNIFICANT BIT OF ENCODED RUN |
| 64 | RUN_61DVC | 0x29e | LEAST SIGNIFICANT BIT OF ENCODED RUN |
| 65 | RUN_62DVC | 0x2a0 | LEAST SIGNIFICANT BIT OF ENCODED RUN |
| 66 | RUN_63DVC | 0x2a2 | LEAST SIGNIFICANT BIT OF ENCODED RUN |

FIG. 46

| KEYWORD | TABLE TO BE CANDIDATE FOR RUN RETRIEVAL |
|---|---|
| 0 | RUN_00DVC |
| 1 | RUN_01DVC |
| 2 | RUN_02DVC |
| 3 | RUN_03DVC |
| 4 | RUN_04DVC |
| . | . |
| . | . |
| . | . |
| 62 | RUN_62DVC |
| 63 | RUN_63DVC |

FIG. 47

| KEYWORD | RETRIEVAL DATA |
|---|---|
| 0 | 0xffffffff |
| 1 | 0xfffe0000 |
| 2 | 0xffe00000 |
| 3 | 0xff800000 |
| 4 | 0xf8000000 |
| . | . |
| . | . |
| . | . |
| 62 | 0x80000000 |
| 63 | 0x80000000 |

FIG. 48

| KEYWORD | VARIABL LENGTH CODE (BINARY NUMERAL) | LENGTH |
|---|---|---|
| 0 | 1111_1001_110 | 11 |
| 1 | 1111_1001_110 | 11 |
| 2 | 1111_1001_111 | 11 |
| 3 | 1111_1001_111 | 11 |
| 4 | 1111_1010_1100 | 12 |
| 5 | 1111_1010_1100 | 12 |
| 6 | 1111_1010_1101 | 12 |
| 7 | 1111_1010_1101 | 12 |
| 8 | 1111_1010_1110 | 12 |
| 9 | 1111_1010_1110 | 12 |
| 10 | 1111_1010_1111 | 12 |
| 11 | 1111_1010_1111 | 12 |
| 12 | 1111_1100_0011_0 | 13 |
| 13 | 1111_1100_0011_0 | 13 |
| 14 | 1111_1100_0011_1 | 13 |
| 15 | 1111_1100_0011_1 | 13 |
| . | . | . |
| . | . | . |
| . | . | . |
| 60 | 1111_1100_1111_0 | 13 |
| 61 | 1111_1100_1111_0 | 13 |
| 62 | 1111_1100_1111_1 | 13 |
| 63 | 1111_1100_1111_1 | 13 |

FIG. 49

| KEYWORD | VARIABLE LENGTH CODE (BINARY NUMERAL) | LENGTH |
|---|---|---|
| 0 | 1000_0 | 5 |
| 1 | 1000_1 | 5 |
| 2 | 1101_0110 | 8 |
| 3 | 1101_0111 | 8 |
| 4 | 1110_0110_0 | 9 |
| 5 | 1110_0110_1 | 9 |
| 6 | 1111_0011_00 | 10 |
| 7 | 1111_0011_01 | 10 |
| 8 | 1111_0011_10 | 10 |
| 9 | 1111_0011_11 | 10 |
| 10 | 1111_1000_000 | 11 |
| 11 | 1111_1000_001 | 11 |
| 12 | 1111_1010_0000 | 12 |
| 13 | 1111_1010_0001 | 12 |
| 14 | 1111_1011_0100_0 | 13 |
| 15 | 1111_1011_0100_1 | 13 |
| 16 | 1111_1011_0101_0 | 13 |
| 17 | 1111_1011_0101_1 | 13 |
| 18 | INVALID | INVALID |
| 19 | INVALID | INVALID |
| . | . | . |
| . | . | . |
| . | . | . |
| 30 | INVALID | INVALID |
| 31 | INVALID | INVALID |

FIG. 50

| KEYWORD | VARIABLE LENGTH CODE (BINARY NUMERAL) | LENGTH |
|---|---|---|
| 0 | 1110_1011_0 | 9 |
| 1 | 1110_1011_1 | 9 |
| 2 | 1111_1010_1000 | 12 |
| 3 | 1111_1010_1001 | 12 |

VARIABLE LENGTH CODE PROCESSOR WITH ENCODING AND/OR DECODING

BACKGROUND OF THE INVENTION

1. Field of the Invention

The present invention relates to a variable length code processor that performs variable length encoding and decoding.

2. Description of the Background Art

As technology for digital is advanced, it is improved to digitize processes for which analog process has been usually employed. Its typical representative is, for example, time-varying image processes, e.g., MPEG2. In such a filed, data compression technology is important, and the variable length encoding and decoding of data is one of useful techniques.

Unfortunately, due to a vast difference between the processing contents of a variable length encoding and that of a variable length decoding, it has been the general practice to perform a variable length encoding and a variable length decoding by using a unit for the former and a unit for the latter in the inherent encoding standard, respectively.

Since the conventional variable length encoding and decoding processes have been made in the above-mentioned manner, it has been impossible for a single unit to perform efficient variable length encoding and decoding processes in a plurality of encoding standards.

JP-A-5-56283 (1993) discloses an encoding and decoding equipment in which an encoding table and a decoding table are housed in one memory (ROM) so that encoding and decoding processes are carried out by the software process of the same CPU.

Improvement on the hardware in this encoding and decoding equipment is such a degree that both the encoding table and decoding table are stored in a single ROM. Therefore, it is merely a configuration in which a variable length encoding equipment and a variable length decoding equipment are substantially united. Also, little or no attempt is made to simplify hardware configuration.

SUMMARY OF THE INVENTION

According to a first aspect of the present invention, a variable length code processor comprises: a rewritable first storage section; a rewritable second storage section; and a variable length code processing execution section that executes a variable length code processing that includes at least one of a decoding process being a decoding of a variable length code provided from outside and an encoding process being a variable length encoding of data to be encoded which is provided from outside. This processor is characterized in that: the first storage section can store a variable length code processing information serving as a reference information in performing the variable length code processing, in accordance with an encoding standard for a variable length code to be processed; the second storage section can store an encoding standard information that indicates an encoding standard for the variable length code to be processed; and the variable length code processing execution section executes the variable length code processing by referring to the encoding standard information and the variable length code processing information.

According to a second aspect, the variable length code processor of the first aspect is characterized in that the variable length code processing execution section includes a variable length decoding section that performs a decoding process for decoding a variable length code to be provided from outside.

According to a third aspect, the variable length code processor of the second aspect is characterized in that the variable length code provided from outside includes first and second codes, the first code including a code obtained by variable length encoding of a two-dimensional code, the two-dimensional code being composed of first and second item data having a different meaning, the first item data indicating the number of continuous zeros, the second item data indicating a value of data that follows the zeros counted in the first item data, the second code including a code indicating a boundary of a variable length code; and the variable length decoding section outputs a decoded data by subsequently outputting at least a data bit constituting the decoded data, and has an output data counter that counts the number of the data bit to be outputted, so that in decoding the first code, the decoded data is outputted by outputting a value indicated by the second item data after outputting the number of zeros indicated by the first item data, and in decoding the second code, the decoded data is outputted by outputting zeros until the output data counter indicates a predetermined value.

According to a fourth aspect, the variable length code processor of the third aspect further comprises a third storage section for storing a decoded data effective area information, thereby the variable length decoding section writes the decoded data effective area information indicating an effective area of the decoded data, to the third storage section, when the decoded data outputs a value other than zero.

According to a fifth aspect, the variable length code processor of the third aspect further comprises a third storage section for storing a decoded data effective bit termination information, thereby the variable length decoding section writes the decoded data effective bit termination information indicating a value of the output data counter, to the third storage section, when decoding the second code to output the decoded data.

According to a sixth aspect, the variable length code processor of the first aspect is characterized in that the variable length code processing execution section includes a variable length encoding section that performs an encoding process for performing a variable length encoding of data to be encoded which is provided from outside.

According to a seventh aspect, the variable length code processor of the sixth aspect is characterized in that the variable length encoding section has a two-dimensional encoding section that performs a two-dimensional encoding of the data to be encoded, to generate a two-dimensional code consisting of first and second item data, and a variable length code generating section that performs a variable length encoding of the two-dimensional code to generate a variable length code. This processor further comprises a variable length encoding coupler for coupling the variable length code, characterized in that the two-dimensional encoding section has a zero counter that always counts the number of continuous zeros of data within the data to be encoded which is provided continuously, so that when provided data having a value other than zero, the two-dimensional code is generated, a value of the zero counter is provided to the first item data, and the value other than zero is provided to the second item data; and the two-dimensional encoding section further provides, upon detection of termination of the data to be encoded, a termination signal indicating its content to the variable length code generating section, so that the variable length code generating section receives the termination signal and generates a variable length code for termination indication that indicates a breakpoint of information.

According to an eighth aspect, the variable length code processor of the sixth aspect is characterized in that the variable length encoding section that performs a variable length encoding of data to be encoded which is subsequently provided from outside, to generate a variable length code; the variable length code processor further includes a variable length code coupling section that obtains a coupled variable length code by subsequently coupling a candidate for coupling, the candidate for coupling being the variable length code to be subsequently generated from the variable length encoding section, to output the coupled variable length code having a first bit size as a coupled variable length code; and the variable length code coupling section can output the coupled variable length code having the first bit size by handling an external code to be subsequently provided from outside, as the candidate for coupling.

According to a ninth aspect, the variable length code processor of the first aspect is characterized in that the variable length code processing execution section has a variable length decoding section that performs a decoding process for decoding a variable length code to be provided from outside, and a variable length encoding section that performs an encoding process for executing a variable length encoding of data to be encoded which is provided from outside; and the second storage section stores a process content information indicating whether a variable length code processing content is the encoding process or the decoding process. This processor further comprises an address generating section that generates an address for reading from and writing to the first storage section, based on the encoding standard information and the process content information, and a variable length code temporally holding section that, when the process content information indicates the decoding process, temporarily holds the variable length code provided from outside and then transfers it to the variable length decoding section, and, when the process content information indicates the encoding process, temporally holds a variable length encoded code after being subjected to an encoding process in the variable length encoding section, and then transfers it outside. Therefore, this processor is characterized in that the variable length encoding section accesses the first storage section based on an address generated in the address generating section, when the process content information indicates the encoding process, thereby performing the encoding process; and the variable length decoding section accesses the first storage section based on an address generated in the address generating section, when the process content information indicates the decoding process, thereby performing the decoding process. [203]In the variable length code processor of the first aspect, the first storage section can store a variable length code process information that serves as a reference information in performing a variable length code process according to the encoding standard of a variable length code to be processed, the second storage section can store an encoding standard information that specifies the encoding standard of a variable length code to be processed, and the variable length code processing execution section executes a variable length code process by referring to the encoding standard information and variable length code process information.

Therefore, a variable length code process in accordance with the desired encoding standard from among a plurality of encoding standards can be performed by writing a variable length code process information residing on the first storage section and an encoding standard information residing on the second storage section, in accordance with the encoding standard of a variable length code to be processed.

In the variable length code processor of the second aspect, the variable length code processing execution section includes the variable length decoding section that performs a decoding process for decoding a variable length code to be provided from outside. This enables to perform a decoding process in accordance with the desired encoding standard from among a plurality of encoding standards.

In the variable length code processor of the third aspect, the variable length decoding section outputs the number of zeros specified by a first item data and then a value specified by a second item data when decoding a first code that is obtained by executing a variable length encoding of a two-dimensional code, and outputs zeros until the output data counter indicates a predetermined value when decoding a second code indicating the boundary of a variable length code, thereby outputting a decoded data. This allows the variable length decoding section to perform a decoding process with respect to the first and second codes having the characteristics as described.

In the variable length code processor of the fourth aspect, when a decoded data outputs a value other than zero, the variable length decoding section writes the decoded effective area information indicating the effective area of the decoded data, to a third storage section.

Therefore, a predetermined process to a decoded data can be performed at high efficiency by handling only the effective area of the decoded data as a processing object, based on the information about the effective area of the decoded data.

In the variable length code processor of the fifth aspect, when a second code is decoded to output a decoded data, the variable length decoding section writes a decoded data effective bit termination information that indicates a value of the output data counter, to a third storage section.

Therefore, a predetermined process to a decoded data can be performed at high efficiency by ignoring the data bits of the decoded data which are positioned after the bit indicated by the decoded data effective bit termination information.

In the variable length code processor of the sixth aspect, the variable length code processing execution section includes the variable length encoding section that performs a variable length encoding process for performing a variable length encoding of data to be encoded which is provided from outside. This enables to perform a variable length encoding process in accordance with the desired encoding standard from among a plurality of encoding standards.

In the variable length code processor of the seventh aspect, the variable length encoding section has the two-dimensional encoding section in which a two-dimensional encoding of data to be encoded is performed to generate a two-dimensional code consisting of first and second item data, and the variable length code generating section in which a variable length encoding of the two-dimensional code is performed to generate a variable length code. Thus, it is possible to obtain a variable length encoded variable length code after performing the two-dimensional encoding of data to be encoded.

In the variable length code processor of the eighth aspect, the variable length code coupling section can output a coupled variable length code of a first size by handling external codes to be sequentially provided from outside, as a coupling object. Therefore, the function of the variable length code coupling section can be utilized from outside of the variable length code processor.

In the variable length code processor of the ninth aspect, when a process content information indicates an encoding process, the variable length encoding section accesses the first storage section based on an address to be generated in the address generating section, thereby performing the encoding process. When a process content information indicates a decoding process, the variable length decoding section accesses the first storage section based on an address to be generated in the address generating section, thereby performing the decoding process.

Therefore, it is possible to perform a decoding process or variable length encoding process in accordance with the desired encoding standard from among a plurality of encoding standards, by writing a variable length code process information residing on the first storage section and an encoding standard information and process content information residing on the second storage section, in accordance with the encoding standard and the processing content of a variable length code to be processed.

It is arranged such that the address generating section and variable length code holding section are shared between the variable length encoding section and variable length decoding section, thus leading to a simpler hardware configuration.

To solve the above problem, an object of the present invention is to provide a variable length code processor that can perform encoding or decoding process in a plurality of variable length encoding standards, alternatively, a variable length code processor that can perform both encoding and decoding processes with a simplified hardware configuration.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a block diagram of the internal configuration of a shifter section in FIG. 2;

FIG. 21 is a diagram showing a list of decoding tables used in a VLC decoding process of MPEG2;

FIG. 22 is a diagram showing an encoding standard that is applied to the initial variable length code in a block layer using Table-B14 in MPEG2;

FIG. 23 is another diagram showing an encoding standard that is applied to the initial variable length code in a block layer using Table-B14 in MPEG2;

FIG. 24 is a diagram showing the encoding standard that is applied to the second and later variable length codes in the block layer using Table-B14 in MPEG2;

FIG. 25 is another diagram showing the encoding standard that is applied to the second and later variable length codes in the block layer using Table-B14 in MPEG2;

FIG. 26 is a diagram showing an encoding standard that is applied to the second and later variable length codes in a block layer using Table-B15 in MPEG2;

FIG. 27 is another diagram showing the encoding standard that is applied to the second and later variable length codes in the block layer using Table-B15 in MPEG2;

FIG. 28 is a diagram showing the contents described in table B14-1-1 used in a VLC decoding of MPEG2;

FIG. 29 is a diagram showing the contents described in table B14-2-2 used in a VLC decoding of MPEG2;

FIG. 30 is a diagram showing a list of decoding tables used in a VLC decoding process of DVC;

FIG. 31 is a diagram showing an encoding standard applied to a block layer of DVC;

FIG. 32 is another diagram showing the encoding standard applied to the block layer of DVC;

FIG. 33 is another diagram showing the encoding standard applied to the block layer of DVC;

FIG. 34 is another diagram showing the encoding standard applied to the block layer of DVC;

FIG. 35 is another diagram showing the encoding standard applied to the block layer of DVC;

FIG. 36 is another diagram showing the encoding standard applied to the block layer of DVC;

FIG. 41 is a diagram showing a list of tables used in a VLC encoding process of MPEG2;

FIG. 42 is a diagram showing the contents of tables used in an offset retrieval that is one of the table retrievals needed in a VLC encoding process of MPEG2, by taking table name OFS_14A, an example;

FIG. 43 is a diagram showing the contents of table ESC_MPEG used in an escape retrieval that is one of the table retrievals needed in a VLC encoding process of MPEG2;

FIG. 44 is a diagram showing the content of table used in a RUN retrieval that is one of the table retrievals needed in a VLC encoding process of MPEG2, by taking table name RUN_03B14, an example;

FIG. 45 is a diagram showing a list of tables used in a VLC encoding process of DVC;

FIG. 46 is a diagram showing the contents of table OFS_DVC used in offset retrieval that is one of the table retrievals needed in a VLC encoding process of DVC;

FIG. 47 is a diagram showing the contents of table ESC_DVC used in an escape retrieval that is one of the table retrievals needed in a VLC encoding process of DVC;

FIG. 48 is a diagram showing the contents of table RUN_00DVC used in a RUN retrieval that is one of the table retrievals needed in a VLC encoding process of DVC;

FIG. 49 is a diagram showing the contents of table RUN_03DVC used in a RUN retrieval that is one of the table retrievals needed in a VLC encoding process of DVC; and FIG. 50 is a diagram showing the contents of table RUN_13DVC used in a RUN retrieval that is one of the table retrievals needed in a VLC encoding process of DVC.

DESCRIPTION OF THE PREFERRED EMBODIMENTS (A) System Configuration Using VLC Processor In explaining the configuration and operation of a VLC (Variable Length Code) processor according to one preferred embodiment of the present invention, description will be now given of a system that employs a VLC processor. FIG. 1 is a block diagram showing the configuration of a system having a VLC processor.

Figure 1:
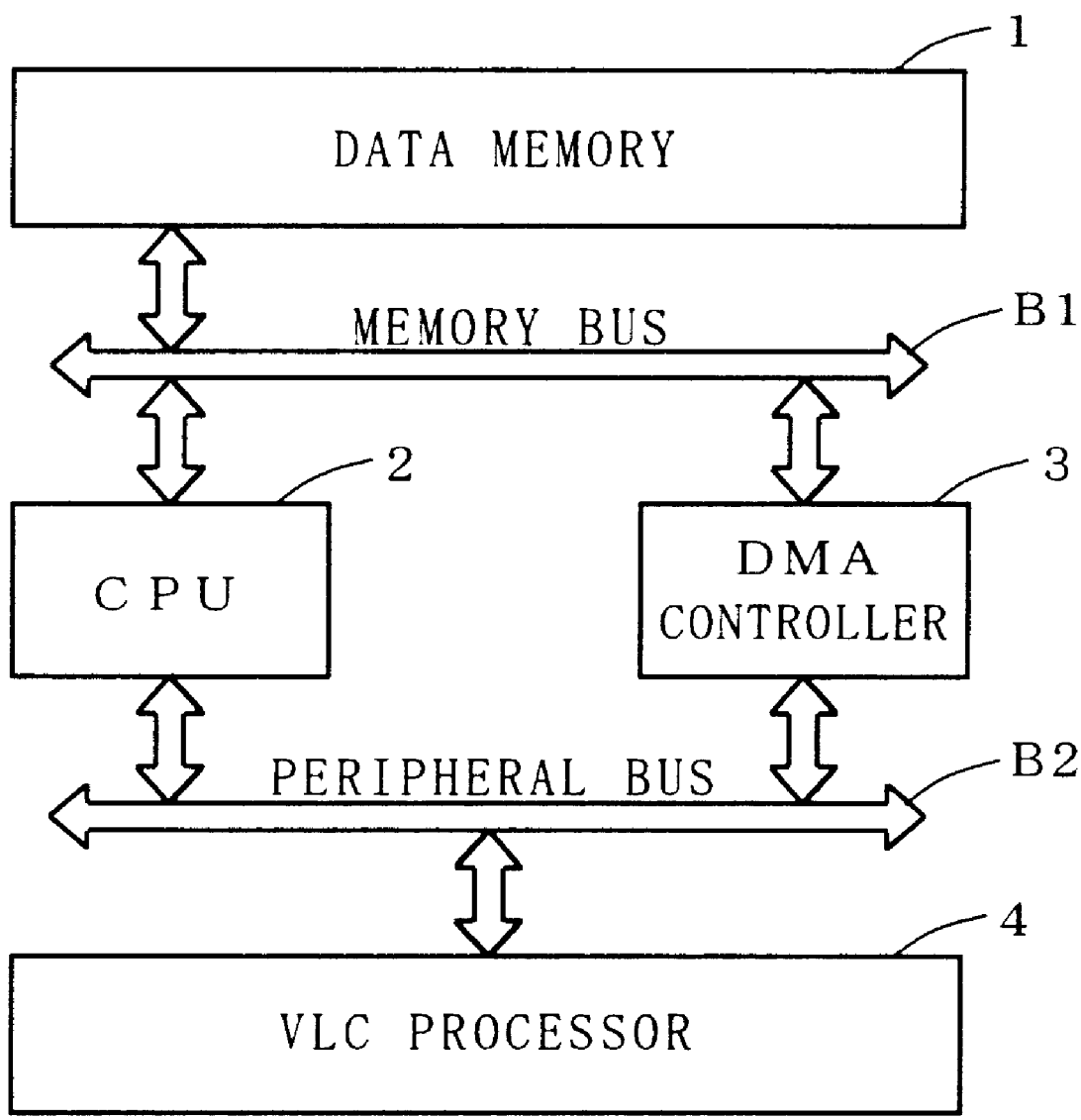
FIG. 1 is a block diagram of a system configuration using a VLC processor according to one preferred embodiment of the present invention.

This system has a data memory 1, a CPU 2 and a DMA controller 3, in addition to the VLC processor according to one preferred embodiment of the present invention. Through a memory bus B1, signals can be given to and received from among the data memory 1, the CPU 2, and the DMA controller 3. Through a peripheral bus B2, signals can be given to or received from among the CPU 2, the DMA controller 3, and a VLC processor 4.

Therefore, the CPU 2 can access the data memory 1 through the memory bus B1, and access the VLC processor 4 through the peripheral bus B2. These accesses are executed by a load store instruction. Upon receipt of a request from the VLC processor 4, the DMA controller 3 performs a DMA transfer between the data memory 1 and the VLC processor 4. During a DMA transfer, the memory bus B1 and the peripheral bus B2 are both used. To execute the DMA transfer, it becomes necessary that the right to use the buses B1 and B2 is granted from the CPU 2. Upon receipt of a DMA request from the VLC processor 4, the DMA controller 3 arbitrates the right to use these buses with the CPU 2 and, after the acquisition of the right, instructs the VLC processor 4 to initiate the DMA transfer.

In this system the VLC processor 4 performs processing according to the instruction of the CPU 2. The data stored in the data memory 1 is provided as a data input of the VLC processor 4, and a processing result obtained with the VLC processor 4 is stored in the data memory 1. That is, the VLC processor 4 performs processing after transferring the data residing on the data memory 1 to its own block by DMA transfer, and writes the processing result to the data memory 1 by DMA transfer, thereby completing the process.

The CPU 2 specifies the location of an input data and the location to which a processing result is written, before instructing the VLC processor 4 to perform processing. This is specified by designating an address on the data memory 1.

Functional blocks other than the VLC processor 4 are, of course, connected to the peripheral bus 2. To realize the system-wide target function, various functional blocks are required. For instance, there are needed a video output unit and an audio output unit, alternatively, a data input unit. However, they will not be considered here because their operations do not relate directly to the description of the present invention.

(B) Functions of VLC Processor

A VLC processor 4 performs VLC decoding and VLC encoding processes.

In the VLC decoding process, a variable length coded data that belongs to a block layer of MPEG2 or the like, is decoded to obtain a two-dimensional data (RUN and LEVEL) and then expanded to a one-dimensional data. The data that is decoded by and finally outputted from the VLC processor 4 is composed of 64 DCT factors which are assigned with a 16-bit signed integer. The top bit position of a variable length coded data that becomes a candidate for decoding needs not be aligned on any data boundaries. A similar process can be performed for the data that belongs to a block layer of MPEG1 or DVC, in addition to MPEG2. In an intrablock of MPEG1 or MPEG2, however, no variable length decoding is performed only for the top-located data in a block layer.

In the VLC encoding process, the 64 DCT factors are encoded into a two-dimensional data consisting of RUN and LEVEL, followed by a variable length encoding. The data generated by the variable length encoding are coupled together without any seams, in the VLC processor 4. The VLC processor 4 cuts and outputs such data every predetermined data boundary (eight bits). The remainder of the data are held within the VLC processor 4. A combination of the seamless coupling of a variable length data and the cutting every predetermined data boundary is referred to as a pack process. The pack process is operable independently of a VLC encoding process. That is, it is able to perform a pack process by which the variable length encoded data generated outside of the VLC processor 4 is mixed with the that generated by the VLC processor 4. The data formats that become candidates for a VLC encoding process are MPEG2 and DVC. In a decoding process, no variable length encoding is performed for the initial DCT factor in an intrablock of MPEG2.

On the other hand, in the case of a DVC format, the name of data that belongs to a block data is different from that of MPEG1 or MPEG2. However, what its name implies is the same. Accordingly, description of DVC will be made hereafter by using RUN and LEVEL, as in MPEG1 or MPEG2.

(C) Configuration of VLC Processor

Figure 2:
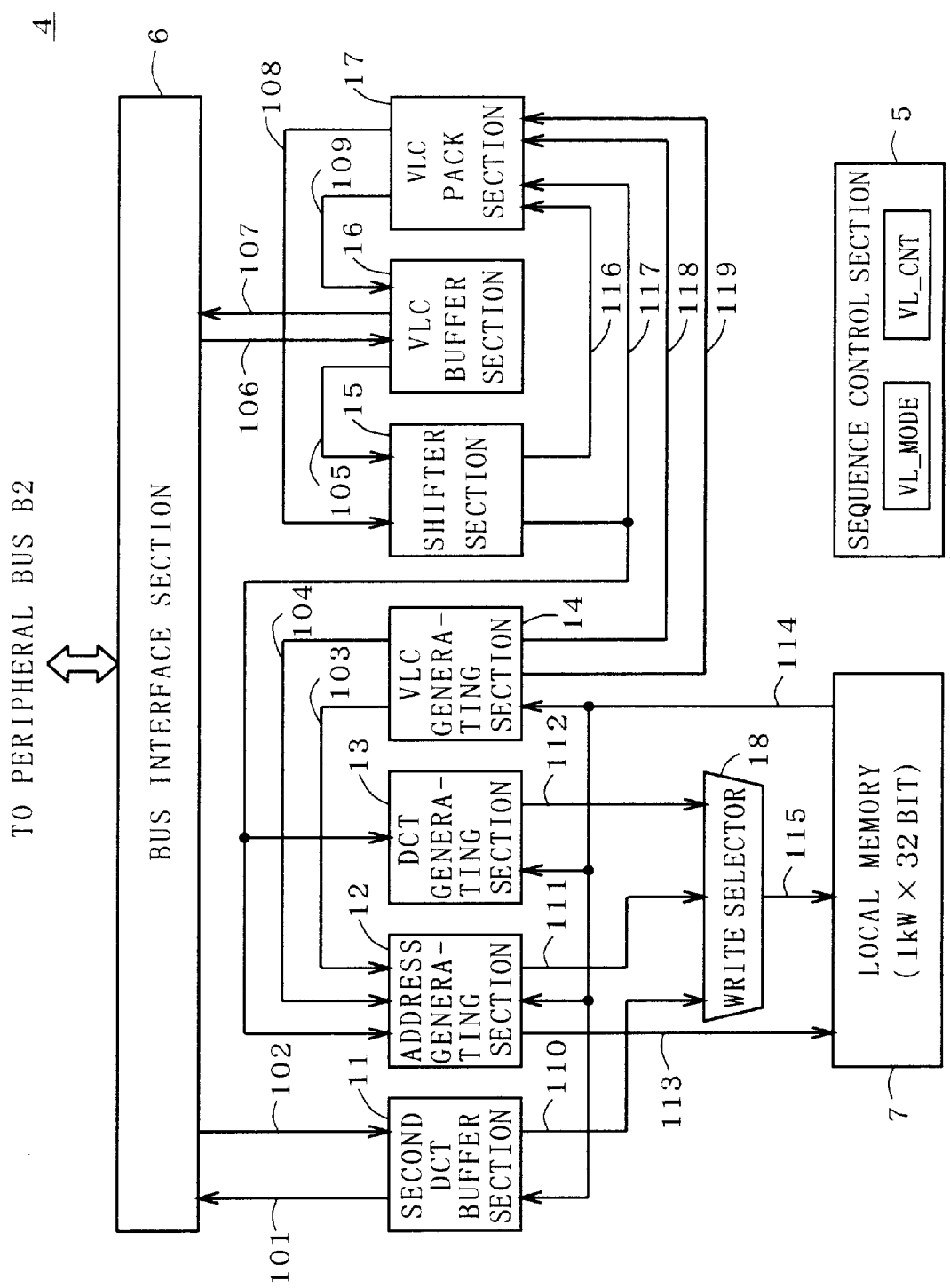
FIG. 2 is a block diagram of the configuration of the above VLC processor.

FIG. 2 is a block diagram showing the internal configuration of a VLC processor 4. The VLC processor 4 has ten functional blocks which consists of a sequence control section 5, a bus interface section 6, a local memory 7 (first storage section), a second DCT buffer 11, an address generating section 12, a DCT generating section 13, a VLC generating section 14, a shifter section 15, a VLC buffer section 16, and a VLC pack section 17; and a write selector 18 that selects data to be written to the local memory 7. The configuration and operation of each functional block will be described herebelow.

Sequence Control Section

A sequence control section 5 controls the overall operation of a VLC processor 4, based on a predetermined process sequence for VLC decoding process or VLC encoding process, and the judgement results of the respective functional blocks. These functional blocks operate based on control signals from the sequence control section 5, and they provide a variety of judgement results to the sequence control section 5, according to the data processed in their respective blocks. To avoid that FIG. 2 becomes complicated, the above control signals and judgement results are not shown in the figure.

The sequence control section 5 has two control registers VL_MODE and VL_CNT as second and third storage sections, respectively. A CPU 2 selects a processing content to be performed by a VLC processor 4 by setting the desired value to the control register VL_MODE. Listed below are of the processing contents in the VLC processor 4 which are selectable depending on a setting value of the control register VL_MODE:

VLC decoding process of MPEG1;

VLC decoding process of MPEG2;

VLC decoding process of DVC;

VLC encoding process of MPEG2; and

VLC encoding process of DVC.

The sequence control section 5 controls a second DCT buffer section 11, an address generating section 12, a DCT generating section 13, a VLC generating section 14, a shifter section 15, a VLC buffer section 16 and a VLC pack section 17, so that the process indicated by the control register VL_MODE is executable.

The control register VL_CNT has a process start bit by which the operation of the VLC processor 4 is started. The VLC processor 4 starts the process selected by the control register VL_MODE when the process start bit is set, and clears this bit when all the process is terminated. The CPU 2 detects a process termination in the VLC processor 4 by monitoring the values of the control register VL_CNT.

The control register VL_CNT has a block attribute specification bit and an error indication bit, in addition to the process start bit. The block attribute specification bit is effective only when a storage value of the control register VL_MODE indicates a decoding or encoding of MPEG1 or MPEG2. The block attribute bit indicates whether a block layer data to be processed is a non intrablock or intrablock and, if it is an intrablock, indicates which encoding table is to be used.

Encoding tables to be selected herein are specified in B14 and B15 of the standard (ISO/IEC 13818-2) on the basis of the recommendation with respect to MPEG (ITU-T H.262), issued by ITU (International Telecommunication Union). Table B15 is used for MPEG2. In performing a VLC decoding of MPEG1, the decoding table for B14 is always used.

The error indication bit indicates that an error occurs during processing. When an error is detected during a VLC encoding or VLC decoding, the VLC processor 4 sets an error indication bit at the same time the process is terminated (at the same time the process start bit is cleared). If given a variable length data for which any decoding process is not executable, an error indication bit is set. An error indication bit is also set if given a code (EOB) indicating the termination of a block, despite that 64 DCT factors are obtained.

Additionally, the control register VL_CNT stores an entry effective field and an EOB pointer field. The entry effective field indicates where in the DCT factors obtained by VLC decoding an effective data is stored. The entry effective field consists of four bits. Specifically, 64 DCT factors fall into four groups of 16, and the top bit corresponds to the first group; the second bit to the second group; the third bit to the third group; and the fourth bit to the last group, respectively. If a VLC decoding result is that only the top bit of an entry effective field is set, the effective data exists in only 16 factors of the first group among the generated DCT factors, and the remaining 48 factors are all zeros (although if an error occurs, it is the maximum negative value, this can be identified by an error indication bit.).

Therefore, when the CPU 2 performs the process for DCT factors, it is able to skip the process for unnecessary 48 data. The EOB pointer field also indicates which DCT factor is the last effective data, namely, indicates that all the subsequent DCT factors are zeros. Like the entry effective bit field, the EOB pointer field is effective information in order that the CPU skips unnecessary processing. After the respective functional block configurations are described, there will be described what process is performed in each process.

Bus Interface Section

A bus interface section 6 is a block for controlling the interface with a peripheral bus B2. Data transfers between a peripheral bus 2 and every functional function block is performed through the bus interface section 6. The data bit width of the peripheral bus B2 is 64 bits. The above data transfers are classified into two kinds, i.e., CPU 2-initiated load store instruction, and DMA transfers requested by a VLC processor 4. The interface process with the CPU 2 when a load store instruction is issued, and the interface process with a DMA controller 3 when a DMA is transferred, are entirely performed by the bus interface section. The following DMA transfers are performed by the VLC processor 4.

(i) VLC Input DMA

A VLC input DMA is performed in a VLC decoding process by which a variable length data to be decoded is transferred to a VLC buffer section 16. Two words are transferred per DMA process, and one word is 64 bits. Accordingly, a 16-byte data is transferred per DMA transfer. A DMA start address employs a value of an address register VL_STRAP of the bus interface section 6 and "16" is added when a DMA transfer is terminated. The CPU 2 can set a value to the address register VL_STRAP by a store instruction. Here, the setting value should be aligned on an 8-byte data boundary.

(ii) DCT Output DMA

A DCT output DMA is performed in a VLC decoding process by which the decoded DCT factors stored on a local memory 7 are transferred to a data memory 1. A second DCT buffer section 11 is used for absorbing a difference between the access speed of the local memory 7 and an access speed required in a DMA transfer. There are transferred 16 words per DMA transfer, and one word is 32 bits. Accordingly, a 64-byte data is transferred per DMA transfer. A DMA start address employs a value (a storage value) of an address register VL_DCTAP of a bus interface section 6, and "64" is added when a DMA transfer is terminated. The CPU 2 can set a value to the address register VL_DCTAP by a store instruction. Here, the setting value should be aligned on an 8-byte data boundary.

(iii) DCT Input DMA

A DCT input DMA is performed in a VLC encoding process by which the decoded DCT factors to be encoded residing on a data memory 1 are transferred to a local memory 7. A second DCT buffer section 11 is used for absorbing a difference between the access speed of the local memory 7 and an access speed required in a DMA transfer. There are transferred 16 words per DMA transfer, and one word is 32 bits. Accordingly, a 64-byte data is transferred per DMA transfer. A DMA start address employs a value of an address register VL__DCTAP of a bus interface section 6, and "64" is added when a DMA transfer is terminated. The CPU 2 can set a value to the address register VL__DCTAP by a store instruction. Here, the setting value should be aligned on an 8-byte data boundary.

(iv) VLC Output DMA

A VLC output DMA is performed in a VLC encoding process by which a packed VLC 109 stored in a VLC buffer section 16 is transferred to a data memory 1 under control of a CPU 2. There are transferred one word per DMA transfer, and one word is 64 bits. Accordingly, an 8-byte data is transferred per DMA transfer. A DMA start address employs a value of an address register VL__STRAP of a bus interface section 6, and "8" is added when a DMA transfer is terminated. The CPU 2 can set a value to the address register VL__STRAP by a store instruction. Here, the setting value should be aligned on an 8-byte data boundary.

The CPU 2 can access the following registers by a load store instruction. Since the processes therefore can be implemented very easily in a manner common to the art, detailed description is omitted here. Also, they are omitted in the drawings referred hereafter to avoid that the drawings will be complicated and thus makes it hard to understand.

- Control register VL__MODE (in a sequence control section 5)
- Control register VL__CNT (in the sequence control section 5)
- Control register VL__INTRA (in a DCT generating section 13)
- Address register VL__DCTAP (in a bus interface section 6)
- Address register VL__STRAP (in the bus interface section 6)
- Control register VL__STRBP (in a VLC buffer section 16)
- Control register VL__CBUFST (in the VLC buffer section 16)
- Data register VL__CBUF0 (in the VLC buffer section 16)
- Data register VL__CBUF1 (in the VLC buffer section 16)
- Data register VL__CBUF2 (in the VLC buffer section 16)
- Data register VL__CBUF3 (in the VLC buffer section 16)
- Control register VL__PCKDT (in a VLC pack section 17)
- Control register VL__PCKLN (in the VLC pack section 17)
- Control register VL__REMDH (in the VLC pack section 17)
- Control register VL__REMDL (in the VLC pack section 17)
- Control register VL__REMBP (in the VLC pack section 17)
- Data register VL__DBUF0 (in a second DCT buffer section 11)
- Data register VL__DBUF1 (in the second DCT buffer section 11)
- Data register VL__DBUF2 (in the second DCT buffer section 11)
- Data register VL__DBUF3 (in the second DCT buffer section 11)
- Control register VL__LMAR (in an address generating section 12)
- Data register VL__LMDR (in the address generating section 12)

Local Memory

A local memory 7 is implemented by a RAM of 4K bytes which stores retrieval tables to be used in decoding and encoding processes. The local memory 7 also serves as a first DCT buffer section that temporarily holds DCT factors (decoded DCT 112) generated by decoding and DCT factors to be encoded. The base unit of reading/writing is 32 bits. However, only DCT factor writing in a VLC decoding process is executed in units of 16 bits.

An address of the local memory 7 is provided from an address generating section 12. The address generating section 12 calls for one cycle every address generating process and the local memory 7 calls for one cycle every read/write process, thus the latency of access is two cycles. It is noted that an address generating cycle can be overlapped with a memory access cycle. That is, a one-cycle throughput is executable by pipelining.

Data to be written on the local memory 7 is selected by a write selector 18. Three data are provided to the write selector 18 and, under control of a sequence control section 5, one of the three data is outputted to the local memory 7 as a write data 115. A writing path from a second DCT buffer section 11 is used in a VLC encoding process. Through this writing path, DCT factors to be encoded which have been transferred to the second DCT buffer section 11 by DMA transfer, are stored on the local memory 7. A writing path from an address generating section 12 is used when a CPU 2 writes an arbitrary value at an arbitrary address on the local memory 7, e.g., when storing a retrieval table. A writing path from a DCT generating section 13 is used when DCT factors obtained by decoding in a VLC decoding process are stored on the local memory 7.

Data to be read from the local memory 7 is temporarily stored in a read data register on the local memory 7 and then outputted as a read data 114. This read register is updated every time data is read from the local memory 7.

Second DCT Buffer Section

A second DCT buffer section 11 absorbs a difference in the operation speed caused in a DMA transfer between a local memory 7 and a peripheral bus B2. Although the second DCT buffer section 11 has a smaller capacity than a local memory 7, it can perform reading/writing operation in one cycle. The buffer section 11 operates in both VLC encoding and VLC decoding processes.

A DMA transfer is required to respond in one cycle. For instance, in a DMA transfer of a DCT output process, it is necessary to output data from a VLC processor 4 to the peripheral bus B2 in the next cycle after a DMA controller 3 instructs a start of transfer.

The latency of the local memory 7 is, however, two cycles, thus being impossible to satisfy the above requirement if data is read directly from the local memory 7. A timing specification required can be satisfied by interposing the second DCT buffer section 11 between the local memory 7 and the peripheral bus B2. Before the start of transfer is instructed, it is started to read data from the local memory 7, and the read data is stored in the second DCT buffer section 11. When the start of DMA transfer is instructed, the data stored in the buffer section 11 can be outputted quickly. In a DMA transfer of a DCT input process, the basic functions are the same except that the flow of data is reversed. The data provided from the peripheral bus B2 is temporarily stored in the second DCT buffer section 11 and then written to the local memory 7.

Figure 3:
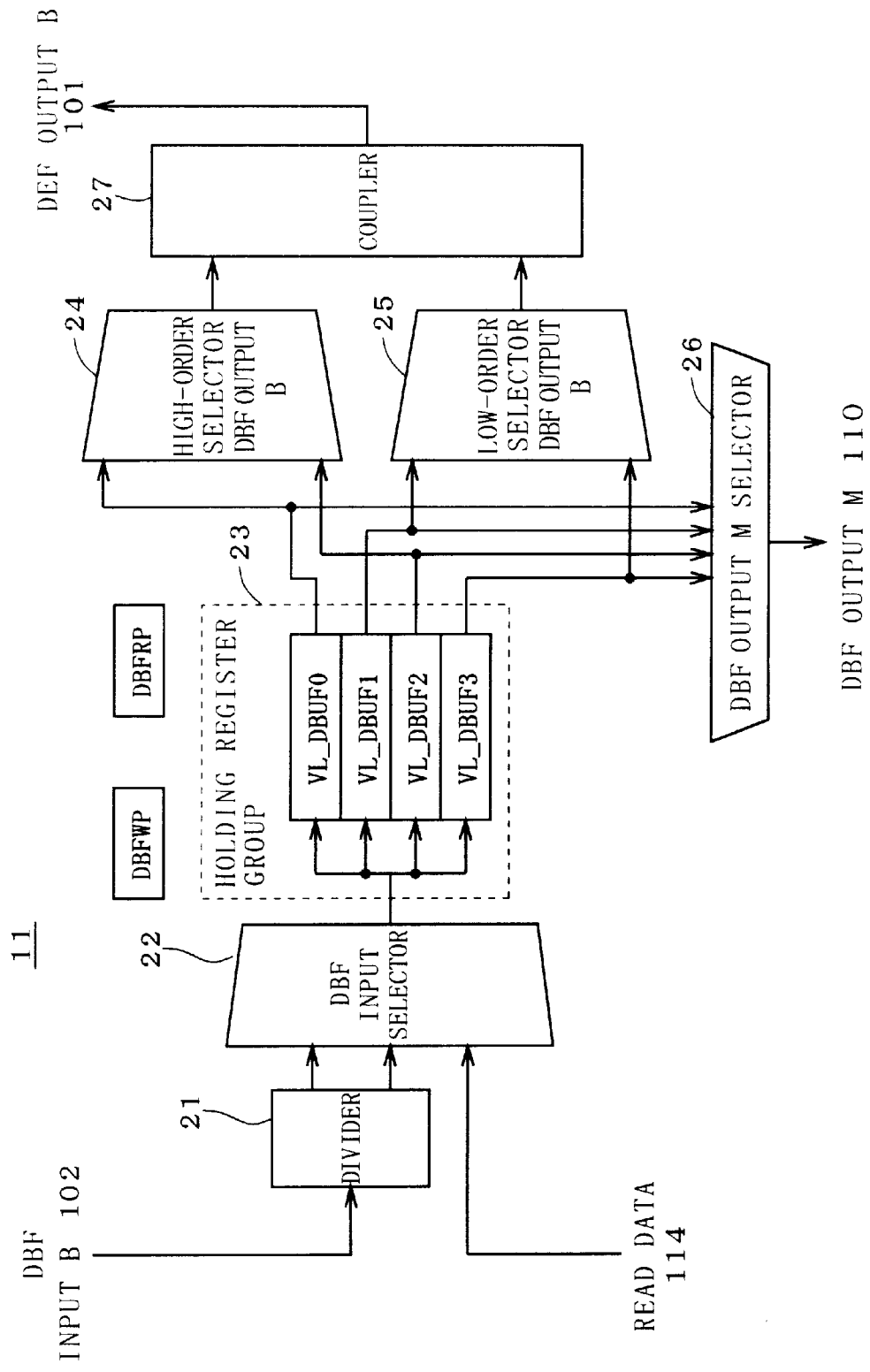
FIG. 3 is a block diagram of the internal configuration of a second DCT buffer section in FIG. 2.

FIG. 3 is a block diagram showing the internal configuration of a second DCT buffer section 11. Referring to FIG.

3, a holding register group 23 has four data holding registers (VL_DBUF0 to VL_DBUF3), and either a DMA input data (DBF input B 102) sent from a bus interface section 6 or data to be read from a local memory 7 (read data 114) is selected by a DBF input selector 22 and then written.

Each data holding register is of 32 bits whereas the DBF input B 102 is of 64 bits. Therefore, the DBF input B 102 is divided by a divider 21 into the high-order 32 bits and the low-order 32 bits, either of which is written. The selection of data to be written is performed by the DBF input selector 22. The selector 22 selects a read data 114 in a VLC decoding and selects a DBF input B 102 in a VLC encoding. In this case, the high-order or low-order of the DBF input B 102 is selected depending on the address at the time of DMA transfer. The data holding register that becomes a candidate for writing in the holding register group 23 is indicated by a write pointer DBFWP that is updated every time data is written to a data holding register.

The data read from a data holding register of the holding register group 23 is sent to the bus interface section 6 and then used in a DMA transfer, alternatively, written to the local memory 7. A candidate for writing is indicated by the read pointer DBFRP that is updated every time data is read from a data holding register.

A read-out path to the bus interface section 6 (DBF output B 101) is of 64 bits. The high-order 32 bits and the low-order 32 bits are selected by a different path (i.e., a DBF output B high-order selector 24 and a DBF output B low-order selector 25), coupled by a coupler 27 and then outputted. The data holding registers VL_DBUFi wherein i is an even number are connected to the DBF output B high-order selector 24, whereas the data holding registers VL_DBUFi wherein i is an odd number are connected to the DBF output B low-order selector 25. The data to be written to the local memory 7 (DBF output M 110) is selected by a DBF output M selector 26.

Address Generating Section

Figure 4:
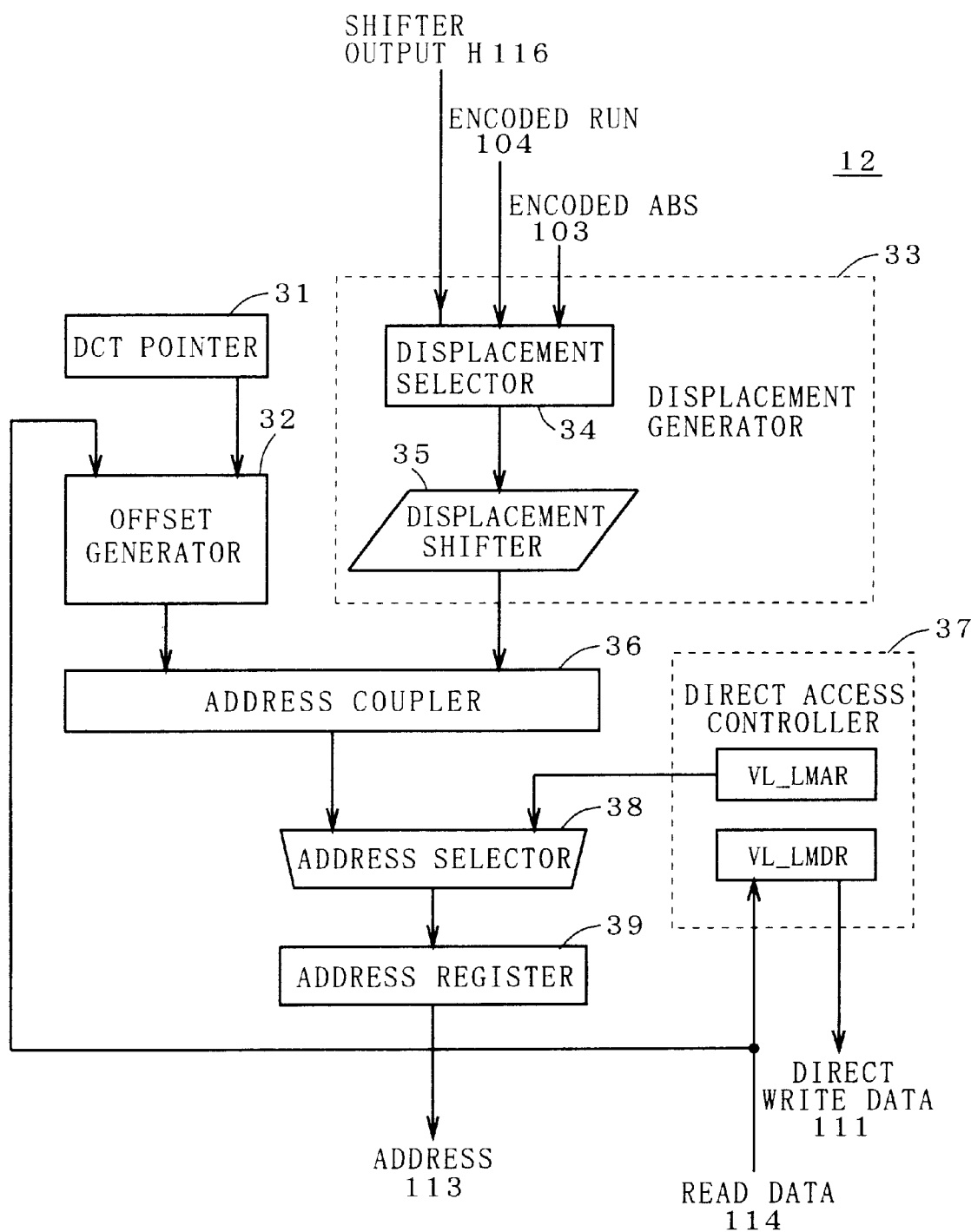
FIG. 4 is a block diagram of the internal configuration of an address generating section in FIG. 2.

An address generating section 12 generates an address to gain access to a local memory 7, and operates both in VLC encoding and VLC decoding processes. As shown in FIG. 4, the address generating section 12 is composed of a DCT pointer 31, an offset generator 32, a displacement generator 33 (consisting of a displacement selector 34 and a displacement shifter 35), an address coupler 36, a direct access controller 37, an address selector 38, and an address register 39.

The offset generator 32 generates offset addresses of retrieval tables and DCT factor buffer areas, in accordance with various accesses to a local memory 7, e.g., table retrievals and DCT factor accesses. The output of the DCT pointer 31 and part of the data read from the local memory 7 (a read data 114) are provided to the offset generator 32. From among the data read from the local memory 7, bit 2 to bit 11 are provided to the offset generator 32. These bits correspond to the OFFSET fields of a decoding retrieval result or offset retrievals as described later.

The offset generator 32 outputs one of the output of the DCT pointer 31, an OFFSET field, and a fixed value owned by the offset generator 32 itself, depending on the kind of an access. In order to comply with the encoding and decoding of MPEG1, MPEG2, and DVC formats, the offset generator 32 has fixed values with respect to the following nine accesses. Here, tables B14 and B15 correspond to Table-B14 and Table-B15 of ISO/IEC13818-2, respectively.

Table B14 DC factor decoding of MPEG½ block
Table B14 AC factor decoding of MPEG½ block
Table B15 AC factor decoding of MPEG½ block
DVC block decoding
Offset retrieval for table B14 DC factor encoding of MPEG2 block
Offset retrieval for table B14 AC factor encoding of MPEG2 block
Offset retrieval for table B15 AC factor encoding of MPEG2 block
Escape retrieval of MPEG2 block encoding
Offset retrieval of DVC block encoding The displacement generator 33 generates a displacement address of a retrieval table according to the kind of a table retrieval. The displacement generator 33 includes the displacement selector 34 and the displacement shifter 35. A shifter output H 117 fed by a shifter section 15 and an encoded (object) RUN 104 and an encoded (object) ABS 103 which are fed by a VLC generating section 14, are being provided to the displacement selector 34. According to an access content, the displacement selector 34 selects one from among the above and outputs it as a displacement address. Here, the shifter output H 117 includes the left-adjusted VLC as a candidate for decoding.

In the case where the shifter output H 117 is selected by the displacement selector 34, there are further four alternatives, and a displacement address is selected from among bit [00:07], bit [04:11], bit [08:15] and bit [12:19] fields of the shifter output H. A BSEL field (not shown in FIG. 4) in a decoding retrieval described later is a control code that designates one of the four fields, and it is provided to the displacement selector 34.

The displacement shifter 35 performs the right logical shift of the output of the displacement selector 34, in a shift amount of 0, 1, 2, or 3. A SHF field (not shown in FIG. 4) in a decoding retrieval described later designates such a shift amount, and it is provided to the displacement shifter 35. In a decoding retrieval, a combination of the displacement selector 34 and the displacement shifter 35 enables to cut arbitrary eight bits from the high-order 20 bits of a VLC to be decoded.

The address coupler 36 generates addresses for retrieval tables or DCT factor buffer accesses by coupling an offset address from the offset generator 32 and a displacement address from the displacement generator 33. This process can be easily implemented by adding both addresses. Unfortunately, since an adder is subject to the disadvantages in area and operation speed, a method using a selector is adopted here. That is, an offset address is applied to the high-order side of an address to be outputted, while a displacement address is applied to the low-order side. Let a displacement address that can be generated in an access have a maximum value of $2^N$, a displacement address is applied to the low-order N-bit and an offset address is applied to the remaining bits. In this case, it is essential to select so that the offset address be $\{M \times 2^N\}$ wherein N and M are both natural numbers.

A BTSEL field obtained by decoding retrieval or offset retrieval as described later is a control code of the address coupler 36, and it determines what bit of a displacement address is to be outputted. An offset address is always applied to the high-order two bits of an address. The low-order eight bits correspond to the respective bits of the BTSEL, and a displacement address is applied to the bit to which a one is set in the BTSEL. For BTSEL=8'b11111111, the high-order two bits of an address become an offset address and the low-order eight bits become a displacement address. For BTSEL=8'b00001111, the high-order six bits of an address become an offset address and the low-order eight bits become a displacement address.

A DCT pointer 31 is an address pointer by which DCT factors are inputted in or outputted from a DCT buffer area residing on the local memory 7. The DCT pointer 31 is subjected to a post-increment process in both the writing and reading of DCT factors. An increment value is changed depending on the size of an access (16-bit access or 32 -bit access). The DCT address generated by the DCT pointer 31 is provided to the offset generator 32. When the offset generator 32 selects the DCT pointer 31, an offset address is obtained by adding an offset address of a DCT buffer area to the output of the DCT pointer 31. The offset address of a DCT buffer area is being embedded within the offset generator 32, as a fixed value.

The direct access controller 37 is used when the CPU 2 accesses an arbitrary address on the local memory 7, e.g. when writing a retrieval table. The direct access controller 37 includes a direct address register VL__LMAR and a direct data register VL__LMDR. The former register includes a bit that specifies a write or read process to the local memory 7. Both registers are accessible to each other by a load store instruction. When the CPU 2 executes a store instruction to the direct address register VL__LMAR, an access process to the local memory 7 is activated. In this case, the value of the direct address register VL__LMAR becomes the access address to the local memory 7. If data is read from the local memory 7, the read data is directly stored in the data register VL__LMDR. If data is written to the local memory 7, the content of the direct data register VL__LMDR is written to the local memory 7 as a direct write data 111.

The address register 39 temporarily stores an address 113 selected by the address selector 38. The address selector 38 selects the direct access controller 37 when the store instruction to the direct address register VL__LMAR is executed, and selects the address coupler 36 in other instances.

DCT Generating Section

Figure 5:
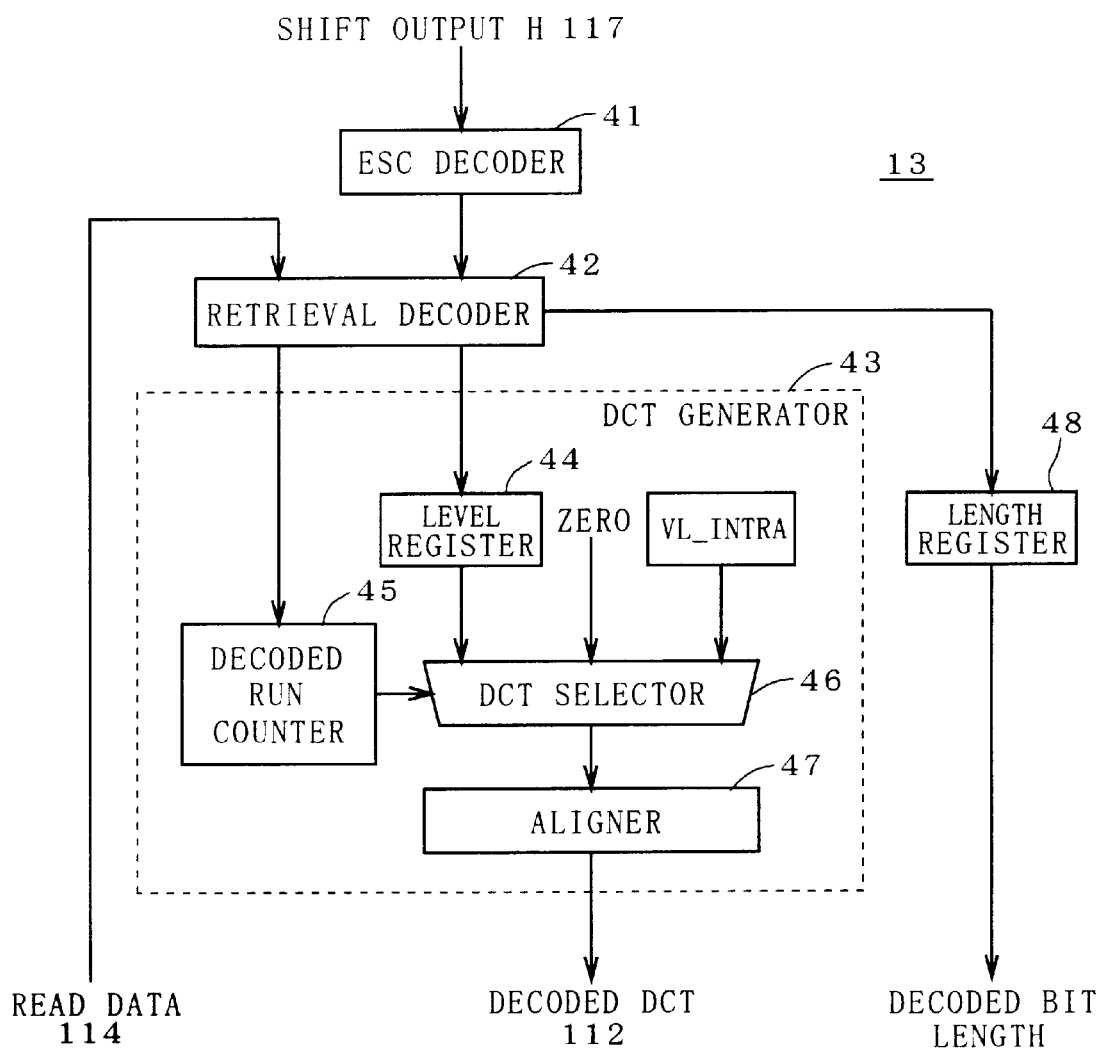
FIG. 5 is a block diagram of the internal configuration of a DCT generating section in FIG. 2.

A DCT generating section 13 decodes a single variable length coded data, based on the data sent from a shifter section 15 and a retrieval result of a decoding table on a local memory 7. As shown in FIG. 5, the DCT generating section 13 is composed of an ESC decoder 41, a retrieval decoder 42, a DCT generator 43 and a LENGTH register 48, and it operates only in a VLC decoding process.

To the ESC decoder 41, a shifter output H 117 sent from the shifter section 15 is provided which includes the left-adjusted variable length data that becomes a candidate for decoding. Based on this data and the encoding standard defined in ESCAPE codes of MPEG1 or MPEG2, the ESC decoder 41 generates the bit lengths (ESC__LENGTH) of a ESC__RUN, a ESC__LEVEL and a decoded variable length data. These processes are implemented by a complete hard-wired logic to generate as follows. The generated values are provided to the retrieval decoder 42.

(a) MPEG2 decoding:

ESC__RUN—Bit [6:11] of a shifter output H;

ESC__LEVEL—Bit [12:23] of the shifter output H; and

ESC__LENGTH—24 bits (b) MPEG1 decoding (b-1) When bit [13:19] of a shifter output H are all zeros:
ESC__RUN—Bit [6:11] of the shifter output H;
ESC__LEVEL—Sign extension of bit [20:27] of the shifter output H by bit [12];

and

ESC__LENGTH—28 bits (b-2) When bit [13:19] of a shifter output H are not all zeros:

ESC__RUN—Bit [6:11] of the shifter output H;

ESC__LEVEL—Sign extension of bit [12:19] of the shifter output H by bit [12];

and

ESC__LENGTH—20 bits

The retrieval decoder 42 is being provided with a decoding table retrieval result included in a read data 114 that has been read from the local memory 7. Based on the decoding table retrieval result, the retrieval decoder 42 generates a decoding result of a variable length code. Data to be generated are a two-dimensional data consisting of RUN and LEVEL, and a code length LENGTH of a decoded variable length code. The generated RUN and LEVEL are sent to the DCT generator 43. The LENGTH is stored in the LENGTH register 48 and then sent to the VLC buffer section 16 as a decoded bit length.

The DCT generator 43 expands the two-dimensional data generated by the retrieval decoder 42 to a one-dimensional data, thereby generates a predetermined number of DCT factors (decoded DCF 112). The DCT factors are represented by a 16 -bit signed integer and they are stored in the local memory 7. Upon receipt of a two-dimensional data consisting RUN and LEVEL, the DCT generator 43 generates (RUN+1) DCT factors. Only the last one of the generated DCT factors has a value, and the rest are all zeros. When a retrieval result indicates EOB, all the remaining DCT factors of the corresponding block are set to zeros. When a retrieval result indicates an error, all the remaining DCT factors of the corresponding block are set to the maximum negative value. The DCT factors after being processed in the corresponding block indicate a value of the DCT pointer 31.

Of the data sent from the retrieval decoder 42, RUN is set to a decoded RUN counter 45 and LEVEL is set to a LEVEL register 44. When the value of the decoded RUN counter 45 is zero, the DCT selector 46 selects the value stored in the LEVEL register 44, and it selects zero in other instances. The decoded RUN counter 45 is decremented every time a DCT factor is outputted. In decoding the initial variable length code of an INTRA block in MPEG1 or MPEG2, however, the DCT selector 46 selects the value stored in the control register VL__INTRA, irrespective of the value of the decoded RUN counter 45. The value of the control register VL__INTRA can be set from a CPU 2. When a retrieval result indicates an error, the DCT selector 46 outputs the maximum negative value as an exception (this path is not shown in FIG. 5). The output of the DCT selector 46 is 16 bits, and the data width of the local memory 7 is 32 bits. Therefore, it is necessary that the generated DCT factors have been appropriately aligned to the high-order or low-order of data to be written to the local memory 7.

In FIG. 5, an aligner 47 receives the output of the DCT selector 46 to perform the above-mentioned alignment. It is judged by the value of the DCT pointer 31 (not shown in FIG. 5) as to whether the generated DCT factors is to aligned to the high-order or low-order of a write data.

The DCT generator 43 has a function of judging as to whether the data selected by the DCT selector 46 is zero or the maximum negative value (not shown in FIG. 5).

VLC Generating Section

Figure 6:
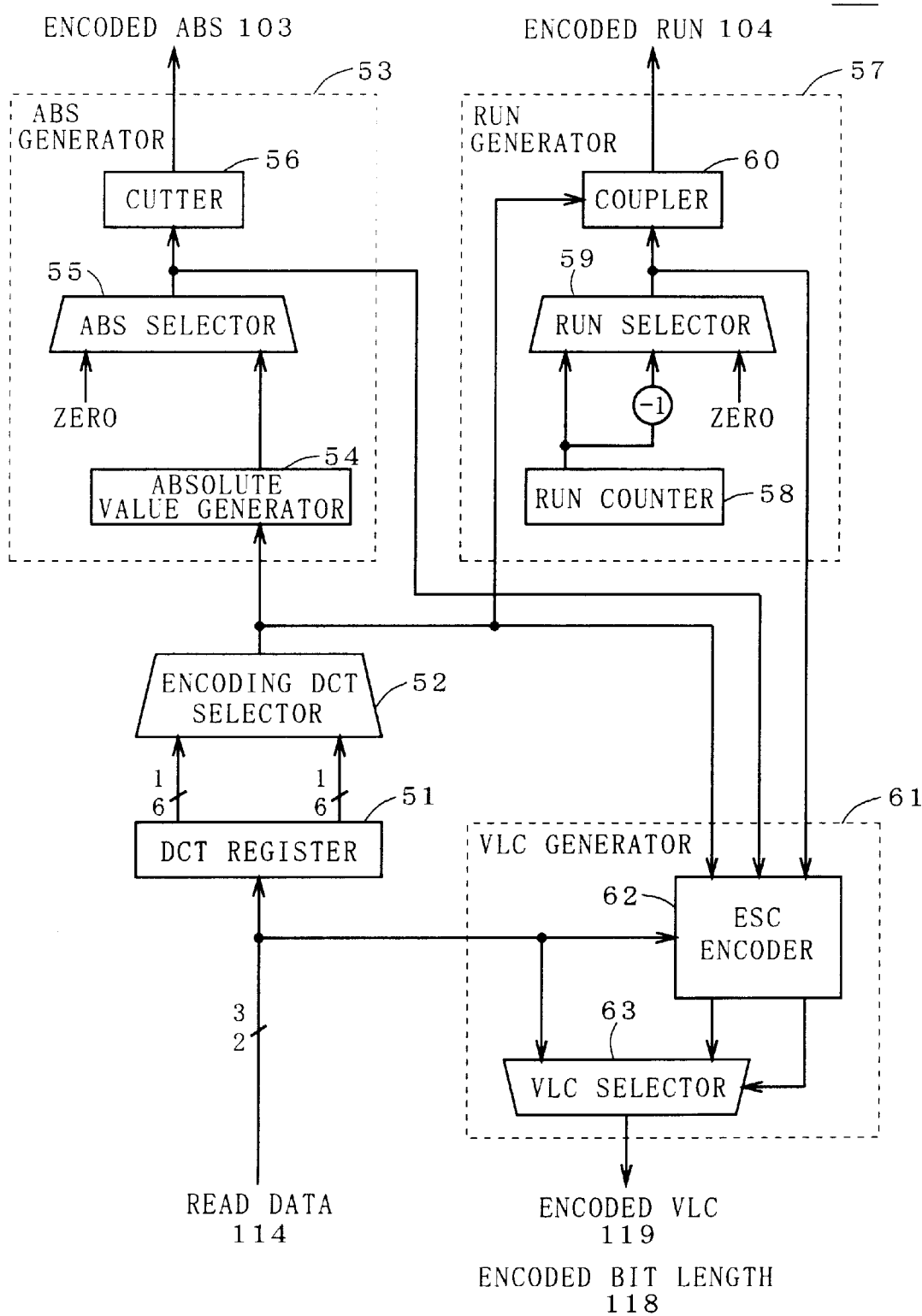
FIG. 6 is a block diagram of the internal configuration of a VLC generating section in FIG. 2.

A VLC generating section 14 is a block in which a two-dimensional data consisting of RUN and LEVEL is generated from the DCT factors read from a local memory 7 and the generated data is then subjected to a variable length encoding. The VLC generating section 14 operates only in a VLC encoding. Referring to FIG. 6, the section 14 is composed of an ABS generator 53, a RUN generator 57, a VLC generator 61, a DCT register 51 and an encoding DCT selector 52.

The DCT register 51 temporarily stores DCT factors to be encoded which are included in a read data 114 read from the local memory 7. The reading of the read data 114 is carried out in units of 32 bits, and the DCT factors to be processed are being stored in the high-order or low-order of the DCT register 51. The encoding DCT selector 46 selects DCT factors to be processed from among the DCT register 51, according to the value of a DCT pointer 31 (not shown in FIG. 6).

The ABS generator 53 has an absolute value generator 54 and an ABS selector 55. The absolute value generator 54 finds the absolute values of DCT factors held by the DCT register 51. The ABS selector 55 selects and outputs the obtained absolute values or zeros. When the output of the ABS selector 55 is the absolute value, a cutter 56 cuts its low-order seven bits to obtain a value and then outputs it to an address generating section 12 as an encoded (object) ABS.

The RUN generator 57 monitors the DCT factors stored in the DCT register 51 and, when its value is zero, increments a RUN counter 58. When the value of the read DCT factor is zero, the next DCT factor is quickly read and the RUN generator 57 performs the same process. When the read DCT factor has a value other than zero, such a value becomes the LEVEL of a two-dimensional data to be encoded, and the value of the RUN counter 58 at that time corresponds to RUN.

The RUN counter 58 is initialized to zero when the encoding of a new two-dimensional data is started. The RUN generator 57 couples the output of the RUN selector 59 to the code bits of the DCT factors held by the DCT register 51 by means of a coupler 60, and then outputs them to the address generator 12 as an encoded (object) RUN. The code bit is coupled to the right side of the RUN counter 58. The RUN selector 59 selects one from among the output of the RUN counter 58 (six bits), the value that is obtained by reducing a one from the output of the RUN counter 58, and zero.

As an example of selecting the value that is obtained by reducing a one from the output of the RUN counter 58, it can be supposed the case where an encoding is made by dividing [RUN/REVEL=30/20] into [RUN/REVEL=29/0] and [RUN/REVEL=0/20].

The VLC generator 61 performs a variable length encoding of a two-dimensional data consisting of RUN and LEVEL, based on a table retrieval result included in a read data 114, the data held by the DCT register 51, and the value of the RUN counter 58. A variable length encoded data thus generated (encoded VLC 119) and its bit length (encoded bit length 118) are sent to a VLC pack section 17.

The VLC generator 61 includes an ESC encoder 62 and a VLC selector 63. Based on an ESC retrieval described later, the ESC encoder 62 judges whether a RUN retrieval result described later is valid or invalid, and holds its result. The VLC selector 63 selects the variable length encoded data and its bit length taken from the RUN retrieval result when the judgement result is valid, alternatively, selects the variable length encoded data and its bit length generated by the ESC encoder 62 when the judgment result is invalid. The selector 63 then outputs the selected ones as an encoded VLC 119 and an encoded bit length 118, respectively. After all the DCT factors of one block have been encoded, the encoding of EOB codes will be performed by an ESC encoder 62. The ESC encoder 62 generates the following data. The encoded data to be outputted from the ESC encoder 62 is 24 bits, and the generated data are left-adjusted. In this case, the remaining bits are embedded by zero.

(a) In a MPEG2 encoding:
Encoded data: Coupling of "000001", six bits of the output of the RUN selector 58, and the low-order 12 bits of the encoding DCT selector 46
Bit length: 24 bits
(b) When the MPEG2 encoding is terminated:
(b-1) Block using table B14:
Encoded data: "10"
Bit length: two bits
(b-2) Block using table B15:
Encoded data: "0110"
Bit length: four bits
(c) In a DVC encoding:
(c-1) When the output of the RUN selector 58 is zero:
Encoded data: Coupling of "1111111", the low-order eight bits of the output of the ABS selector 55, and the code bit of the encoding DCT selector 46
Bit length: 16 bits
(c-2) When the output of the RUN selector 58 is other than zero:
Encoded data: Coupling of "1111110" and the six bits of the output of the RUN selector 58
Bit length: 13 bits
(d) When the DVC encoding is terminated:
Encoded data: "0110"
Bit length: four bits Shifter Section A shifter section 15 operates both in VLC decoding and VLC encoding processes. In a decoding process, the shifter section 15 left-justifies a processing object VLC to be sent from a VLC buffer section 16, into a 32-bit data. In an encoding process, the shifter section 15 makes alignment in order that an encoded VLC is coupled to the tail of the previously encoded VLC.

Referring to FIG. 7, the shifter section 15 includes a shift data generator 71, a shifter array 72, a shift amount generator 73, a shifter output H register 74, and a shifter output L register 75. The shifter array 72 left shifts a 63-bit data provided from the shift data generator 71 and outputs the high-order 32 bits of a shift result. The shift result is held in the shifter output H register 74 or the shifter output L register 75. The shift amount is 0 to 30 bits, which is provided from the shift amount generator 73.

A VBF output S 105 (63 bits) provided from the VLC buffer section 16 and a pack object VLC 108 (32 bits) provided from a VLC pack section 17 are inputted to the shift data generator 71. In a decoding process, the shift data generator 71 feeds the shifter array 72 with the VBF output S 105 intact. In an encoding process, the shift data generator 71 feeds the shifter array 72 with a 63-bit data that is generated by zero extension of a pack object VLC 108, or a method in which the right side of the low-order 31 bits of a pack object VLC 108 is made in the zero state.

Based on a storage value of the control register VL_STRBP provided from the VLC buffer section 16, and a storage value of the control register VL_REMBP provided from the VLC pack section 17, the shift amount generator 73 generates a shift amount to provide it to the shifter array 72. The low-order five bits of a storage value of the control register VL_STRBP is to be a shift amount during a decoding process, and the low-order five bits of a storage value of the control register VL_REMBP is to be a shift amount during an encoding process.

VLC Buffer Section

A VLC buffer section 16 operates both in VLC decoding and VLC encoding processes. In a decoding process, the VLC buffer section 16 holds a VLC that has been read from a data memory 1 by DMA transfer, and sends it to a shifter section 15. If the holding data becomes lessened, a new VLC is read by another activation of a DMA transfer. In an encoding process, the VLC buffer section 16 temporarily holds a VLC being packed in units of 64 bits and transfers it to the data memory 1 by activating a DMA transfer.

Figure 8:
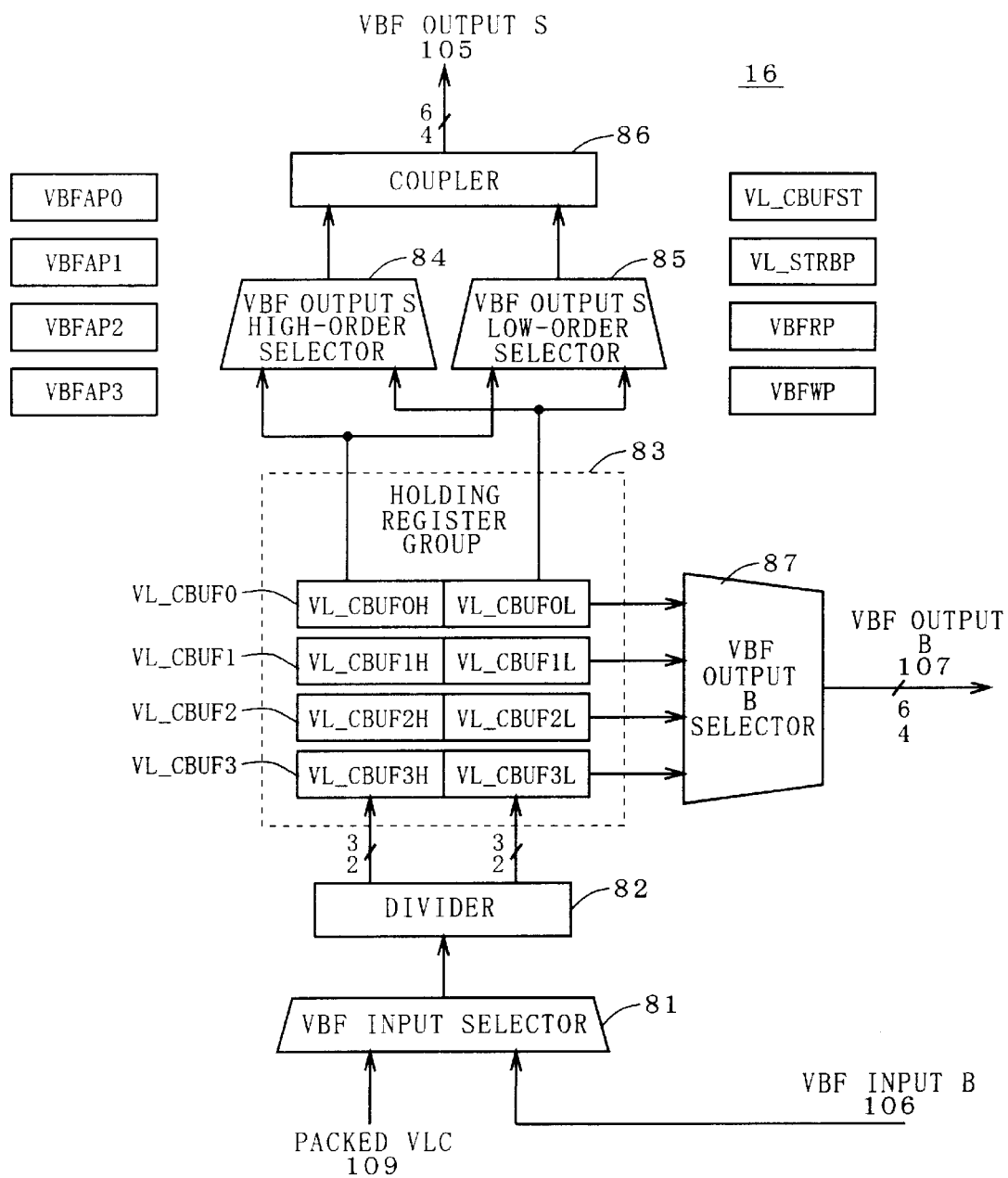
FIG. 8 is a block diagram of the internal configuration of a VLC buffer section in FIG. 2.

FIG. 8 is a block diagram showing the internal configuration of a VLC buffer section 16. The VLC buffer section 16 is composed of a holding register group 83 having four data holding registers (VL__CBUF0 to VL__CBUF3), a VBF input selector 81, a VBF output B selector 87, and the like.

A read pointer VBFRP indicates a holding register that becomes a candidate for reading, and a write pointer VBFWP indicates a holding register that becomes a candidate for writing. A control register VL__STRBP is meaningful only in a decoding, and indicates, along with the read pointer VBFRP, as to where in a holding register the top of a VLC to be decoded is positioned. The read pointer VBFRP indicates a holding register including the top of the VLC, and the control register VL__STRBP indicates the bit position of the top of a VLC in a holding register.

Each of the data holding registers constituting the holding register group 83 has a width of 64 bits. For example, the high-order 32 bits of a VL__CBUF0 is called VL__CBUF0H and the low-order 32 bits is called VL__CBUF0L. To these holding registers, either a packed VLC 109 provided from the VLC pack section 17 or a VBF input B 106 provided from a bus interface section 6 is written. A write data is then selected by the VBF input selector 81.

During a decoding process, a VBF input B 106 is valid and a VLC to be decoded that has been transferred from a data memory 1 is provided thereto. During an encoding process, a packed VLC 109 is valid and an encoded VLC after being packed into a 64-bit data is provided thereto. A write pointer VBFWP indicates a register 5that becomes a candidate for writing. Writing is always made in units of 64 bits. The write pointer VBFWP is updated every time a single data is written. Data is written in the following order: VL__CBUF0, VL__CBUF1, VL__CBUF2, VL__CBUF3, VL__CBUF1 . . .

Address registers VBFAP0 to VBFAP3 are disposed so as to correspond to the holding registers VL__CBUF0 to VL__CBUF3 of the VLC buffer section 16, respectively. When data is written to the holding registers VL__CBUF0 to VL__CBUF3, the addresses of the data written to the holding registers are stored in the address registers VBFAP1 to VBFAP3, respectively.

There are two read-out paths from the holding register group 83. One is a read-out path to the shifter section 15 which operates in a decoding process. Data to be read out to the VLC buffer section 16 is made by coupling the output of a VBF output S high-order selector 84 and the output of a VBF output S low-order selector 85. Both selectors 84 and 85 select one from among a total of eight inputs that consists of their respective high-order and low-order inputs of the four holding registers. The VBF output S high-order selector 84 selects, between the high-order 32 bits and lower-order 32 bits of a register indicated by the read pointer VBFRP, one including a bit indicated by the control register VL__STRBP. The VBF output S low-order selector 85 works differently depending on whether a bit position indicated by the control register VL__STRBP is below 32 or not less than 32.

Specifically, when the control register VL__STRBP is below 32, the VBF output S low-order selector 85 selects the low-order 32 bits of a register indicated by the read pointer VBFRP. If it is 32 or more, the high-order 32 bits of the next register indicated by the read pointer VBFRP (e.g., when the read pointer VBFRP is "0", the holding register VL__CBUF1H; and for "3", the holding register VL__CBUF0H is selected).

By a coupler 86, the output of the VBF output S low-order selector 85 is coupled to the right side (low-order side) of the output of the VBF output S high-order selector 84, and its high-order 63 bits are cut and then outputted as a VBF output S 105. The high-order 32 bits always includes the top of a VLC to be decoded.

The VLC buffer section 16 updates both storage values of the read pointer VBFRP and control register VL__STRBP every time a VLC decoding is terminated. A value that is obtained by adding a decoded bit length provided from the DCT generator 13 to the storage value of the control register VL__STRBP before decoding, is set to the control register VL__STRBP. The read pointer VBFRP is updated only when a carry is generated at the time of the above addition. The updating of the read pointer VBFRP is made in the following order: VL__CBUF0, VL__CBUF1, VL__CBUF2, VL__CBUF3, 0 . . .

The other read-out path is that to a bus interface section 6. This path operates only in an encoding. A register to be read is indicated by the read pointer VBFRP, selected by the VBF output B selector 87, and then outputted as a VBF output B 107. Reading is made in units of 64 bits. The read pointer VBFRP is updated every time a single data is read. The order of updating is the same as in decoding. Read data is transferred to the data memory 1 by DMA transfer.

A control register VL__CBUFST is a register to indicate the statuses of the data holding registers, and has bits that correspond one for one with the holding registers VL__CBUF0 to VL__CBUF3. Each bit is set when data is written in its corresponding holding register. In a decoding, each bit is cleared when all the VLCs held by its corresponding holding register have been decoded. In an encoding, each bit is cleared when its corresponding holding register is read out.

VLC Pack Section

A VLC pack section 17 operates only in an encoding, and performs coupling of variable length data sent from a VLC generating section 14. The Nth encoded variable length data is coupled to the right side of the N−1th encoded data, and the N+1th encoded data is further coupled to its right side. When data generated in this coupling procedure becomes 64 bits or more, the VLC pack section 17 cuts 64 bits therefrom and sends it to a VLC buffer section 16. Either the data that failed to reach 64 bits in the coupling or the residue of the data that has been sent to the VLC buffer section 16 is held by the VLC pack section 17, as a pack residual data. In the next pack process, a newly encoded variable length data is coupled to the right end of a pack residual data.

Figure 9:
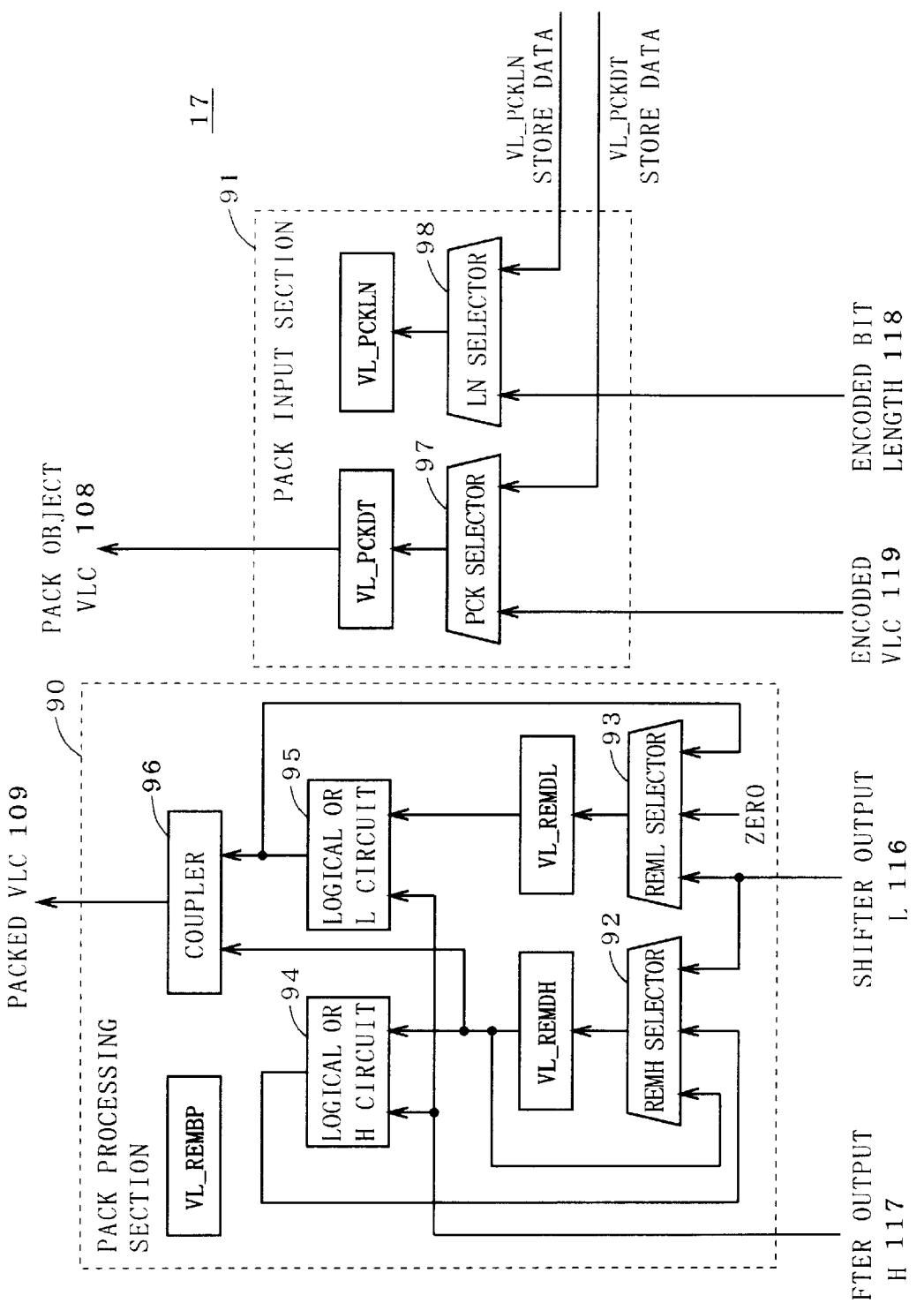
FIG. 9 is a block diagram of the internal configuration of a VLC pack section in FIG. 2.

FIG. 9 shows the configuration of a VLC pack section 17. The VLC pack section 17 can be divided into a pack processing section 90 and a pack input section 91. The pack input section 91 has a control register VL__PCKDT and a VL__PCKLN. The control register VL__PCKDT is a 32-bit register that stores a newly encoded VLC left-justified, and the data stored therein will be provided to a shifter section 15 as a pack object VLC 108.

The control register VL__PCKLN stores the bit length of the VLC stored in the control register VL__PCKDT. An encoded VLC 119 and an encoding bit length 118 which have been sent from the VLC generating section 14 in the course of an encoding process will be written to both registers. In addition, a writing to both registers will be made when a CPU 2 executes a store instruction. A PCK selector 97 and an LN selector 98 select an input data according to a writing thereto.

The VLC pack section 17 has two 32-bit control registers VL_REMDH and VL_REMDL for holding pack residual data. A combination of the two registers is referred to as a pack residual register. A storage value of the control register VL_REMDH corresponds to the high-order 32 bits, and a storage value of the control register VL_REMDL corresponds to the low-order 32 bits. Data to be written to both registers is selected by two data selectors (a REMH selector 92 and a REML selector 93). The REMH selector 92 is provided with the output of a logical OR H circuit 94 described later, the storage value of the control register VL_REMDH itself, and a shifter output L 116. The REML selector 93 is provided with the output of a logical OR L circuit 95 described later, a shifter output L 116, and zero. The logical OR H circuit 94 and the logical OR H circuit 95 carry out a logical OR between a shifter output H 117 and each storage value of both control registers. The output of the logical OR L circuit 95 (logical OR L) is coupled to the right side of a storage value of the control register VL_REMDH by the coupler 96, and it is then provided to the VLC buffer section 16 as a packed VLC 109. A storage value of the control register VL_REMBP is a pointer that indicates the number of bits of a pack residual data held in the control registers VL_REMDH and VL_REMDL.

The VLC pack section 17 is activated when data is written to the control register VL_PCKDT. Data can be written to the control register VL_PCKDT through the VLC generating section 14 in a VLC encoding or through the CPU 2 by a store instruction. In either case, the same process takes place. The VLC pack section 17 performs two works: (i) coupling of a pack residual data to a storage value of the control register VL_PCKDT (i.e., VLC coupling); and (ii) cutting of eight bytes on the left side of the data generated in this coupling and sending it to the VLC buffer section 16 (i.e., a pack data generation).

Figure 10:
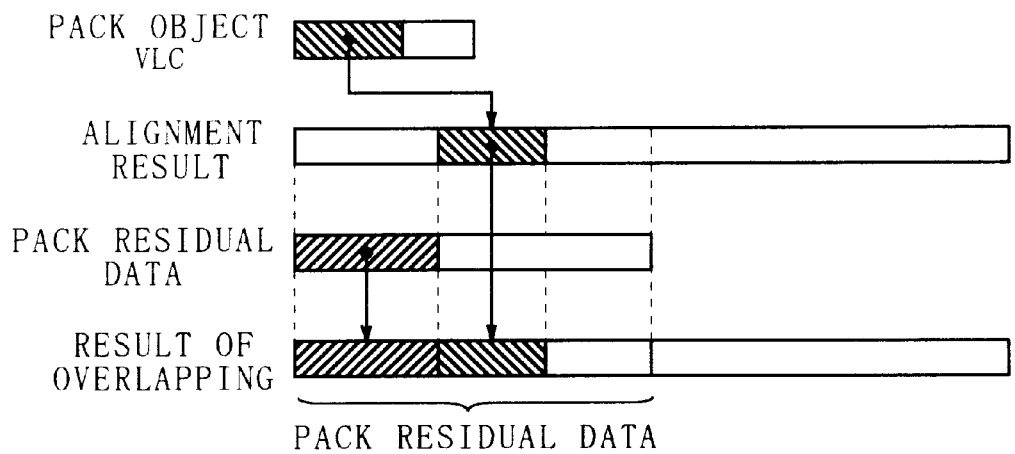
FIG. 10 is a diagram for explaining the operation of pack process in the VLC pack section.
Figure 11:
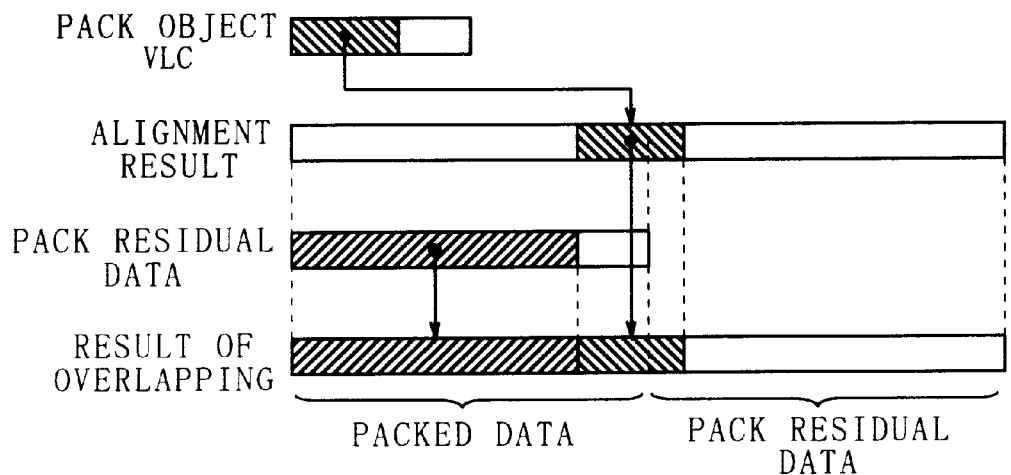
FIG. 11 is another diagram for explaining the operation of pack process in the VLC pack section.

A process of coupling a pack residual data to a storage value of the control register VL_PCKDT is implemented by two steps. In a first step, a pack object VLC is aligned so that the right end of the pack residual data is coupled to the left end of the pack object VLC. In a second step, the aligned pack object VLC is overlapped with the pack residual data. FIGS. 10 and 11 are schematic diagrams showing the process as described. In both figures, portions with oblique lines denote effective data and the rest is zero.

FIG. 10 shows the case where the data obtained by overlapping is below 64 bits. Its result is stored as it is in a pack residual register. FIG. 11 shows the case where the data obtained by overlapping exceeds 64 bits. The high-order 64 bits of the result are sent to the VLC buffer section 16 as a packed data (packed VLC). This is called pack data generation. The bits left after a pack data generation is a pack residual data, which is stored in the pack residual register. As to whether the data obtained by overlapping exceeds 64 bits or not will be judged by a VLC boundary judgment as described later.

An overlapping process can be implemented by a logical OR between two data. Alignment of a pack object VLC can be easily implemented with a right shifter having 96 bits or more in output and a maximum 63 bits in shift amount. However, a shifter having the above functions calls for a large hardware. Thus, in this preferred embodiment, alignment of a pack object VLC and overlapping with a pack residual register are executed in units of 32 bits, permitting a pack process with a small hardware. This method will be described hereafter.

Alignment of a pack object VLC is implemented by two-time shift processes. In the first shift process, a 63-bit data generated by zero extension of a pack object VLC is provided to a shifter array 72 of a shifter section 15, and a shift result is held in a shifter output H register 74. In the second shift process, the shifter array 72 is provided with the data in which 31 zeros are coupled to the right side of the high-order 31 bits of the pack object VLC, and a shift result is held in a shifter output L register 75. Shift amounts used in both shift processes are a logical reverse data of the low-order five bits of a storage value of the control register VL_REMBP.

The process of overlapping with a pack residual data differs depending on a storage value of the control register VL_REMBP. Below "32", the high-order 32 bits (bit [0:31]) of the result of overlapping becomes a logical OR between a storage value of the control register VL_REMDH and a shifter output H 117. The next 32 bits (bit [32:63]) becomes a shifter output L 116 itself. A bit length of data to be generated by overlapping is obtained by adding the control register VL_REMBP to the control register VL_PCKLN. This case results in not more than 63 bits. The result of overlapping, i.e., 64 bits, are all stored in the pack residual register. That is, the REMH selector 92 selects the output of a logical OR H, and the REML selector 93 selects a shifter output L 116. The result of addition between the control registers VL_REMBP and VL_PCKLN is stored in the control register VL_REMBP. At this time, a packed VLC 109 is not outputted.

If the control register VL_REMBP is "32" or more, bit [0:31] of the result of overlapping is the control register VL_REMDH itself, bit [32:63] is a logical OR between the control register VL_REMDL and a shifter output H 117, and bit [64:95] is a shifter output L 116. If the result of addition between the control register VL_REMBP and the control register VL_PCKLN is below "64", a packed VLC 109 is not outputted, and bit [0:63] of the result of overlapping is stored in the control registers VL_REMDH and VL_REMDL. That is, the REMH selector 92 selects the output of the control register VL_REMDH, and the REML selector 93 selects the output of a logical OR L. The result of addition between the control registers VL_REMBP and VL_PCKLN is stored in the control register VL_REMBP. Bit [64:95] of the result of overlapping should be provided with zero, which is held nowhere.

On the other hand, if the control register VL_REMBP is "32" or more and the result of addition between the storage values of the control registers VL_REMBP and VL_PCKLN is "64" or more, bit [0:63] of the result of overlapping is outputted to the VLC buffer section 16 as a packed VLC 109, bit [64:95] is stored in the control register VL_REMDH, and zero is stored in the control register VL_REMDL. The low-order six bits of the result of addition between the control registers VL_REMBP and VL_PCKLN is stored in the control register VL_REMBP. This is equal to a value which is obtained by reducing 64 from the above addition result, and indicates the bit length of data newly stored in the pack residual register.

A variable length encoding requires coupling of generated variable length codes and cutting into a predetermined size. The reason for this is that the data processable in normal information processors is limited to those made in units of eight bits. In this preferred embodiment there is placed a VLC pack section 17 in which variable length codes generated by encoding process are coupled together and cut into a predetermined size, thereby performing the above processes at high efficiency. Further, by arranging that a device other than a VLC processor 4, e.g., a CPU 2, can use the function of the VLC pack section 17, it is possible to decrease a code coupling operation that throws a high load on the CPU 2 or the like.

Operation of VLC Decoding Process

A VLC decoding process is started by setting a process bit of a control register VL_CNT when a storage value of a control register VL_MODE is set to MPEG1, MPEG2, or DCT decoding. For proper processing, it is necessary to set the respective storage values of an address register VL_STRAP, a control register VL_STRBP and an address register VL_DCTAP before activating the process bit. The address register VL_STRAP indicates which area in a data memory 1 a variable length code to be decoded is stored, by means of a word address of 64 bits per word. The control register VL_STRBP indicates at which bit position in the word indicated by the address register VL_STRAP the top of a variable length code is located. The address register VL_DCTAP designates an area of the data memory 1 to which the DCT factors generated by the VLC processor 4 are written. When a decoding object is an INTRA block, a storage value of the control register VL_INTRA is also set as necessary.

The VLC processor 4 reads and then decodes the data provided on the data memory 1. A decoding work consists of a variable length decoding of data provided, and expansion of a two-dimensional data (RUN and LEVEL) thus obtained. Finally obtained data is DCT factors of one block layer.

Figure 12:
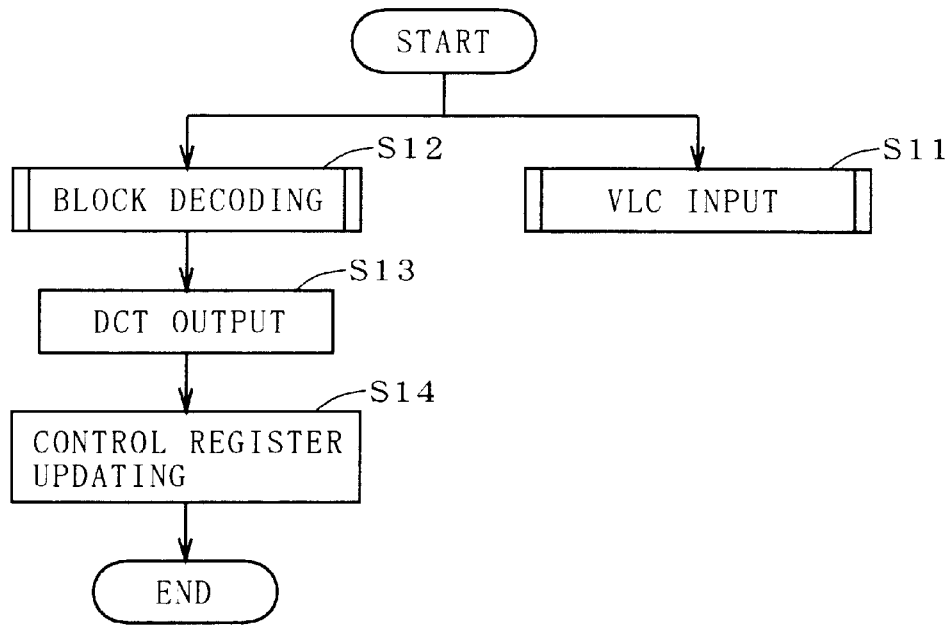
FIG. 12 is a flowchart showing the contents of VLC decoding process.

FIG. 12 is a flowchart showing a decoding process of a VLC processor 4. As shown in the figure, a decoding process consists of four processes (steps S11 to S14): a VLC input; a block decoding; a DCT output; and a control register updating. The contents of each process will be described hereafter;

VLC Input (S11)

Figure 13:
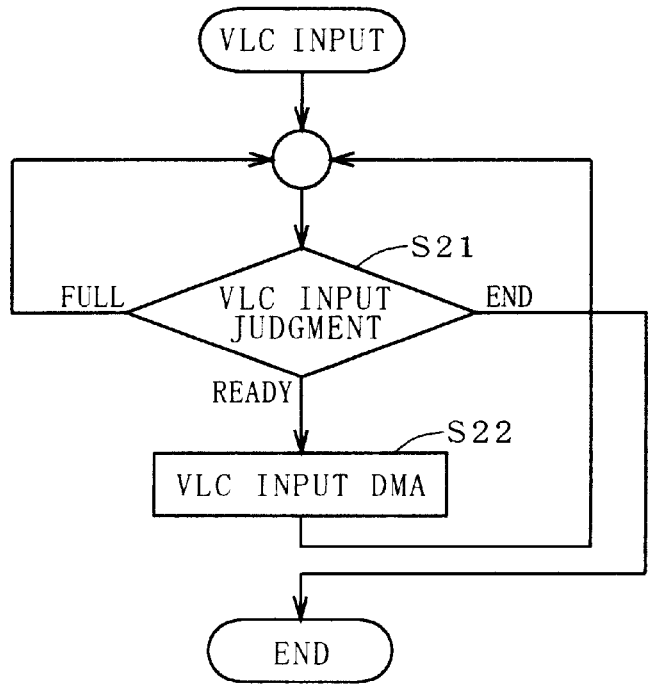
FIG. 13 is a flowchart showing the contents of VLC input process.

A VLC input to be executed in step S11 is a process of transferring a decoding object data provided on a data memory 1 to a VLC buffer section 16. This consists of a VLC input execution judgement process and a VLC input DMA transfer process as shown in the flowchart of FIG. 13.

A VLC input judgment process in step S21 judges whether a VLC input DMA is activated or not, based on the state of the VLC buffer section 16. When in step S21 it is judged the VLC buffer section 16 is in the full state (Full), a VLC input DMA process in step S22 is not activated. The VLC processor 4 judges that the VLC buffer section 16 is in the full state, if a variable length codes of over 128 bits is stored in the buffer section 16. However, if a block decoding has been terminated, a VLC input is terminated irrespective of the state of the VLC buffer section 16.

A VLC input DMA process in step S22 is a DMA transfer from the data memory 1 to the VLC buffer section 16. A VLC input DMA transfers a 16-byte data at a time, and the transferred data is stored in one of holding registers VL_CBUF0 to VL_CBUF3, depending on a value of a write pointer VBFWP. A register to be referred to in a VLC input DMA is an address register VL_STRAP, which is updated every time a DMA is terminated.

Block Decoding (S12)

A block decoding process in step S12 consists of a variable length decoding of the data stored in a VLC buffer section 16; and expansion of a two-dimensional data (RUN and LEVEL) thus obtained, thereby generating 64 DCT factors.

Figure 14:
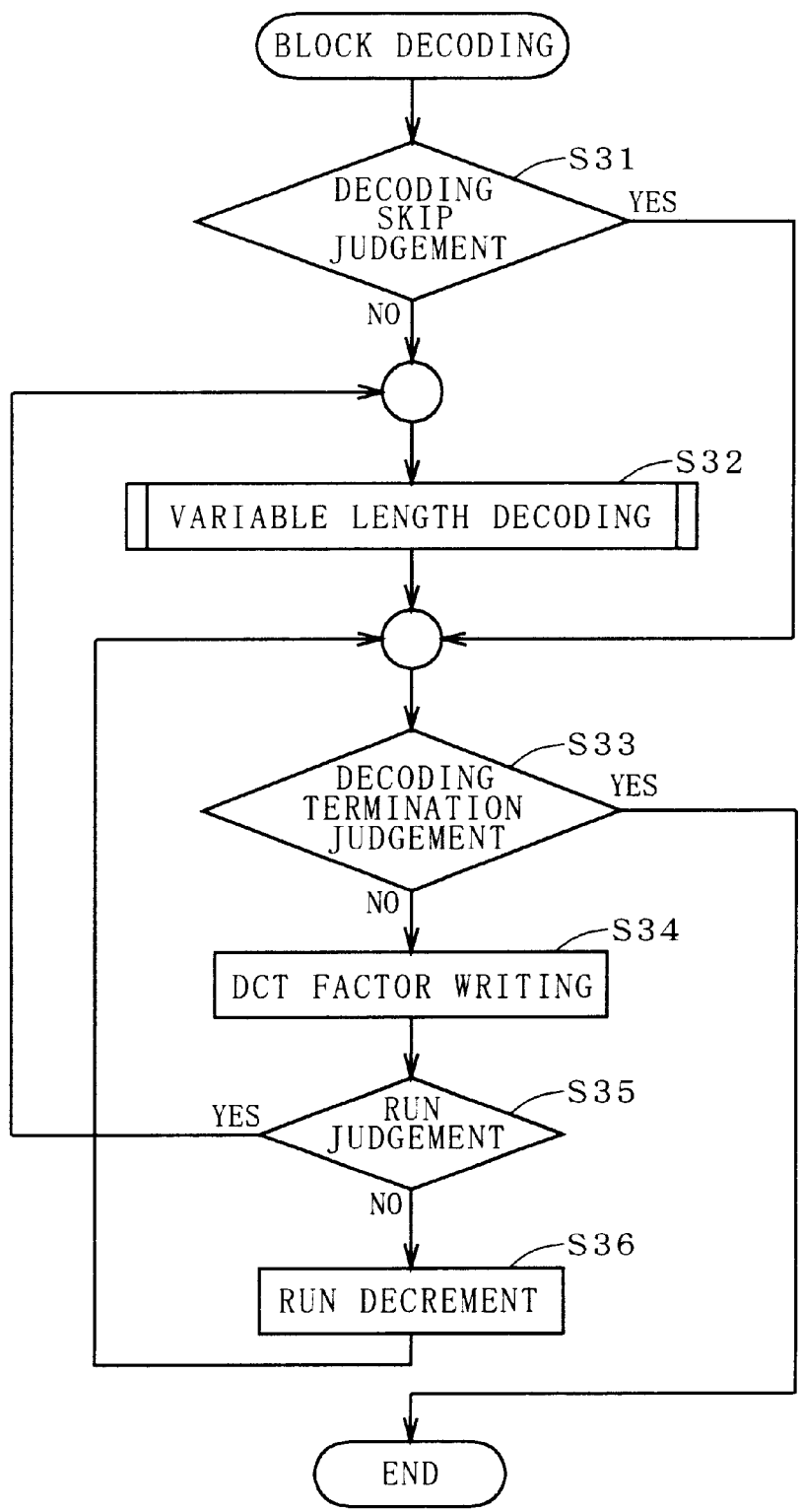
FIG. 14 is a flowchart showing the contents of block decoding process.

FIG. 14 is a flowchart showing the procedure of a block decoding. As shown in the figure, a block decoding process is composed of a variable length decoding, a DCT factor writing, a RUN decrement, and several condition judgements.

Referring to FIG. 14, a decoding skip judgement process in step S31 judges whether a decoding process for a variable length code is to be skipped or not. For an intrablock of MPEG1 or MPEG2, the initial variable length decoding is skipped (namely, step S32 is skipped and step S33 is performed). The initial variable length code stands for a variable length code for which any DCT factor writing has not been executed after staring a block decoding. This can be judged based on a value of a DCT pointer 31.

Figure 15:
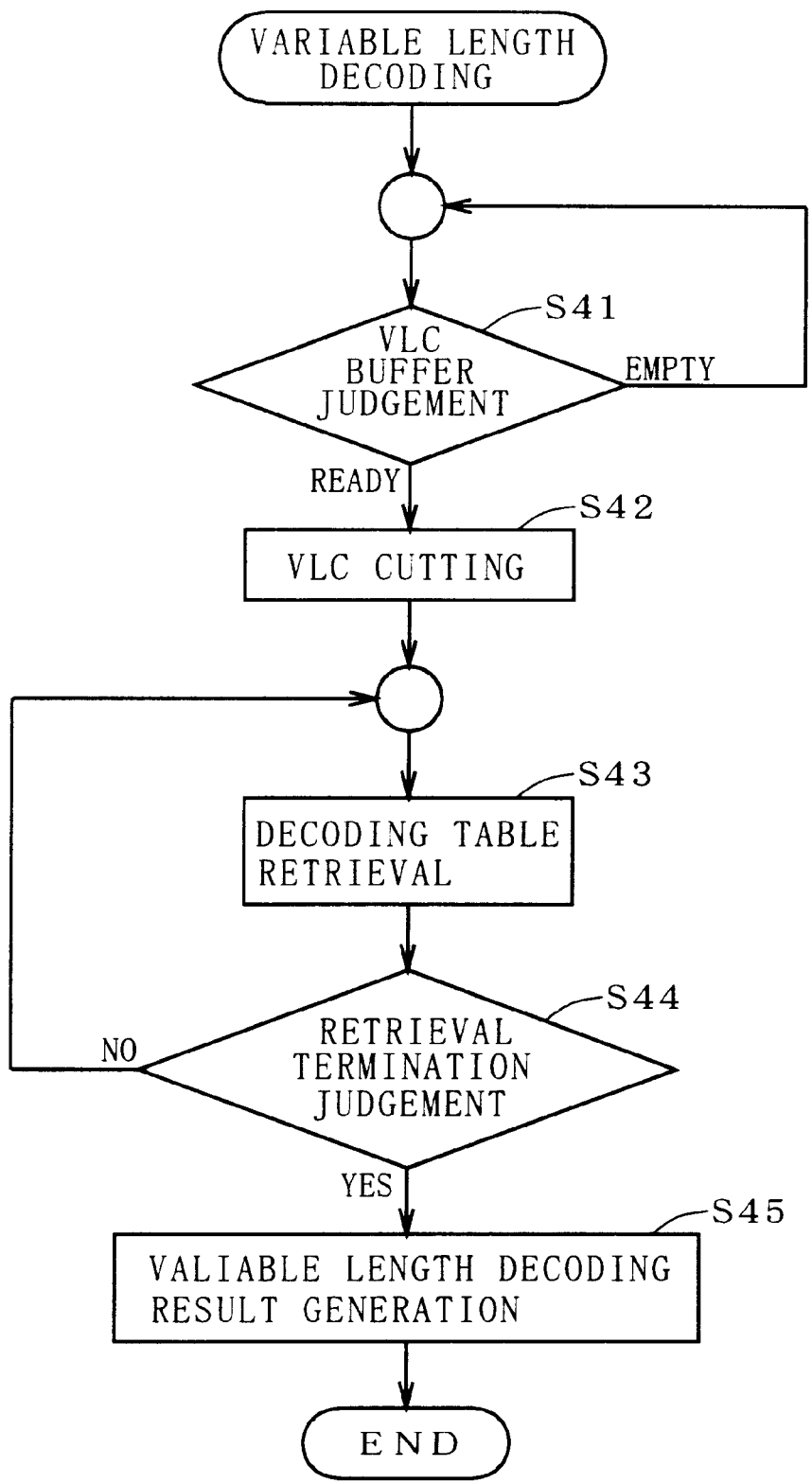
FIG. 15 is a flowchart showing the contents of variable length decoding process.

A variable length decoding process in step S32 carries out a variable length decoding of a variable length data in the VLC buffer section 16, to obtain a two-dimensional data consisting of RUN and LEVEL As shown in FIG. 15, a variable length decoding process is composed of a VLC buffer judgement, a VLC cutting, a decoding table retrieval, a retrieval termination judgement, and a variable length decoding result generation. Details will be described later.

A decoding termination judgement in step S33 judges whether a decoding process for one block layer is terminated or not. On termination of the process of DCT factors (64 in number) of one block layer, a DCT pointer 31 is initialized and the block decoding is terminated. At this point of time, if an EOB bit is not yet set, an ERR bit is set. If the process for 64 DCT factors is not yet terminated, it is in the course of the decoding process for the block layer, followed by a DCT factor writing. The processed DCT factors are indicated by the DCT pointer 31 in an address generating section 12.

Thus, a two-dimensional data obtained by decoding a variable length code is further expanded and outputted as 64 DCT factors. This enables to unify the size of output data, causing no waste in ensuring a buffer area for output data on a local memory 7. When a two-dimensional data consisting of RUN and LEVEL is outputted, extremely large area is required for a sequence of data whose RUN is zero and LEVEL has a large value. It is considerably wasteful to ensure such an output area so as to comply with the above. This is true for the input data prior to a variable length encoding.

In step S34, a DCT factor writing process is executed in which the DCT factors generated based on a variable length decoding are written to a local memory 7. A value of the DCT pointer 31 is outputted to an address on the local memory 7 which is subjected to a postincrement in accordance with a writing in units of 16 bits. Selection of a write data is performed by a DCT generator 43. If a decoded RUN counter 45 has a value zero, the generator 43 selects a value of a LEVEL register 44. If the counter 45 has a value other than zero, the DCT generator 43 selects zero. For the initial variable length code in an intrablock, the DCT generator 43 selects a value set in a control register VL_INTRA, irrespective of a value of the decoded RUN counter 45. By repeating this process, the two-dimensional data obtained by variable length decoding is expanded to a one-dimensional data.

When the data stored in the local memory 7 is neither zero nor the maximum negative value (namely, when it is an effective data), the DCT generator 43 sets a predetermined bit of an entry effective field in a control register VL_CNT. A setting bit depends on the value of the DCT pointer 31 at the time of writing. The DCT generator 43 sets the top bit of an entry effective field if the DCT pointer 31 has a value of 0 to 15; the second bit for a value of 16 to 31; the third bit for a value of 32 to 47; and the fourth bit for a value of 48 to 63, respectively.

A RUN judgement process in step S35 judges whether the two-dimensional data has been expanded to a one-dimensional data. If a decoded RUN counter 45 has a value zero (YES), it returns to step S32 to perform a variable length decoding again. For a value other than zero, it goes to step S36 to perform a RUN decrement process.

A RUN decrement process in step S36 is directed to decrement the decoded RUN counter 45.

DCT Output (S13)

Referring again to FIG. 12, a DCT output process in step S13 is to transfer the DCT factors stored on a local memory 7 by the block decoding process in step S12, to a data memory 1. This process is performed after the block decoding process in step S12 is terminated.

Data transfer in a DCT output process is carried out by DMA (DCT output DMA), and 32 DCT factors are transferred per DCT output DMA. DCT factors to be outputted is 64 in number. A DCT output executes two DCT output DMA transfers. A register referred to in the DCT output DMA transfer is an address register VL_DCTAP that is updated every time a DMA transfer is terminated. A value of a DCF pointer 31 is used as an address for reading DCF factors from the local memory 7.

Control Register Updating (S14)

When the DCT output process in step S13 is terminated, a VLC processor 4 updates its own control registers to terminate the entire process. There are updated two registers, namely, a control register VL_CNT and an address register VL_STRAP. Upon termination of a DCT output, the VLC processor 4 clears a process activation bit of the control register VL_CNT. At this time, if an ERR bit in a retrieval decoder 42 is set, the VLC processor 4 sets an error indication bit at the same time the process activation bit is cleared. The error indication bit indicates that an error has been observed in the course of a VLC decoding. Errors can be observed when provided a variable length code that is not defined in any encoding tables, or when no EOB code is obtained after 64 DCT factors are generated. A value of the DCT pointer 31 that has saved at the detection of a table retrieval result EOB is stored in an EOB point field.

At the same time the control register VL_CNT is updated, a value of one of address registers (VBFAP0 to VBFAP3) which correspond to one of holding registers (VL_CBUF0 to VL_CBUF3) indicated by a read pointer VBFRP, is set to the address register VL_STRAP. This value is an address indicating where in a data memory 1 a word including the top of the next variable length code to be processed. Here, the size of a word is 64 bits, and a value of the address register VL_STRAP is aligned on a 64-bit data boundary. The position of the top bit of a variable length code in a word is indicated on a control register VL_STRBP.

Variable Length Decoding (S32)

Details of a variable length decoding process will be described by referring to FIG. 15. A VLC buffer judgement process in step S41 judges whether enough variable length codes are stored in a VLC buffer section 16. Unless enough codes are stored (Empty), cutting of a VLC is suspended. When the variable length codes stored in the VLC buffer section 16 are of below 32 bits, it is judged that the VLC buffer section 16 is Empty. Upon execution of a VLC input DMA transfer, the state judgement of the VLC buffer section 16 is changed from Empty to Ready.

In step S42, there is performed a VLC cutting process for cutting the leftmost 32 bits of a variable length code stored in the VLC buffer section 16. The result of cutting is provided as a shifter output S. This process is implemented by the operations of the VLC buffer section 16 and a shifter section 15. The VLC buffer section 16 takes 63-bit data out of holding registers VL_CBUF0 to VL_CBUF3 and provides them to the shifter section 15 as a VBF output S 105. A VBF output S 105 is selected so that its high-order 32 bits includes the top of a variable length code. The shifter section 15 left-shifts a VBF output S 105 by the amount indicated by the low-order five bits of a storage value of the control register VL_STRBP, and stores the high-order 32 bits of a shift result in a shifter output H register. The low-order five bits of the control register VL_STRBP indicates at which bit from the top of a VBF output S 105 the top of a variable length code is positioned. A shifter output H 117 has a value obtained by cutting the leftmost 32 bits of a variable length code.

A decoding table retrieval process in step S43 is implemented as a process of reading a decoding table stored on a local memory 7, thereby reading information needed in a variable length decoding. An address for reading data from the local memory 7 is generated by an address generating section 12.

An address for table retrieval is obtained by adding an offset address of each decoding table to a retrieval keyword defined per table. Part of a variable length code is used in a retrieval keyword. It is already determined as to which part of a variable length code is to be used in a keyword per table. A table to be retrieved in the fast table retrieval, i.e., a table retrieval performed immediately after a VLC cutting in step S42, is determined uniquely according to the encoding standards of variable length codes. Tables to be retrieved in the second and later table retrievals are specified by a previous table retrieval.

A retrieval termination judgement process in step S44 is performed by a DCT generating section 13. A retrieval result MSB=1 indicates a retrieval termination, and MSB=0 indicates a retrieval continuation. For retrieval continuation, a decoding table retrieval is restarted. For retrieval termination, a variable length decoding result generation takes place.

A variable length decoding result generation process in step S45 is performed by the DCT generating section 13. A decoding result of a variable length code is generated according to a table retrieval result. Data to be generated are a two-dimensional data consisting of RUN and LEVEL, and LENGTH indicating the code length of a decoded variable length code. These data are set to a decoded RUN counter 45, a LEVEL register 44, a LENGTH register 48, respectively. The RUN and LEVEL set herein will be used in the following DCT factor writing. The LENGTH is provided to a VLC buffer section 16 and then used as information for updating a control register VL_STRBP and a read pointer VBFRP. When the ID field of a retrieval result is "01", an EOB bit is set to save a value of a DCT pointer 31. When the ID field is "11", an ERR bit is set.

Figure 16:
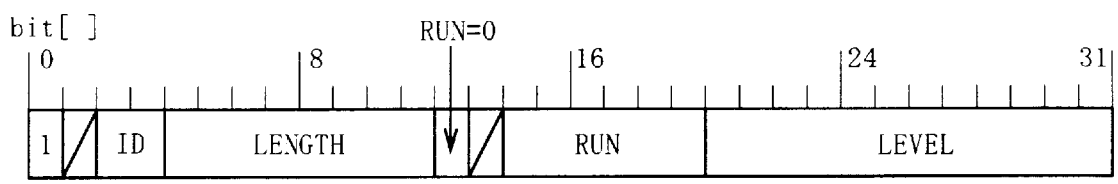
FIG. 16 is a diagram for explaining a data format of a decoding table retrieval result.
Figure 17:
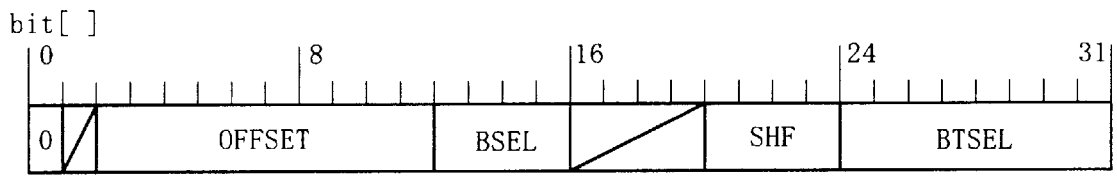
FIG. 17 is another diagram for explaining the data format of the decoding table retrieval result.

The result of a decoding table retrieval process in step S43 is provided in formats as shown in FIGS. 16 and 17. A MSB indicates whether a table retrieval is terminated or continued. That is, MSB=1 as in FIG. 16 indicates a table retrieval termination, and MSB=0 as in FIG. 17 indicates a table retrieval continuation. The DCT generating section 13 observes the above values to determine whether a decoding retrieval is to be terminated or repeated.

FIG. 16 is a format at the termination of retrieval, and it includes the following fields.

(a) ID Field:

This is bit [2:3] of a retrieval result and indicates the status when a retrieval is terminated. ID=00 indicates that a decoding result of a variable length data is obtained by table retrieval. An ID=01 indicates that an EOB code indicating a block termination is obtained by decoding. An ID=10 indicates that an ESCAPE code is obtained. An ID=11 indicates that a given variable length data is not in compliance with an assumed encoding standard.

(b) LENGTH Field:

This is bit [4:11] of a retrieval result and indicates a bit length of a variable length data that becomes as a candidate for decoding.

(c) RUN Field:

This is bit [14:19] of a retrieval result and indicates RUN of a two-dimensional data obtained by decoding.

(d) LEVEL Field:

This is bit [20:31] of a retrieval result and indicates a LEVEL of a two-dimensional data obtained by decoding.

When a decoding table retrieval is terminated, the DCT generating section 13 (a retrieval decoder 42) generates a decoding result of a variable length code, based on the above retrieval result. Data to be generated are RUN, LEVEL and LENGTH. When ID=00, the retrieval decoder 42 outputs the data provided to three fields (RUN, LEVEL and LENGTH) obtained by retrieval, as RUN, LEVEL and LENGTH, respectively. When ID=01, the retrieval decoder 42 outputs a maximum value (63 in number) to the RUN, zero to the LEVEL, and a value cut from a LENGTH FIELD to the LENGTH, respectively. When ID=10, the retrieval decoder 42 outputs ESC_RUN, ESC_LEVEL and ESC_LENGTH provided from an ESC decoder 41, as RUN, LEVEL and LENGTH, respectively. When ID=11, the retrieval decoder 42 outputs a maximum value (63 in number) to the RUN, the maximum negative value (0x8000) to the LEVEL, and zero to the LENGTH, respectively.

Although not shown in FIG. 5, the retrieval decoder 42 has an EOB bit and an ERR bit. The EOB bit is set when provided a variable length code (ID=01) indicating an EOB in the course of a decoding of a block layer. The ERR bit is set when provided a table retrieval result of ID=11, in the course of a decoding of a block layer. These bits are cleared when a decoding of a block layer is started.

At the time of retrieval continuation, a retrieval result indicates a decoding table to be retrieved in the next decoding retrieval. That is, there is provided information for generating an address used in the next decoding retrieval. FIG. 17 is a data format at the time of retrieval termination, it includes the following fields. They are provided to an address generating section 12 and then used, as a control signal, in generating an address for the next decoding retrieval.

(a) OFSET Field:

This is bit [2:11] of a retrieval result and indicates an offset address of the next retrieval table. This is provided to an offset generator 32.

(b) BSEL Field:

This is bit [12:15] of a retrieval result and is a control signal for generating a displacement address of the next retrieval table. This is provided to a displacement selector 34 to control as to which field is to be taken out of a shifter output H 117.

(c) SHF Field:

This is bit [20:23] of a retrieval result and is a control signal for generating a displacement address of the next retrieval table. This is provided to a displacement shifter 35 in the address generating section 12 to control its shift amount. A combination of a SHF field and the above BSEL field enables to specify arbitrary eight bits to be cut from the shifter output H 117.

(d) BTSEL Field:

This is bit [24:31] of a retrieval result and is a control signal for coupling an offset address of the next access retrieval table to a displacement address. This is provided to an address coupler 36.

What variable length code produces what decoding result depends on the contents of a table prepared in accordance data to be decoded. Description will be now given by taking a decoding of MPEG2 data as an example.

Decoding Retrieval of MPEG2

FIG. 21 shows a list of decoding tables used in MPEG2 decoding, which lists table names, offset addresses, and bit positions of variable length codes that are used as a keyword in their respective tables. The bit positions of variable length codes are obtained by counting from the top of a code to be decoded, that is, they correspond to bit positions obtained by counting from the top of a shifter output H 117. Table Nos. 1 to 10 are applied to a block layer decoding using Table-B14, and table Nos. 11 to 20 are applied to a block layer decoding using Table-B15. The decoding tables of Nos. 1, 2 and 11 are applied to the first table retrieval. As their respective keywords, several bits from the top of a variable length code are always used. The decoding tables of Nos. 3–5 and 12–15 are applied to the second table retrieval, and Nos. 6–10 and 16–20 are applied to the third table retrieval.

FIGS. 22 and 23 show encoding tables used in the first variable length code in a block layer using Table-B14. In the figures, 'Variable length code' denotes a variable length code corresponding to RUN or LEVEL, and 'length' denotes its code length. Variable length codes shown in FIGS. 22–23 complete a decoding by up to three table retrievals. In the figures, '1st', '2nd' and '3rd' denote the decoding tables used in the first, second and third retrievals, respectively. In the second or third retrieval table, the codes shown by symbol "–" indicate that a decoding is completed prior to the execution of its table retrieval. FIGS. 24 and 25 show encoding tables with respect to the second and later variable length codes in a block layer using Table-B14. FIGS. 26 and 27 show encoding tables with respect to the second and later variable length codes in a block layer using Table-B15.

A VLC processor 4 selects the first retrieval table according to an encoding table of a given variable length code. For instance, when provided the first variable length code in a block using Table-B14, B14-1-1 is selected. At this time an address generating section 12 generates an address that is obtained by adding an offset value, zero, to bit [0:5] of a shifter output H. FIG. 28 shows the contents of decoding table B14-1-1. The keyword of B14-1-1 is bit [0:5] of a variable length code, and variable length codes of not more than six bits can be decoded only by retrieval using B14-1-1. For instance, when provided a code indicated by No. 1 in FIGS. 22 and 23, for s=1, a retrieval keyword (i.e., displacement address) is in the range of 110000 to 111111. As shown by No. 1 in FIG. 28, there is provided a decoding result that RUN=0; LEVEL=–1; and LENGTH=2. For s=0, it follows that RUN=0; LEVEL=+1; and LENGTH=2. These decoding results are provided in the format shown in FIG. 16. When provided a variable length code of not less than six bits, two or more table retrievals are required. For instance, when provided a code indicated by No. 8 of FIGS. 22–23, a displacement address is 001001, irrespective of the value of s. As shown in No. 13 of FIG. 28, B14-2-2 is the next retrieval table. This information is indicated as a control code of an address generating section 12, as shown in FIG. 17. The contents of B14-2-2 is shown in FIG. 29. For s=1, the displacement address of B14-2-2 becomes 1111. As shown by No. 1 of FIG. 29, there is provided a decoding result that RUN=10, LEVEL=−1, and LENGTH=9. For s=0, the displacement becomes 1110. As shown by No. 2 of FIG. 29, there is provided a decoding result that RUN=10, LEVEL=+1, and LENGTH=9.

In the meantime, when provided a variable length code as shown by No. 24 of FIGS. 22–23, i.e., Escape code, a retrieval result of table B14-1-1 provides ID=10 in the format shown in FIG. 16. Data to be outputted from an ESC decoder 41 at this time is as described earlier with regard to a DCT generation section 13. When provided a variable length code as shown by No. 2 of FIGS. 24–25, i.e., an EOB code, a retrieval result of table B14-1-2 provides ID=01 in the format of FIG. 16.

Decoding Retrieval of MPEG1

A decoding of MPEG1 is performed by using only part of the decoding tables for MPEG2. In MPEG1 all blocks are encoded by using Table-B14 alone. That is, only encoding tables of FIGS. 22–23 and FIGS. 24–25, and decoding tables of Nos. 1 to 10 of FIG. 21 are used. Its post-processing is the same as MPEG2, except for a decoding result that an ESC decoder 41 generates when an Escape code is provided.

Decoding Retrieval of DVC

A list of decoding tables used in a DVC decoding is shown in FIG. 30. FIGS. 31–36 show encoding tables used in the block layers of DVC. In these figures, each item has the same meaning as in that in the tables for MPEG2.

A decoding table retrieval immediately after a VLC cutting is always executed for V00-1-1. Thus, an offset address is zero and a keyword is bit [0:5] of a shifter output H. Hence, the same process as in MPEG2 is carried out. Since an ESC code is not defined in DVC, a decoding output of an ESC decoder 4 operates nothing.

Operation of VLC Encoding Process

A VLC encoding process is started by setting a process bit of a control register VL_CNT when a control register VL_MODE is set to MPEG2 or DVC encoding. For proper process, it is necessary to set storage values of address registers VL_DCTAP and VL_STRAP before activating the process bit. The address register VL_DCTAP specifies which area in a data memory 1 DCT factors to be encoded are stored. The address register VL_STRAP specifies which area in the data memory 1 a variable length code obtained by encoding is to be stored. Both are provided by a word address of 64 bits per word.

A VLC processor 4 reads therein DCT factors of one block layer provided on the data memory 1 and then encodes them. An encoding process is composed of an encoding of DCT factors into a two-dimensional data consisting of RUN and LEVEL, and a variable length encoding of the data thus obtained. A variable length code (EOB code) indicating a block end is added to the end of data per block. The data generated by variable length encoding is coupled together in the VLC processor 4, aligned on a 64-bit data boundary, and then written to the data memory 1.

Figure 37:
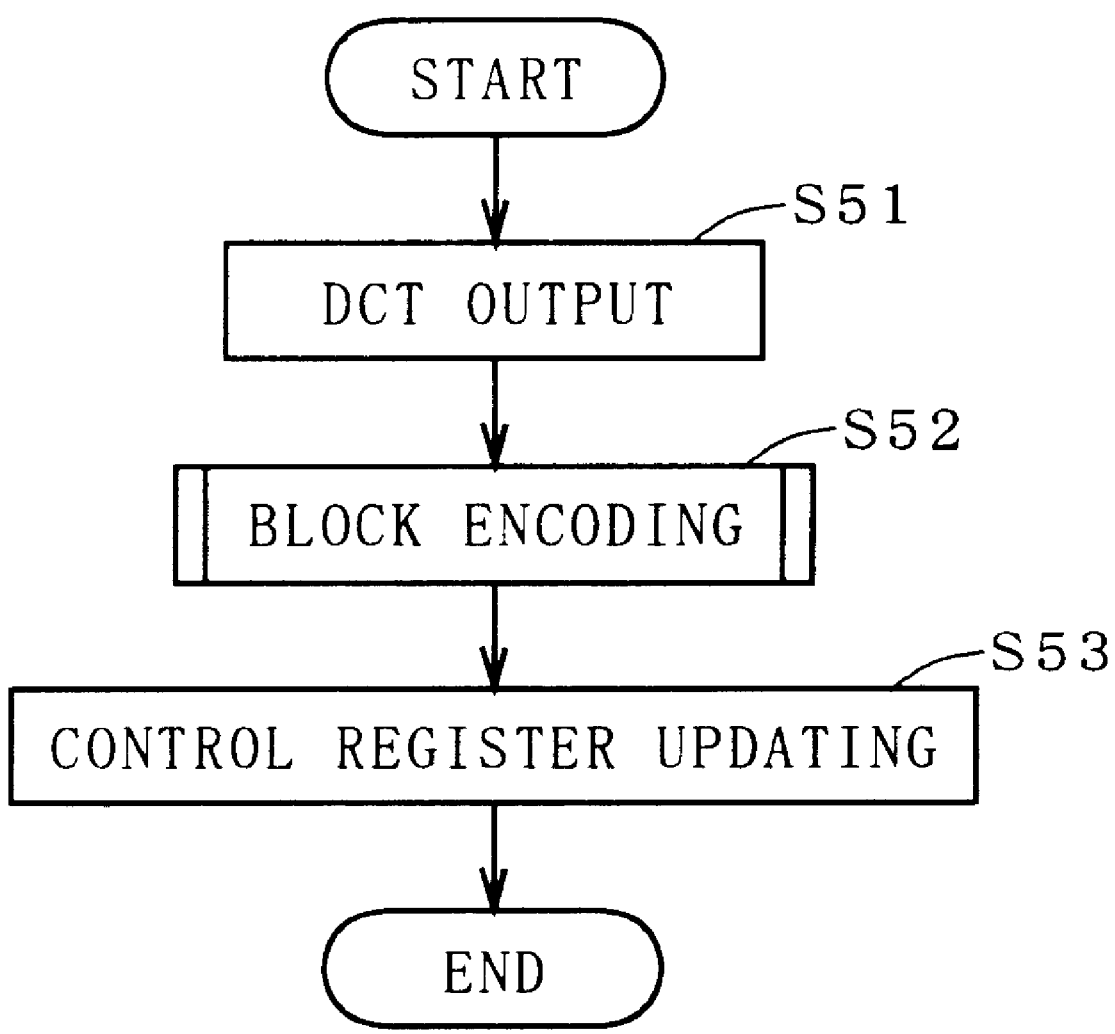
FIG. 37 is a flowchart showing the contents of a VLC encoding process.

FIG. 37 is a flowchart of an encoding process of a VLC processor 4. As shown in the figure, an encoding process is composed of a DCT input process (S51), a block encoding process (S52), and a control register updating process (S53). The contents of each process will be described hereafter.

DCT Input (S51)

A DCT input process to be executed in step S51 transfers the DCT factors residing on a data memory 1 to a local memory 7. Data transfer is carried out by DMA transfer (DCT input DMA), and 32 DCT factors are transferred per DCT input DMA. DCT factors to be inputted are 64 in number. One DCT input is carried out by two DCT input DMA transfers. A register referred to in a DCT input DMA is a storage value of an address register VL_DCTAP that is updated every time one DMA transfer is terminated. A value of a DCT pointer 31 is used as an address in reading DCT factors from the local memory 7. The DCT pointer 31 is initialized at the beginning of DCT input and initialized again at the same time the DCT input is terminated.

Block Encoding (S52)

A block encoding process in step S52 is composed of an encoding of the DCT factors being read on the local memory 7 into a two-dimensional data consisting of RUN and LEVEL, and a variable length encoding of the data thus obtained. A variable length code (EOB code) indicating a block end is added to the end of data per block. The data generated by variable length encoding is coupled together in the VLC processor 4, aligned on a 64-bit data boundary, and then written to the data memory 1.

Figure 38:
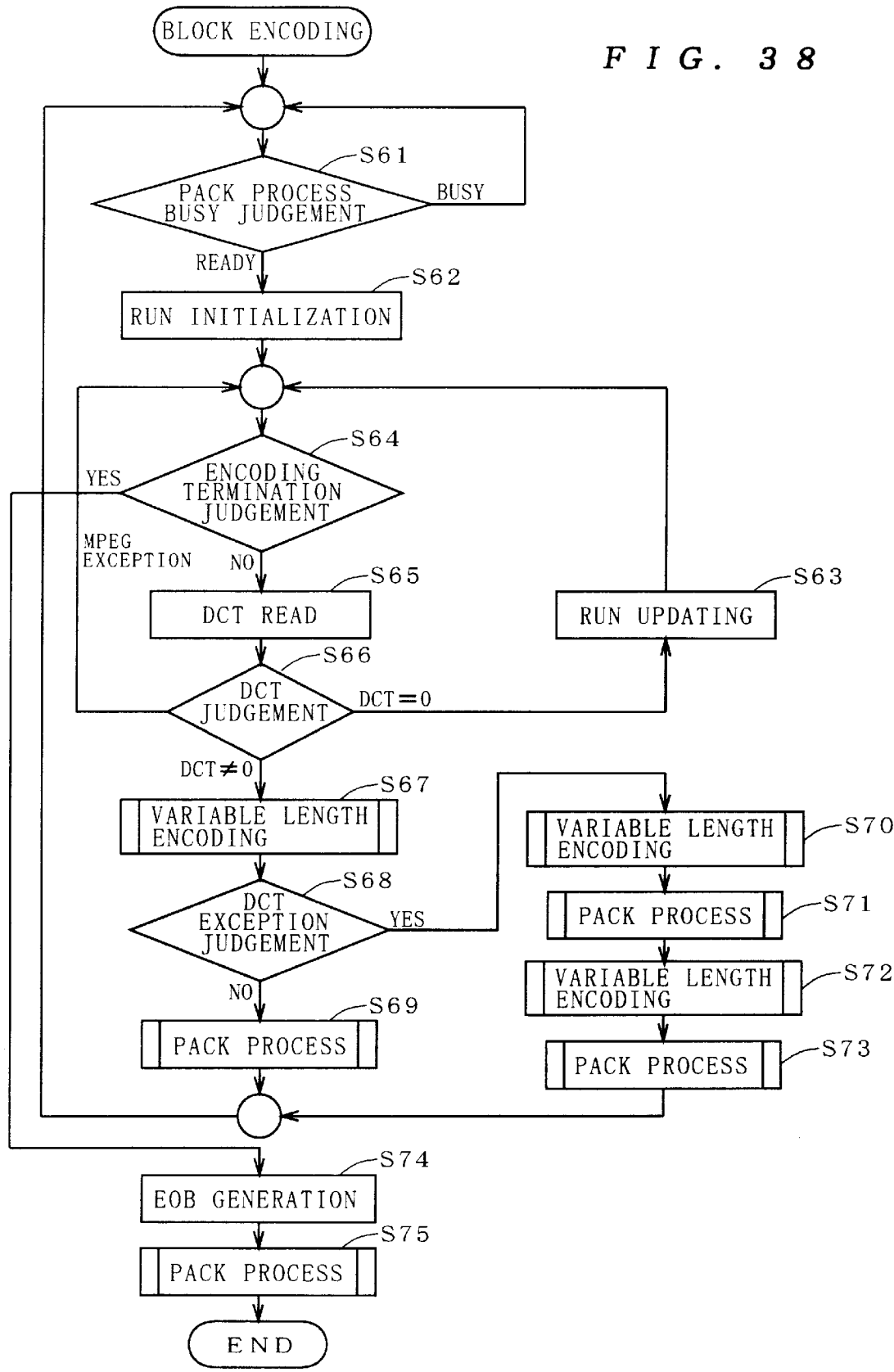
FIG. 38 is a flowchart showing the contents of a block encoding process.

FIG. 38 is a flowchart showing details of a block encoding process. As shown in the figure, a block encoding process is composed of a RUN initialization (S62), a RUN updating (S63), a DCT reading (S65), a variable length encoding (S70), an EOB generation (S74), a pack process (S75), and several condition judgements.

Referring to FIG. 38, in step S61, a pack process judgement process is executed to prevent a variable length code generated by encoding from overflowing. When a VLC pack section 17 is in busy condition (i.e., busy), the pack process judgement process executes a self-loop so that the next process is not performed until the busy condition is terminated. When a packed data is stored in all the holding registers of the VLC buffer section 16 (i.e. ready), it is judged that the VLC pack section 17 is in busy condition and goes to step S62.

In step S62, there is executed a Run initialization process for initializing an encoded RUN counter 58.

In step S63, there is executed an encoding termination judgement process to judge whether DCT factors of one block (64 in number) have been processed. If the process is terminated (Yes), it goes to step S74 to perform an EOB generation process. If not terminated (No), it goes to step S65 to perform a DCT reading process. It is judged whether an encoding process is terminated or not, based on a value of a DCT pointer 31.

A DCT reading process in step S65 is to read the DCT factors that have been transferred to a local memory 7. As an address for reading, a value of the DCT pointer 31 is used which is then subjected to a postincrement. The read data is held in a DCT factor register in a VLC generating section 14. A value selected by an encoding DCT selector 46 becomes a DCT factor to be processed.

In step S66, there is executed a DCT judgement process to judge whether DCT factors to be processed are zeros or not. That is, when the DCT factors are zeros, it goes to step S63 to perform a RUN updating process for incrementing an encoded RUN counter 58, and then to step S64 to execute an encoding termination judgement process. When the DCT factors are other than zero, it goes to step S67 to perform a variable length encoding process. At this time, a value of the encoded RUN counter 58 becomes RUN to be encoded, and the value read by DCT reading becomes LEVEL to be encoded.

In the DCT judgement process in step S66, if in an intrablock of MPEG2, the initial DCT factor has been read (MPEG exception), it goes to an encoding termination judgement process (S64), irrespective of the values of DCT factors. In this case, a RUN updating process (S65) is not executed. That is, the process for the initial DCT factor in an intrablock is skipped.

In a variable length encoding process in step S67, there is obtained a variable length code of a two-dimensional data consisting of a value of an encoded RUN counter 58 and DCF factors to be processed. At this time, the RUN selector 59 selects a value of the encoded RUN counter 58, an ABS selector 55 selects the low-order seven bits of an absolute value obtained. A variable length encoding is to provide a variable length code of a two-dimensional data.

Figure 39:
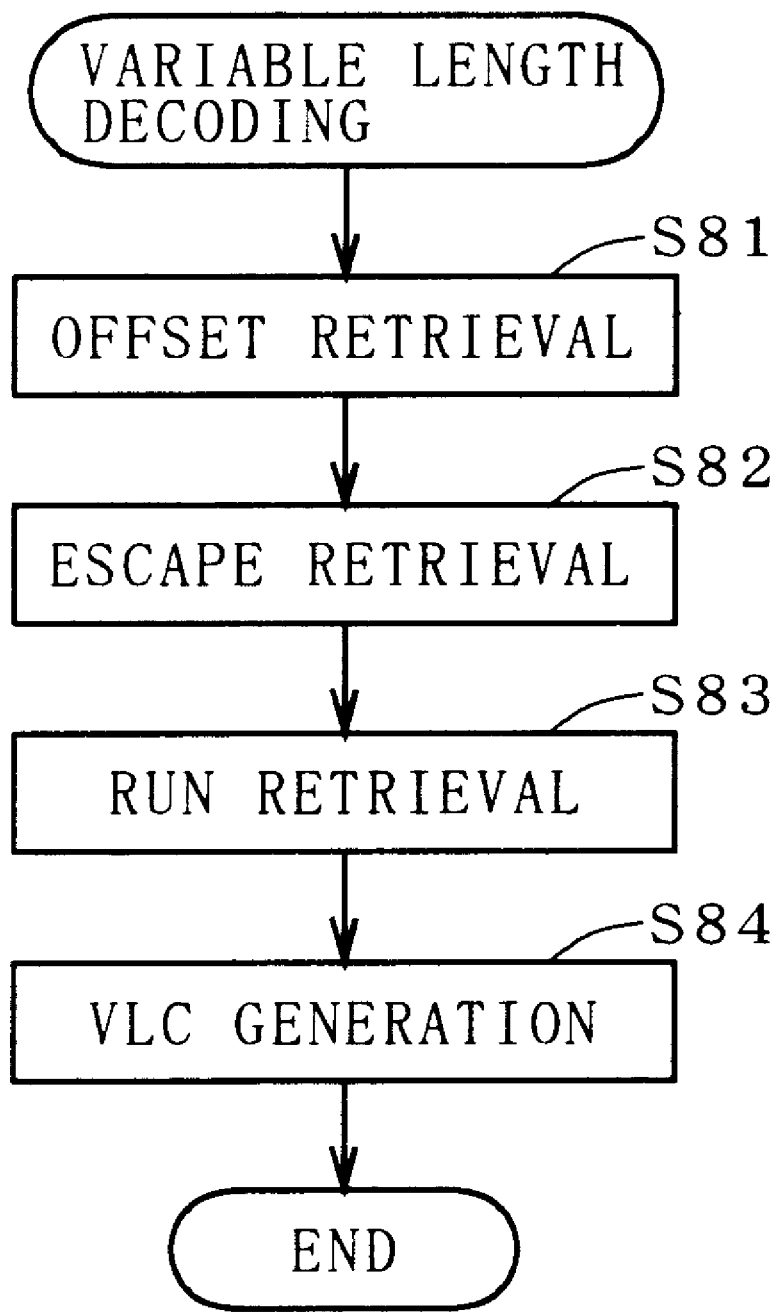
FIG. 39 is a flowchart showing the contents of a variable length encoding process.

FIG. 39 is a flowchart showing the contents of a variable length encoding process. As shown in the figure, this process is implemented by three retrieval processes of an offset retrieval (S81), an escape retrieval (S82) and a RUN retrieval (S83), and a VLC generating process (S84). Details of a variable length encoding will be described later.

DVC exception judgement process in step S68 is an exception judgement process in a VLC encoding of DVC data. This judgement process is to detect cases where a retrieval result of a RUN retrieval process (S83) in a variable length encoding process is invalid and a value of the encoded RUN counter 58 is other than zero, in a VLC encoding of DVC data. As a result of an exception judgement process in step S68, if judged it corresponds to the exception as described, it goes to a variable length encoding process in step S70. At this time, a variable length code generated in the variable length encoding process (S67) is ignored. On the other hand, if in step S68 it is judged not being the exception, it goes to a pack process in step S69.

Figure 40:
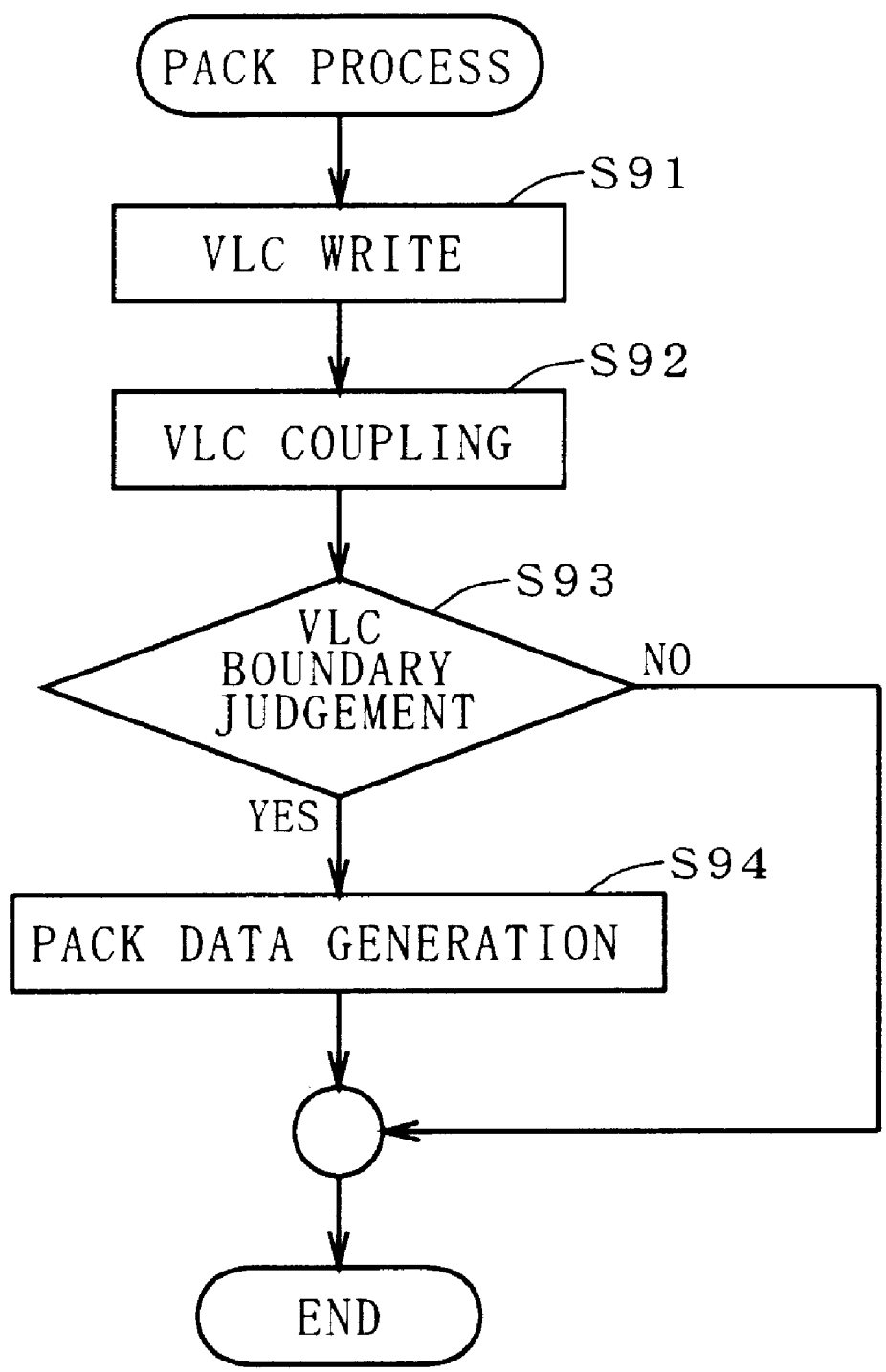
FIG. 40 is a flowchart showing the contents of a pack process.

In a pack process in step S69, the variable length code generated in the variable length encoding process (S67) is coupled to a previously generated variable length code. As shown in FIG. 40, the pack process is implemented by a VLC writing process (S91), a VLC coupling process (S92), a pack data generation process (S94), and a VLC boundary judgement process (S93). Details of the processes S91 to S94 are as described with regard to a VLC pack section 17. When the pack process in step S69 is terminated, it returns to step S61.

A packed VLC 109 that has been stored in a VLC buffer section 16 by pack process is transferred to a data memory 1. This is implemented by VLC output DMA transfer.

A pack process in step S71 to be executed after the variable length encoding process in step s70 is carried out only when the DVC exception judgement process in step S68 judges the exception. The variable length encoding process in step S70 provides a variable length code of a two-dimensional data which consists of zero and a value obtained by reducing "1" from a value of an encoded RUN counter 58. At this time, a RUN selector 59 selects a value obtained by reducing "1" from a value of the encoded RUN counter 58, and an ABS selector 55 selects zero.

Then, a pack process in step S71 performs a pack process of the variable length code generated in the variable length encoding process in step S70.

A variable length encoding process in step S72 provides a variable length code of a two-dimensional data consisting of zero and DCT factors to be processed. At this time, the RUN selector 58 selects zero, and the ABS selector 55 selects the low-order seven bits of an absolute value obtained.

Then, a pack process in step S73 performs a pack process of the variable length code generated in the variable length encoding process in step S72, and it returns to step S61.

Step S74 executes an EOB generating process for generating a variable length code (EOB code) that indicates a block layer end. Codes to be generated in step S74 are defined on the encoding tables for encoding. For example, "10" is applied to Table-B14 in MPEG2, and "0110" is applied to Table-B15 in MPEG2 or DVC.

Step S75 executes a pack process of the EOB code generated in the EOB generating process in step S74, thereby terminating a block encoding process.

Control Register Updating (S53)

Referring again to FIG. 37, when the block encoding process in step S52 is terminated, a VLC processor 4 updates its own control register in step S53. A register that becomes a candidate for updating is a control register VL_CNT, and its process activation bit is cleared.

Variable Length Encoding (S67)

A variable length encoding is implemented by three table retrieval processes (S81 to S83) and a VLC generating process (S84), as shown in FIG. 39. An offset retrieval in step S81 and a RUN retrieval in step S83 are table retrieval processes for obtaining a variable length code of a two-dimensional data. An escape retrieval in step S82 is a retrieval process to judge whether a result obtained in the above retrievals is correct or not.

A VLC generating process in step S84 is a process for generating a variable length code and its code length, based on the above table retrieval results. Their processing contents will be described hereafter.

Offset Retrieval (S81)

An offset retrieval is executed by using an encoded ABS 103 as a keyword, thereby checking a table to be accessed in a RUN retrieval. According to the encoding table for data to be encoded, one of the following four tables is retrieved.

(a) OFS_14D—for generating the initial variable length code of each block in MPEG2 block layer using Table-B14;

(b) OFS_14A—for generating the second and later variable length codes of each block in MPEG2 block layer using Table-B14;

(c) OFS_15—for generating variable length codes in MPEG2 block layer using Table-B15; and (d) OFS_DVC—for generating variable length codes of DVC block layers A keyword of offset retrieval is an encoded ABS 103 to be outputted from a VLC generating section 14. An address generating section 12 generates a retrieval address by adding a retrieval keyword to an offset corresponding to a predetermined offset table. Specifically, the low-order six bits of an encoded ABS 103 is coupled to the high-order four bits of an offset value outputted from an offset generator 32. Offset values of the respective offset tables are previously set in the offset generator 32.

Figure 18:
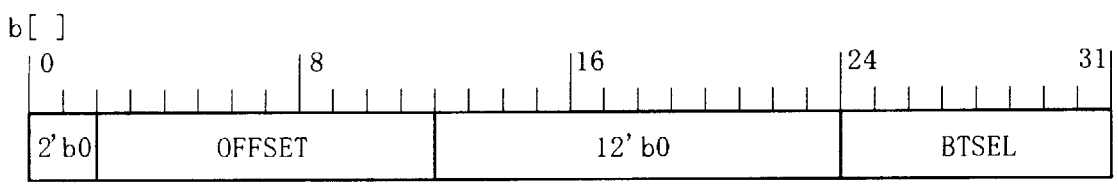
FIG. 18 is a diagram for explaining a data format of an encoding retrieval result.

A data format for an offset retrieval result is as shown in FIG. 18. This is basically the same as a data format for a decoding retrieval in FIG. 17. An OFFSET field indicates the offset of a table to be accessed in a RUN retrieval. A BTSEL field indicates the conditions in accessing the table, i.e., the size of a displacement address. Since a RUN retrieval requires no operation of a BSEL field and SHF field, both fields are fixed to zeros.

RUN Retrieval (S83)

A RUN retrieval is executed for a table checked in an offset retrieval to provide a two-dimensional data consisting of an encoded ABS 103 and an encoded RUN 104. Its retrieval keyword is part of an encoded RUN 104 outputted from a VLC generating section 14. As to which part of an encoded RUN 104 is to be used as a keyword is already determined per RUN table that becomes a candidate for retrieval. This is indicated by a BTSEL field of an offset retrieval result. An address generating section 12 generates an address for RUN retrieval, based on an OFFSET field and BTSEL field of an offset retrieval result. A displacement selector 34 selects an encoded RUN 104 and a displacement shifter 35 performs nothing.

Figure 20:
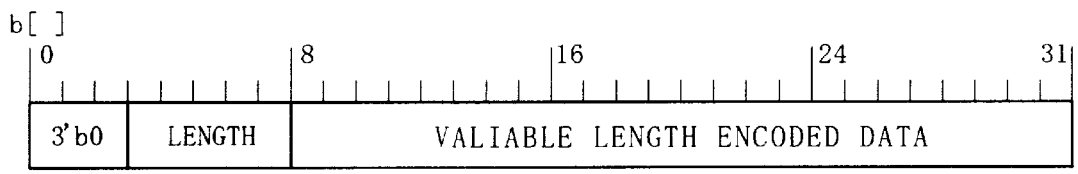
FIG. 20 is another diagram for explaining the data format of the encoding retrieval result.

A data format for a RUN retrieval result is as shown in FIG. 20. It is possible to obtain a variable length encoded data and its bit length of a two-dimensional data to be encoded. The variable length encoded data is left-justified in bit 8 to bit 31 of a table retrieval result, and the LENGTH field in bit 3 to bit 7 indicates its effective bit length.

Escape Retrieval (S82)

An escape retrieval judges whether a variable length code of a two-dimensional data consisting of an encoded ABS 103 and an encoded RUN 104 is obtainable by RUN retrieval. Depending on data to be encoded, either of the followings is retrieved.

(a) ESC-MPEG—when a MPEG2 data is encoded; and
(b) ESC_DVC—when a DVC data is encoded A keyword of an escape retrieval is the low-order six bits of an encoded ABS 103 outputted from a VLC generating section 14. An address generating section 12 generates a retrieval address by adding an offset corresponding to a predetermined escape table to a retrieval keyword. Offset addresses correspond to the respective escape tables are previously set in an offset generator 32.

Figure 19:
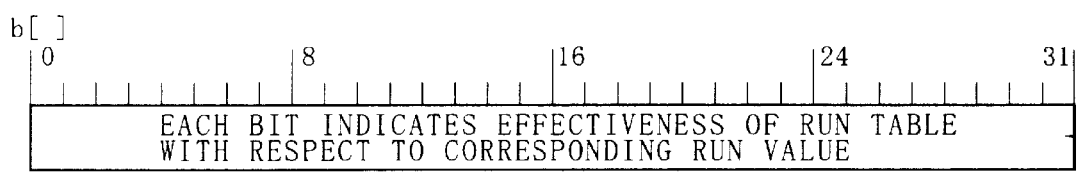
FIG. 19 is another diagram for explaining the data format of the encoding retrieval result.

A data format for an ESC retrieval result is as shown in FIG. 19. Bit 0 to bit 31 of a retrieval result correspond to the output values 0 to 31 of a Run selector 58 which is part of an encoded RUN 104. When "1" is set to a bit in an escape retrieval result, it indicates that a two-dimensional data that consists of an encoded RUN 104 corresponding to the above bit, and an encoded ABS 103 that has been used as a keyword, can be subjected to a variable length encoding by RUN retrieval. That is, a RUN retrieval result is valid. In an escape retrieval result, unless a bit corresponding to an encoded RUN 104 is set, it indicates that a RUN retrieval result is invalid.

VLC Generation (S84)

Based on an escape retrieval result and Run retrieval result, a variable length code of a two-dimensional data to be processed is generated. This process is executed by a VLC generating section 14. The generated variable length code is obtained as an encoded VLC 119 of a VLC generator 61, and the code length of the generated code is obtained as an encoded bit length 118.

When an escape retrieval result indicates that a RUN retrieval result is valid, the VLC generator 61 outputs a LENGTH field of the RUN retrieval result as an encoded bit length 118 and a variable length coded data field as an encoded VLC 119. On the other hand, when an escape retrieval result indicates that a RUN retrieval result is invalid, the VLC generator 61 outputs values that are generated by an ESC generator 62 as an encoded bit length 118 and an encoded VLC 119.

Meanwhile, in both offset retrieval and escape retrieval, only the low-order six bits of an encoded ABS is used as a keyword. Therefore, if any effective bit is included in portions that has not been used as a keyword in the above retrievals, namely, if an encoded ABS is 64 or more, the correctness of the retrievals themselves will be lost. In such a case, a Run retrieval result is handled as invalid, irrespective of a value of an escape retrieval. An escape retrieval makes judgement only for values 0 to 31 of a RUN selector 58. Accordingly, when the RUN selector 58 has a value of 32 or more, an escape retrieval result is incorrect. Again in this case, a RUN retrieval result is handled as invalid.

Examples of Variable Length Encoding of MPEG2

Description will be now given of an example of variable length encoding processes in MPEG2. FIG. 41 is a list of retrieval tables for MPEG2 encoding. Table Nos. 1 to 3 are offset retrieval tables, No. 4 is an escape retrieval table, and Nos. 5 to 85 are RUN retrieval tables. FIG. 42 shows part of the contents of OFS_14A, as an example of offset tables. FIG. 43 shows part of the contents of escape table ESC_MPEG. FIG. 44 shows part of the contents of RUN_03B14 as an example of RUN tables. Of these tables, the retrieval results of those indicated by "invalid" are finally ignored. Hence, it shows that any value is not objectionable.

Consider now a variable length encoding of a two-dimensional data wherein RUN=4 and LEVEL=−3, in a MPEG2 block using Table-B14. Let this variable length encoding be of the second and later in the block. In this case, "3" is outputted to an encoded ABS, an offset retrieval result indicates RUN_03B14 as a table for RUN retrieval, and an escape retrieval result becomes 0xfe000000. The value of RUN (value of an encoded RUN counter 58) is "4", and LEVEL (output of an encoding DCT selector 46) has a negative value, thus "9" is outputted to an encoded RUN. A RUN retrieval using "9" as a keyword, provides a binary numeral "0000_0001_0010_1" as a variable length code, and "13" as a code length. Since "1" is set to a bit (i.e., bit [4]) corresponding to the RUN of the escape retrieval result, and the encoded ABS is below 64, the RUN retrieval result is valid. Consequently, the RUN retrieval result is adopted in a VLC generation. This conclusion approximately coincides with No. 47 of encoding table as shown in FIGS. 24–25.

When the value of RUN is "16" in this situation, the corresponding bit (bit [16]) is not set in an escape retrieval result, thus a RUN retrieval result is invalid. Consequently, a VLC generator 61 selects an output of an ESC encoder 62. At this time, the ESC encoder 62 provides a binary numeral "0000_0101_0000_1111_1111_1101" as a variable length code, and "24" as a code length.

Further, consider the case where RUN=4 and LEVEL=−67 in the same situation. At this time, three table retrieval results are the same as in the case where RUN=4 and LEVEL=−3. However, the value of the encoded ABS becomes 67, namely, over 64. Thus, irrespective of an escape retrieval result, the VLC generator 61 selects an output of the ESC encoder 62. At this time, the ESC encoder 62 provides a binary numeral "0000_0101_0000_1111_1011_1101" as a variable length code, and "24" as a code length.

Examples of Variable Length Encoding of DVC

FIG. 45 shows a list of retrieval tables used in a DVC encoding. Table No. 1 is an offset retrieval table, No. 2 is an escape retrieval table, and Nos. 3 to 66 are RUN retrieval tables. FIGS. 46 and 47 show part of OFS_DVC and part of ESC_DVC, respectively. FIGS. 48, 49 and 50 respectively show part of RUN_00DVC, RUN_03DVC and RUN_13DVC, as an example of RUN tables.

Consider now a variable length encoding of a two-dimensional data where RUN=4 and LEVEL=−3, in a DVC block. In this case, "3" is outputted to an encoded ABS, an offset retrieval result indicates RUN_03DVC as a table for RUN retrieval, and an escape retrieval result is 0xff00000. The value of RUN (value of an encoded RUN counter 58) is "4", and LEVEL (output of an encoded DCT selector 46) has a negative value, thus "9" is outputted to the encoded RUN. A RUN retrieval using "9" as a keyword provides a binary numeral "1111_0011_11" as a variable length code, and "10" as a code length. Since "1" is set to a bit (i.e., bit [4]) corresponding to the RUN of the escape retrieval result, and the encoded ABS is below 64, the RUN retrieval result is valid. Consequently, the RUN retrieval result is adopted in a VLC generation. This conclusion approximately coincides with No. 46 of the encoding table shown in FIGS. 31 through 36.

Further, consider the case where RUN=4 and LEVEL =−13. In this case, an escape retrieval result is 0xc0000000, the bit corresponding to RUN, i.e., bit [4] is not set, and the value of RUN is not zero. Therefore, a DVC exception judgement is true, thus further two variable length encodings are performed. In the first variable length encoding, zero is outputted to the encoded ABS, an offset retrieval result is RUN_00DVC, and an escape retrieval result is "0xffffffff." The value of the RUN selector 58 is "3", thus "7" is outputted to the encoded RUN. Accordingly, the RUN retrieval result provides a binary numeral "1111_1010_1101" as a variable length code, and "12" as a LENGTH. Since "1" is set to bit [3] of the escape retrieval result, the RUN retrieval result is valid. In the second variable length encoding, the absolute value "13" of LEVEL is outputted to the encoded ABS, and "1" is outputted to an encoded RUN. Therefore, an offset retrieval result is RUN_13DVC and an escape retrieval result is "0xc0000000." The RUN retrieval result provides a binary numeral "1110_1011_1" as a variable length code, and "9" as a LENGTH. Since "1" is set to bit [0] that corresponds to an encoded RUN, the RUN retrieval result is valid.

Still further, consider the case where RUN=0 and LEVEL=−128. In this case, an encoded ABS is not less than 64, thus all table retrieval results are invalid. Since the value of RUN is zero, a DVC exception judgement is untrue. A VLC generator 61 selects the output of an ESC encoder 62, and the ESC encoder 62 outputs a binary numeral "1111_1111_0000_0001" as a variable length code, and "16" as a code length.

Finally, consider the case where RUN=33 and LEVEL=−128. This results in that all table retrievals are invalid and a DCT exception judgement is true. Accordingly, further two variable length encodings are executed. In the first variable length encoding, an encoded ABS is zero and an encoded RUN is 32 . The RUN retrieval is invalid because the encoded RUN is not less than 32, so that a VLC generator 61 selects an output of the ESC encoder 62. The ESC encoder 62 provides a binary numeral "1111_1101_0000_0" as a variable length code, and "13" as a code length. In the second variable length encoding, an encoded ABS is 128 and an encoded RUN is 0. The RUN retrieval is invalid because the encoded RUN is not less than 64, so that a VLC generator 61 selects an output of the ESC encoder 62. The ESC encoder 62 provides a binary numeral "1111_1111_0000_0001" as a variable length code, and "16 " as a code length.

While the invention has been shown and described in detail, the foregoing description is in all aspects illustrative and not restrictive. It is therefore understood that numerous modifications and variations can be devised without departing from the scope of the invention.

I claim:

1. A variable length code processor comprising:
    a rewritable first storage section;
    a rewritable second storage section; and
    a variable length code processing execution section that executes a variable length code processing that includes at least one of a decoding process being a decoding of a variable length code provided from outside and an encoding process being a variable length encoding of data to be encoded which is provided from outside, wherein
    said first storage section is configured to store a variable length code processing information serving as a reference information in performing said variable length code processing, in accordance with an encoding standard for a variable length code to be processed;
    said second storage section is configured to store an encoding standard information that indicates an encoding standard for said variable length code to be processed; and
    said variable length code processing execution section executes said variable length code processing by referring to said encoding standard information and said variable length code processing information.

2. The variable length code processor of claim 1 wherein, said variable length code processing execution section has
    a variable length decoding section that performs a decoding process for decoding a variable length code to be provided from outside, and
    a variable length encoding section that performs an encoding process for executing a variable length encoding of data to be encoded which is provided from outside; and
    said second storage section stores a process content information indicating whether a variable length code processing content is said encoding process or said decoding process,
    said variable length code processor further comprising:
        an address generating section that generates an address for reading from and writing to said first storage section, based on said encoding standard information and said process content information; and
        a variable length code temporary holding section that, when said process content information indicates said decoding process, temporarily holds said variable length code provided from outside and then transfers said variable length code to said variable length decoding section, and, when said process content information indicates said encoding process, temporarily holds a variable length encoded code after being subjected to an encoding process in said variable length encoding section and then transfers said variable length encoded code outside, wherein
        said variable length encoding section accesses said first storage section based on an address generated in said address generating section, when said process content information indicates said encoding process, thereby performing said encoding process; and
        said variable length decoding section accesses said first storage section based on an address generated in said address generating section, when said process content information indicates said decoding process, thereby performing said decoding process.

3. The variable length code processor of claim 1 wherein said variable length code processing execution section includes a variable length decoding section that performs a decoding process for decoding a variable length code to be provided from outside.

4. The variable length code processor of claim 3 wherein, said variable length code provided from outside includes first and second codes, said first code including a code obtained by variable length encoding of a two-dimensional code, said two-dimensional code being composed of first and second item data having a different meaning, said first item data indicating the number of continuous zeros, said second item data indicating a value of data that follows the zeros counted in said first item data, said second code including a code indicating a boundary of a variable length code; and
    said variable length decoding section outputs a decoded data by subsequently outputting at least a data bit constituting said decoded data, and has an output data counter that counts the number of said data bit to be outputted, so that in decoding said first code, said decoded data is outputted by outputting a value indicated by said second item data after outputting the number of zeros indicated by said first item data, and in decoding said second code, said decoded data is outputted by outputting zeros until said output data counter indicates a predetermined value.

5. The variable length code processor of claim 4 further comprising:

a third storage section for storing a decoded data effective area information, wherein said variable length decoding section writes said decoded data effective area information indicating an effective area of said decoded data, to said third storage section, when said decoded data outputs a value other than zero.

6. The variable length code processor of claim 3 further comprising:

a third storage section for storing a decoded data effective bit termination information, wherein:

said variable length decoding section writes said decoded data effective bit termination information indicating a value of said output data counter, to said third storage section, when decoding said second code to output said decoded data.

7. The variable length code processor of claim 1 wherein said variable length code processing execution section includes a variable length encoding section that performs an encoding process for performing a variable length encoding of data to be encoded which is provided from outside.

8. The variable length code processor of claim 7 wherein said variable length encoding section has:

a two-dimensional encoding section that performs a two-dimensional encoding of said data to be encoded, to generate a two-dimensional code consisting of first and second item data; and a variable length code generating section that performs a variable length encoding of said two-dimensional code to generate a variable length code, said variable length code processor further comprising a variable length encoding coupler for coupling said variable length code, wherein:

said two-dimensional encoding section has a zero counter that always counts the number of continuous zeros of data within said data to be encoded which is provided continuously, so that when provided data having a value other than zero, said two-dimensional code is generated, a value of said zero counter is provided to said first item data, and said value other than zero is provided to said second item data; and said two-dimensional encoding section further provides, upon detection of termination of said data to be encoded, a termination signal indicating its content to said variable length code generating section, so that said variable length code generating section receives said termination signal and generates a variable length code for termination indication that indicates a breakpoint of information.

9. The variable length code processor of claim 7 wherein, said variable length encoding section that performs a variable length encoding of data to be encoded which is subsequently provided from outside, to generate a variable length code, said variable length code processor further comprising a variable length code coupling section that obtains a coupled variable length code by subsequently coupling a candidate for coupling, said candidate for coupling being said variable length code to be subsequently generated from said variable length encoding section, to output said coupled variable length code having a first bit size as a coupled variable length code, and said variable length code coupling section is configured to output said coupled variable length code having said first bit size by handling an external code to be subsequently provided from outside, as said candidate for coupling.

* * * * *